(12) United States Patent
Wang et al.

(10) Patent No.: US 10,490,269 B2
(45) Date of Patent: Nov. 26, 2019

(54) SEMICONDUCTOR MEMORY DEVICE AND MEMORY SYSTEM

(71) Applicant: Toshiba Memory Corporation, Tokyo (JP)

(72) Inventors: Weihan Wang, Tokyo (JP); Toshifumi Hashimoto, Kanagawa (JP); Noboru Shibata, Kanagawa (JP)

(73) Assignee: Toshiba Memory Corporation, Tokyo (JP)

( * ) Notice: Subject to any disclaimer, the term of this patent is extended or adjusted under 35 U.S.C. 154(b) by 0 days.

(21) Appl. No.: 16/156,912

(22) Filed: Oct. 10, 2018

(65) Prior Publication Data

US 2019/0043568 A1 Feb. 7, 2019

Related U.S. Application Data

(62) Division of application No. 15/346,716, filed on Nov. 8, 2016, now Pat. No. 10,121,536.

(30) Foreign Application Priority Data

Jun. 15, 2016 (JP) .................. 2016-119138

(51) Int. Cl.
*G11C 11/56* (2006.01)
*G06F 3/06* (2006.01)
(Continued)

(52) U.S. Cl.
CPC ........ *G11C 11/5642* (2013.01); *G06F 3/0625* (2013.01); *G06F 3/0659* (2013.01);
(Continued)

(58) Field of Classification Search
CPC . G11C 2207/06; G11C 2207/066; G11C 8/00; G11C 8/20
See application file for complete search history.

(56) References Cited

U.S. PATENT DOCUMENTS 7,852,675 B2   12/2010  Maejima
8,068,365 B2   11/2011  Kim
(Continued)

FOREIGN PATENT DOCUMENTS

JP   2010-277678 A   12/2010
JP   2015-176309 A   10/2015

OTHER PUBLICATIONS

Taiwanese Office Action dated May 23, 2017 in related Taiwan Patent Application 105124675 with English Translation.

*Primary Examiner* — Han Yang
(74) *Attorney, Agent, or Firm* — Kim & Stewart LLP

(57) ABSTRACT

A semiconductor memory device includes a first memory cell array including a first memory cell that is capable of holding two or more bits of data including at least a first bit and a second bit, a second memory cell array including a second memory cell that is capable of holding two or more bits of data including at least a first bit and a second bit, a first word line electrically connected to a gate of the first memory cell, and a second word line electrically connected to a gate of the second memory cell. In a read operation, at least first, second, and third voltages are applied successively to both the first word line and the second word line to read a first page including the first bit of the first memory cell and a second page including the second bit of the second memory cell.

10 Claims, 41 Drawing Sheets

(51) Int. Cl.
*G11C 16/04* (2006.01)
*G11C 16/08* (2006.01)
*G11C 16/32* (2006.01)

(52) U.S. Cl.
CPC ........ *G06F 3/0688* (2013.01); *G11C 11/5628* (2013.01); *G11C 16/0483* (2013.01); *G11C 16/08* (2013.01); *G11C 16/32* (2013.01)

(56) References Cited

U.S. PATENT DOCUMENTS

| | | |
|---|---|---|
| 8,111,562 B2 | 2/2012 | Yamamura et al. |
| 8,233,323 B2 | 7/2012 | Hishida et al. |
| 8,372,720 B2 | 2/2013 | Fukuzumi et al. |
| 8,400,814 B2 | 3/2013 | Tokiwa |
| 8,514,627 B2 | 8/2013 | Itagaki et al. |
| 8,952,426 B2 | 2/2015 | Maejima |
| 9,093,132 B2 | 7/2015 | Kim et al. |
| 2007/0047300 A1 | 3/2007 | Lee et al. |
| 2007/0121376 A1 | 5/2007 | Toda |
| 2011/0284946 A1 | 11/2011 | Kiyotoshi |
| 2015/0006983 A1 | 1/2015 | Lin et al. |
| 2015/0262630 A1 | 9/2015 | Shirakawa et al. |
| 2015/0380097 A1 | 12/2015 | Sato et al. |
| 2016/0141024 A1 | 5/2016 | Lee |
| 2017/0365335 A1* | 12/2017 | Wang ................ G11C 16/0483 |

\* cited by examiner

FIG. 9

| | case1 | case2 | case3 | case4 | case5 | case6 |
|---|---|---|---|---|---|---|
| Plane<0> | LP read | MP read | LP read | UP read | MP read | UP read |
| Plane<1> | MP read | LP read | UP read | LP read | UP read | MP read |
| Read operation | 1st | 1st | 2nd | 2nd | 3rd | 3rd |

{ LP read : Lower page read
MP read : Middle page read
UP read : Upper page read }

FIG. 22

3rd read operation (MP read + UP read)

Plane<0>: MP read
Plane<1>: UP read

WLsel<0,1>: Vss — BR — CR — DR — FR — GR → UP read end, MP read end

STB<0>: L — H — L

STB<1>: L — H — L

SEMICONDUCTOR MEMORY DEVICE AND MEMORY SYSTEM

CROSS-REFERENCE TO RELATED APPLICATION

This application is a divisional of U.S. patent application Ser. No. 15/346,716, filed Nov. 8, 2016, which is based upon and claims the benefit of priority from Japanese Patent Application No. 2016-119138, filed Jun. 15, 2016, the entire contents of which are incorporated herein by reference.

BACKGROUND

NAND flash memories are known as one type of semiconductor memory devices.

DESCRIPTION OF THE DRAWINGS

FIG. 9 is a diagram illustrating a read operation in the memory system according to the first embodiment.

FIG. 22 is a waveform diagram illustrating a read operation in the memory system according to the second embodiment.

DETAILED DESCRIPTION

Figure 1:
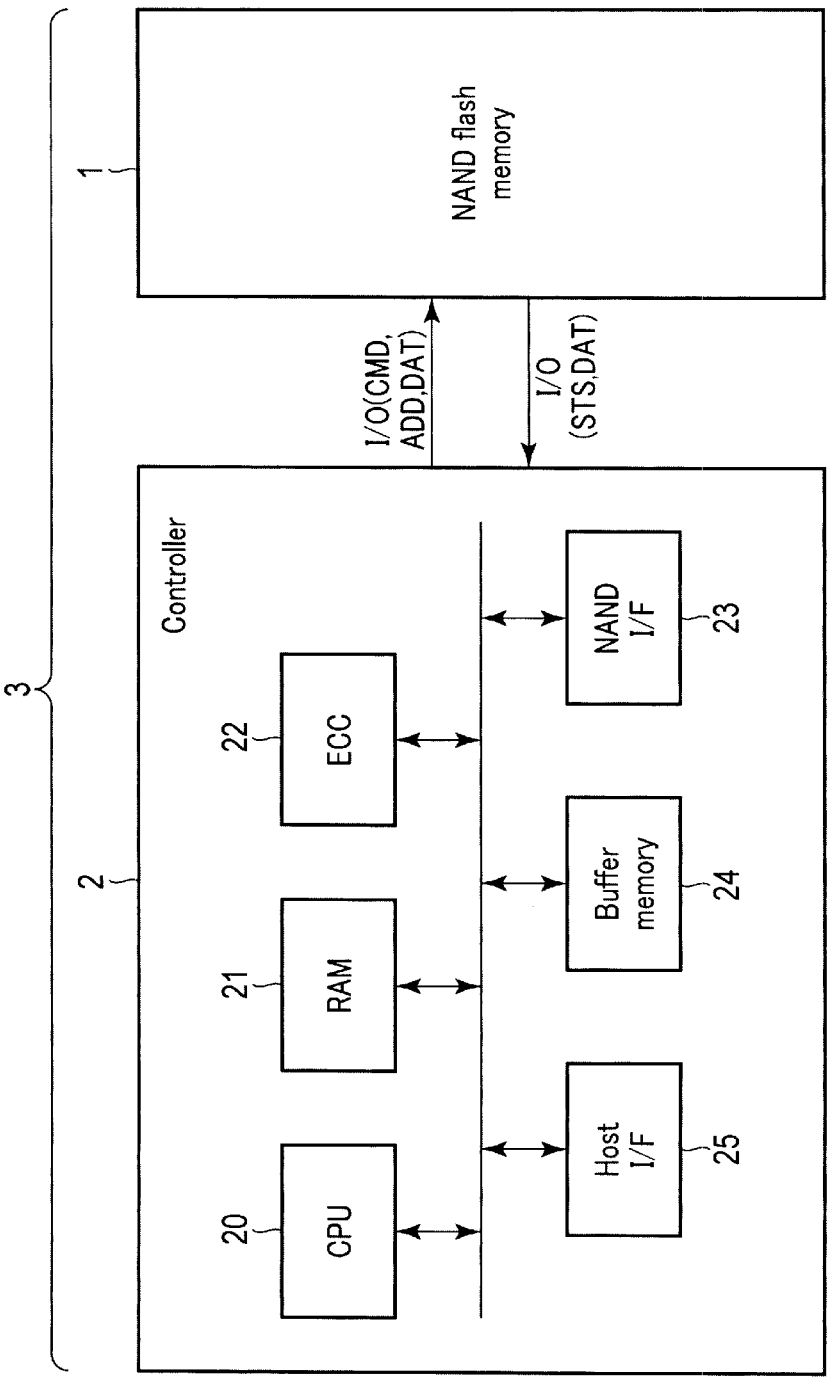
FIG. 1 is a block diagram illustrating a memory system according to a first embodiment.

According to an embodiment, there are provided a semiconductor memory device and a memory system capable of accelerating an operation.

In general, according to one embodiment, a semiconductor memory device includes a first memory cell array including a first memory cell that is capable of holding two or more bits of data including at least a first bit and a second bit, a second memory cell array including a second memory cell that is capable of holding two or more bits of data including at least a first bit and a second bit, a first word line electrically connected to a gate of the first memory cell, and a second word line electrically connected to a gate of the second memory cell. In a read operation, at least first, second, and third voltages are applied successively to both the first word line and the second word line to read a first page including the first bit of the first memory cell and a second page including the second bit of the second memory cell.

Hereinafter, embodiments will be described with reference to the drawings, which are schematic. In the following description, common reference numerals are given to elements having the same function and configuration. Alphabet letters after reference numerals are used to distinguish elements having the same configuration from each other. When it is not necessary to distinguish such elements from each other, they are denoted only by the reference numerals (i.e., without the alphabet letters).

[1] First Embodiment

Hereinafter, a semiconductor memory device and a memory system according to a first embodiment will be described.

[1-1] Configuration

[1-1-1] Configuration of Memory System 3

First, the configuration of a memory system will be described with reference to FIG. 1. FIG. 1 is a block diagram illustrating the memory system. As illustrated in FIG. 1, a memory system 3 includes a semiconductor memory device 1 and a controller 2.

The semiconductor memory device 1 is a NAND flash memory that stores data in a nonvolatile manner. The details of the configuration of the semiconductor memory device 1 will be described below.

The controller 2 commands the semiconductor memory device 1 to execute reading, writing, erasing, or the like in response to a command from an external host apparatus (not illustrated). The controller 2 manages a memory space of the semiconductor memory device 1.

As illustrated in FIG. 1, the controller 2 includes a processor (CPU) 20, an internal memory (RAM) 21, an ECC circuit 22, a NAND interface circuit 23, a buffer memory 24, and a host interface circuit 25.

The processor 20 controls an operation of the entire controller 2. For example, the processor 20 issues a reading command based on the NAND interface in response to a reading command received from the host apparatus. This operation also applies to the write operation and the erasing operation.

The internal memory 21 is, for example, a semiconductor memory such as a DRAM and is used as a work area of the processor 20. The internal memory 21 retains firmware, various management tables, and the like for managing the semiconductor memory device 1.

The ECC circuit 22 executes an error checking and correcting (ECC) operation on data. Specifically, the ECC circuit 22 generates a parity based on write data at the time of writing of data. The ECC circuit 22 generates a syndrome from the parity, detects an error, and corrects the detected error at the time of reading of data.

The NAND interface circuit 23 is connected to the semiconductor memory device 1 and governs communication with the semiconductor memory device 1. For example, the NAND interface circuit 23 transmits and receives input and output signals I/O to and from the semiconductor memory device 1. For example, the input and output signals I/O transmitted to the semiconductor memory device 1 by the controller 2 include a command CMD, address information ADD, and write data DAT. The input and output signals I/O received from the semiconductor memory device 1 by the controller 2 include status information STS and read data DAT.

The buffer memory 24 temporarily retains data received from the semiconductor memory device 1 and the host apparatuses by the controller 2.

The host interface circuit 25 is connected to the host apparatus via a host bus (not illustrated) and governs communication with the host apparatus. For example, the host interface circuit 25 transmits a command and data received from the host apparatus to the processor 20 and the buffer memory 24, respectively.

[1-1-2] Configuration of Semiconductor Memory Device 1

Figure 2:
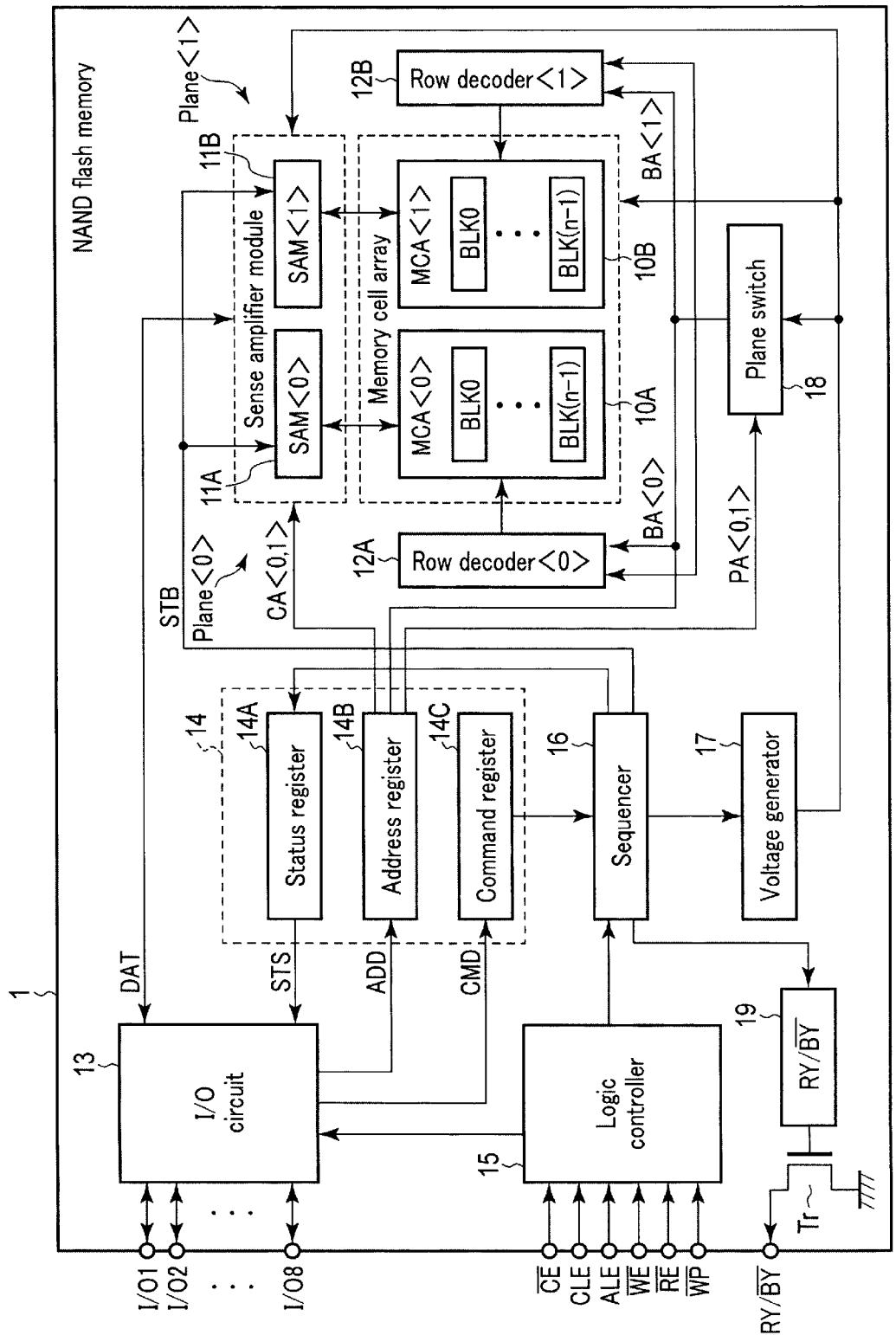
FIG. 2 is a block diagram illustrating a semiconductor memory device according to the first embodiment.

Next, the configuration of the semiconductor memory device 1 will be described with reference to FIG. 2. FIG. 2 is a block diagram illustrating the semiconductor memory device 1. As illustrated in FIG. 2, the semiconductor memory device 1 includes memory cell arrays 10A and 10B, sense amplifier modules 11A and 11B, row decoders 12A and 12B, an input and output circuit 13, a register 14, a logic controller 15, a sequencer 16, a voltage generator 17, a plane switch 18, and a ready/busy control circuit 19.

The memory cell arrays 10A and 10B each include blocks BLK0 to BLKn (where n is a natural number equal to or greater than 1). The blocks BLK are a set of a plurality of nonvolatile memory cells associated with bit lines and word lines and are, for example, units of data erasure. Some of the blocks BLK are used as ROM fuse regions that retain setting information of the semiconductor memory device 1. The details of the configuration of the memory cell array 10 will be described below.

The sense amplifier modules 11A and 11B are provided to correspond to the memory cell arrays 10A and 10B, respectively. The sense amplifier module 11 outputs the data DAT read from the memory cell array 10 to the controller 2 via the input and output circuit 13. The sense amplifier module 11 transmits the write data DAT received from the controller 2 via the input and output circuit 13 to the corresponding memory cell array 10.

The row decoders 12A and 12B are provided to correspond to the memory cell arrays 10A and 10B, respectively. The row decoder 12 selects a word line corresponding to target memory cells executing a read operation and a write operation. The row decoder 12 applies desired voltages to the selected word lines and other word lines.

The input and output circuit 13 transmits and receives, for example, input and output signals I/O (I/O1 to I/O8) with an 8-bit width to and from the controller 2. For example, the input and output circuit 13 transmits the write data DAT included in the input and output signal I/O received from the controller 2 to the sense amplifier module 11. The input and output circuit 13 transmits the read data DAT transmitted from the sense amplifier module 11 as the input and output signal I/O to the controller 2.

The register 14 includes a status register 14A, an address register 14B, and a command register 14C. The status register 14A retains status information STS. The status register 14A transmits the status information STS to the input and output circuit 13 in response to an instruction of the sequencer 16. The address register 14B receives the address information ADD from the input and output circuit 13 and retains the address information ADD. The address register 14B transmits a column address signal CA, a block address BA, and a page address PA included in the address information ADD to the sense amplifier module 11, the row decoder 12, and the plane switch 18, respectively. The command register 14C receives the command CMD from the input and output circuit 13 and retains the command CMD. The command register 14C transmits the command CMD to the sequencer 16.

The logic control circuit 15 receives various control signals from the controller 2 and controls the input and output circuit 13 and the sequencer 16. As the control signals, for example, a chip enable signal /CE, a command latch enable signal CLE, an address latch enable signal ALE, a writing enable signal /WE, a reading enable signal /RE, and a writing protection signal /WP are used. The signal /CE enables the semiconductor memory device 1. The signal CLE is used to notify the input and output circuit 13 that a signal input to the semiconductor memory device 1 is the command CMD in tandem with the asserted signal CLE. The signal ALE is used to notify the input and output circuit 13 that a signal input to the semiconductor memory device 1 is the address information ADD in tandem with the asserted signal ALE. The signals /WE and /RE are, for example, used to instruct the input and output circuit 13 to input and output the input and output signals I/O1 to I/O8. The signal /WP is, for example, used to enter a protection state of the semiconductor memory device 1 at the time of turning on and off power.

The sequencer 16 controls an operation of the entire semiconductor memory device 1. Specifically, the sequencer 16 controls the sense amplifier module 11, the row decoder 12, the voltage generator 17, and the like based on the command CMD transmitted from the command register 14C (not illustrated) to execute a data read operation, and the like. The sequencer 16 includes a register (not illustrated). The register retains the setting information read from the ROM fuse region at the time of powering on the semiconductor memory device 1, and thus the sequencer 16 executes the read operation in an operation mode based on the setting information.

The voltage generator 17 generates a desired voltage based on an instruction of the sequencer 16. The voltage generator 17 supplies the generated voltage to the memory cell array 10, the sense amplifier module 11, and the plane switch 18.

The plane switch 18 transmits the voltage supplied from the voltage generator 17 to the row decoders 12A and 12B based on the received page address PA. The details of the plane switch 18 will be described below.

The ready/busy control circuit 19 generates a ready/busy signal RY/(/BY) based on an operation state of the sequencer 16 and transmits the ready/busy signal RY/(/BY) to the controller 2. The signal RY/(/BY) is used to notify the controller 2 whether the semiconductor memory device 1 is in a ready state or a busy state and is generated when the ready/busy control circuit 19 controls ON and OFF of a transistor Tr. The ready state indicates that the semiconductor memory device 1 can receive a command from the controller 2. The busy state indicates that the semiconductor memory device 1 may not receive a common from the controller 2. For example, the ready/busy signal RY/(/BY) is considered to be at an "L" level while the semiconductor memory device 1 executes a read operation (the busy state) and is considered to be at an "H" level when the semiconductor memory device 1 complete the read operation (ready state).

The semiconductor memory device 1 according to the present embodiment includes a plurality of planes in regard to the plurality of memory cell arrays 10 each including the sense amplifier module 11 and the row decoder 12. Specifically, the semiconductor memory device 1 includes planes <0> and <1>. The plane <0> includes the memory cell array 10A, the sense amplifier module 11A, and the row decoder 12A. The plane <1> includes the memory cell array 10B, the sense amplifier module 11B, and the row decoder 12B. The planes <0> and <1> can independently operate based on instructions or the like of the sequencer 16.

In the following description, suffixes <0> and <1> are added to each constituent element illustrated in FIG. 2 to indicate correspondence with the planes <0> and <1>, respectively. For example, page addresses <0> and <1> indicate page addresses corresponding to the planes <0> and <1>, respectively.

The semiconductor memory device 1 according to the present embodiment can execute a read operation simultaneously on the plurality of planes based on commands issued from the controller 2. This read operation is referred to as a multi-plane read. This read operation will be described below.

[1-1-3] Configuration of Memory Cell Array 10

Figure 3:
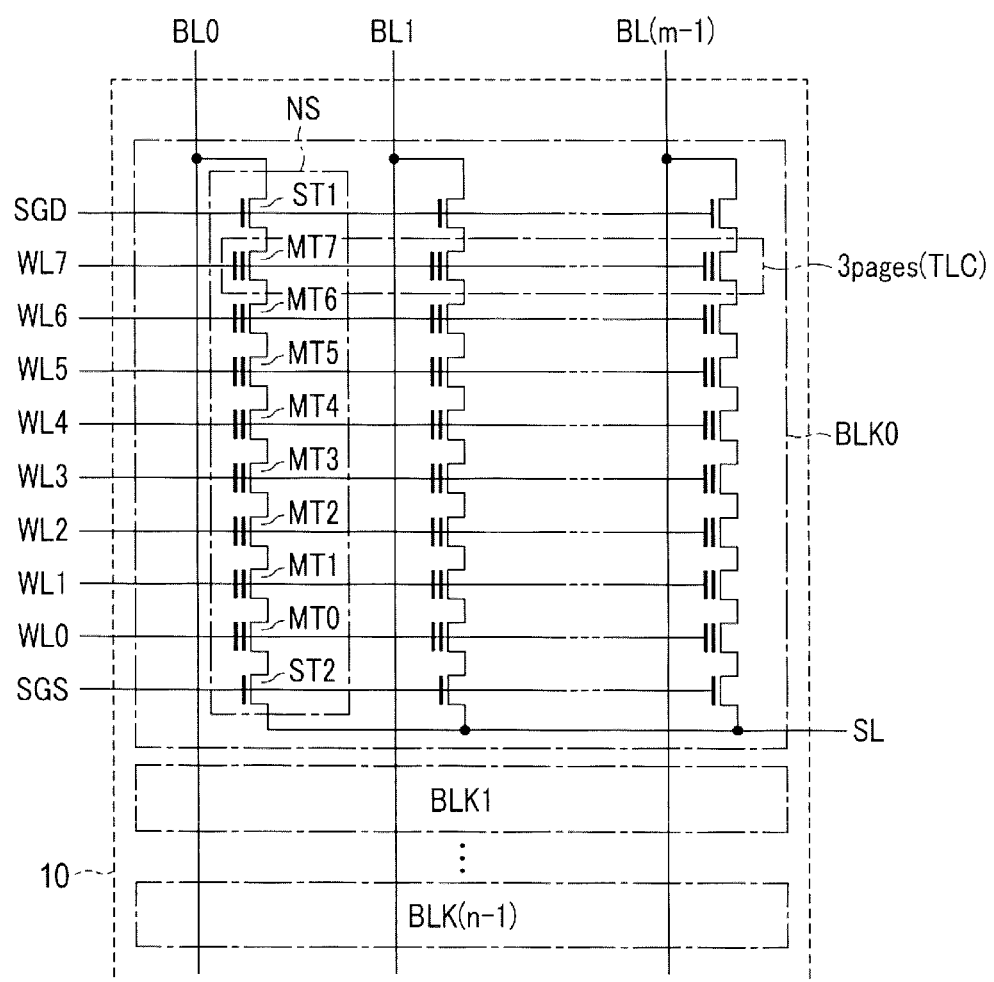
FIG. 3 is a circuit diagram illustrating a memory cell array included in the semiconductor memory device according to the first embodiment.

Next, the configuration of the memory cell array 10 will be described with reference to FIG. 3. FIG. 3 is a circuit diagram illustrating the memory cell array 10. FIG. 3 illustrates the detailed circuit configuration of one block BLK in the memory cell array 10. As illustrated in FIG. 3, the block BLK includes a plurality of NAND strings NS.

The NAND strings NS are provided to correspond to the bit lines BL0 to BL (m−1) (where (m−1) is a natural number equal to or greater than 1) and include, for example, 8 memory cell transistors MT (MT0 to MT7) and select transistors ST1 and ST2. The number of memory cell transistors MT included in one NAND string NS is not limited thereto, but any number can be used.

The memory cell transistors MT include control gates and charge storage layers and retain data in a nonvolatile manner. Each memory cell can store data of a plurality of bits by applying a multi-level cell (MLC) scheme. In the present embodiment, a case in which a triple-level cell (TLC) scheme of storing 3-bit data in a memory cell is applied will be illustrated.

The memory cell transistors MT0 to MT7 are connected in series between the source of the select transistor ST1 and the drain of the select transistor ST2. The gates of the select transistors ST1 and ST2 in the same block BLK are connected commonly to select gate lines SGD and SGS, respectively. Similarly, control gates of the memory cell transistors MT0 to MT7 in the same block BLK are connected commonly to word lines WL0 to WL7, respectively.

In the memory cell array 10, the drains of the select transistors ST1 in the NAND strings NS in the same column are connected commonly to the bit line BL. That is, the bit line BL commonly connect the NAND strings NS in the same column across the plurality of blocks BLK. Further, the sources of the plurality of select transistors ST2 are connected commonly to a source line SL.

In the above configuration, a set of 1-bit data retained in the plurality of memory cells connected to the common word line WL is referred to as a "page". Accordingly, when the TLC scheme is applied, 3-page data is stored in the set of the plurality of memory cells connected to one word line WL. In the following description, a set of high-order bit data among 3 bits is referred to as an upper page, a set of middle-order bit data is referred to as a middle page, and a set of low-order bit data is referred to as a lower page.

Figure 4:
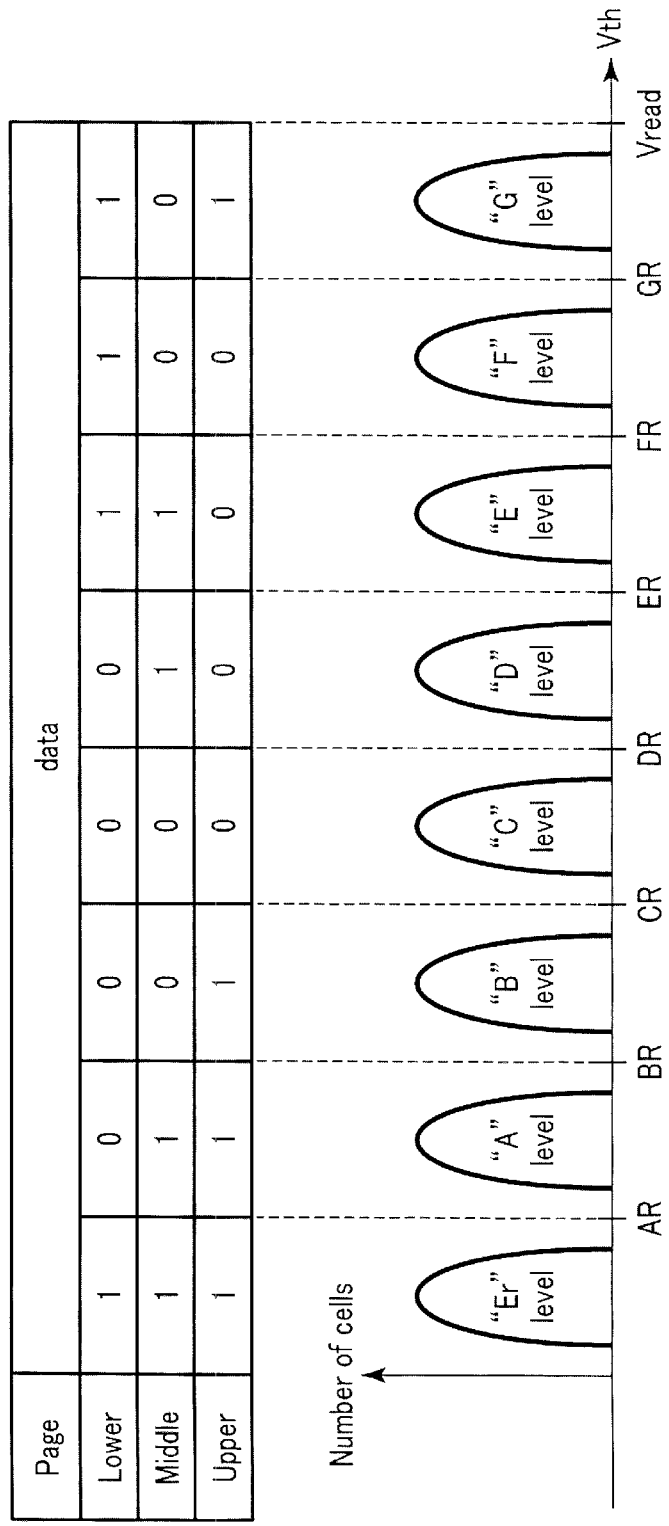
FIG. 4 is a diagram illustrating a threshold voltage distribution of a memory cell included in the semiconductor memory device according to the first embodiment.

A threshold voltage distribution of the memory cell transistors MT when data is stored in accordance with the TLC scheme is illustrated in, for example, FIG. 4. FIG. 4 illustrates the threshold voltage distribution of the memory cells retaining 3-bit data and voltages used at the time of a read operation. The vertical axis and the horizontal axis in FIG. 4 represent the number of memory cells and a threshold voltage Vth, respectively.

When the memory cell retains 3-bit data, a distribution of the threshold voltage is divided into 8 threshold voltage distributions, as illustrated in FIG. 4. The pieces of 3-bit data corresponding to the 8 threshold voltage distributions are referred to as an "Er" level, an "A" level, a "B" level, a "C" level, a "D" level, an "E" level, an "F" level, and a "G" level in an ascending order of the threshold voltages.

The memory cell retaining the "Er" level corresponds to a data erased state and retains, for example, data (111) (corresponding respectively to a high-order bit, a middle-order bit, and a low-order bit). The memory cells retaining the "A" level, the "B" level, the "C" level, the "D" level, the "E" level, the "F" level, and the "G" level correspond to a data writing state and retain, for example, (011), (001), (000), (010), (110), (100), and (101), respectively.

At the time of the read operation, it is determined at which level the threshold voltage of the reading target memory cell transistor MT is included. For the sake of this determination, various reading voltages are set. A read voltage AR used to determine which memory cell transistor MT has the threshold voltage of the "Er" level or has a threshold voltage equal to or higher than the "A" level is set to be between the high edge of the "Er" level and the low edge of the "A" level. A read voltage BR used to determine which memory cell transistor MT has the threshold voltage equal to or lower than the "A" level or has the threshold voltage equal to or higher than the "B" level is set to be between the high edge of the "A" level and the low edge of the "B" level. A read voltage CR used to determine which memory cell transistor MT has the threshold voltage equal to or lower than the "B" level or has the threshold voltage of the "C" level is set to be between the high edge of the "B" level and the low edge of the "C" level. A read voltage DR used to determine which memory cell transistor MT has the threshold voltage equal to or lower than the "C" level or has the threshold voltage of the "D" level is set to be between the high edge of the "C" level and the low edge of the "D" level. A read voltage ER used to determine which memory cell transistor MT has the threshold voltage equal to or lower than the "D" level or has the threshold voltage of the "E" level is set to be between the high edge of the "D" level and the low edge of the "E" level. A read voltage FR used to determine which memory cell transistor MT has the threshold voltage equal to or lower than the "E" level or has the threshold voltage of the "F" level is set to be between the high edge of the "E" level and the low edge of the "F" level. A read voltage GR used to determine which memory cell transistor MT has the threshold voltage equal to or lower than the "F" level or has the threshold voltage of the "G" level is set to be between the high edge of the "F" level and the low edge of the "G" level. A read voltage Vread illustrated in FIG. 4 is set as a voltage at which the memory cell transistor MT in which a read pass voltage Vread is applied to a gate of the transistor MT is turned on irrespective of retained data. A relation among these voltages satisfies AR<BR<CR<DR<ER<FR<GR<Vread.

When read voltages of the above-described data are used, the sense amplifier module 11 calculates data of the lower page using the data read by the voltages AR and ER. Similarly, the sense amplifier module 11 calculates data of the middle page using the data read by the voltages BR, DR, and FR and calculates data of the upper page using the data read by the voltages CR and GR. That is, the read voltages AR and ER correspond to lower page read, the read voltages BR, DR, and FR correspond to middle page read, and the read voltages CR and GR correspond to upper page read.

The data read operation may be executed for each page or for each word line WL. A scheme of reading data for each page is referred to as page-by-page reading and a scheme of reading data for each word line WL en bloc is referred to as sequential reading. In the semiconductor memory device 1 according to the present embodiment, the page-by-page reading of selected pages (for example, the lower page and the middle page) at data levels different in a plurality of planes is simultaneously executed. The details of the present operation will be described below.

[1-1-4] Configuration of Sense Amplifier Module 11

Figure 5:
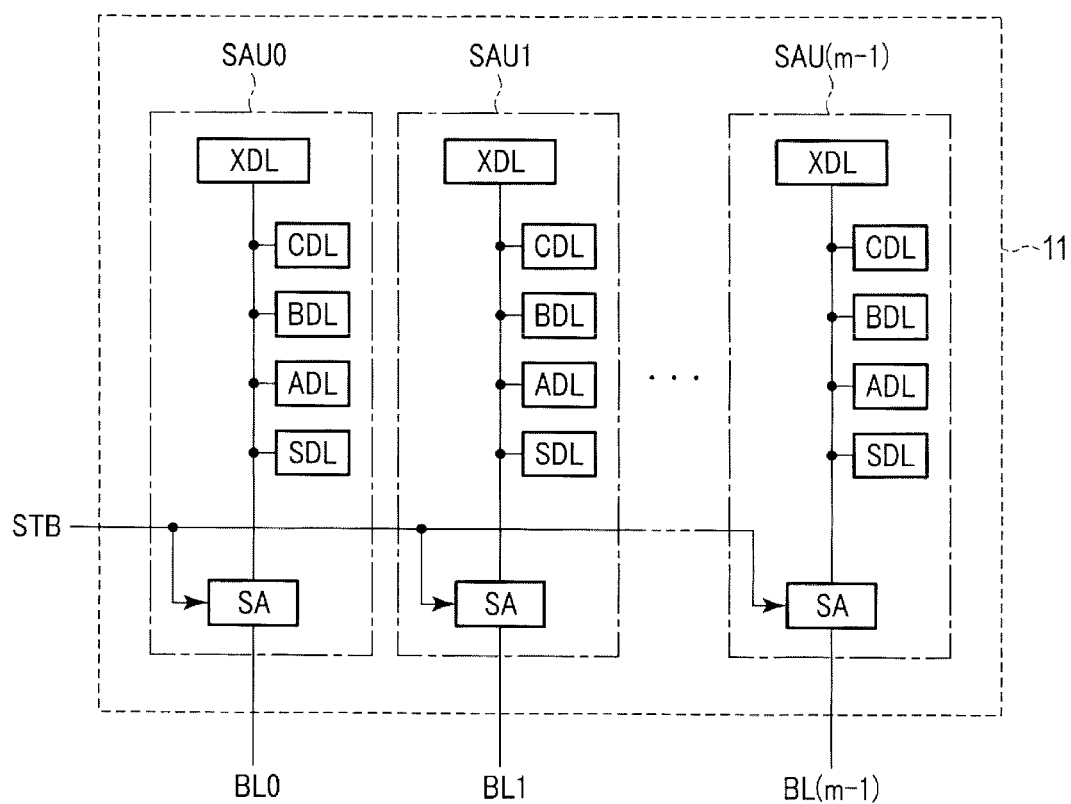
FIG. 5 is a circuit diagram illustrating a sense amplifier module included in the semiconductor memory device according to the first embodiment.

Next, the configuration of the sense amplifier module 11 will be described with reference to FIG. 5. FIG. 5 is a circuit diagram illustrating the sense amplifier module 11. As illustrated in FIG. 5, the sense amplifier module 11 includes sense amplifier units SAU (SAU0 to SAU (m–1)) provided for the respective bit lines BL.

Each sense amplifier unit SAU includes a sense amplifier SA, latch circuits SDL, ADL, BDL, CDL, and XDL. The sense amplifier unit SA and the latch circuits SDL, ADL, BDL, CDL, and XDL are connected to be able to transmit and receive data to/from one another.

The sense amplifier unit SA senses data read in the corresponding bit line BL at the time of the read operation and determines the read data. Specifically, the sense amplifier SA includes a node SEN (not illustrated). In the read operation, the potential of the node SEN is dropped when the memory cell to which the read voltage is applied is turned on. In the read operation, the sequencer 16 asserts a control signal STB while the read voltage is applied to the memory cell. When the control signal STB is asserted, the sense amplifier unit SA determines whether the read data is "0" or "1" depending on whether the potential of the node SEN is maintained or dropped.

The latch circuits SDL, ADL, BDL, and CDL temporarily retain the read data. The read data determined by the sense amplifier unit SA at the time of the read operation is transmitted to the latch circuit SDL in the first place. The read data is transmitted from the latch circuit SDL to the latch circuit ADL, BDL, CDL, or XDL in a subsequent operation.

The latch circuit XDL is used to input and output data between the sense amplifier unit SAU and the controller 2. That is, the data received from the controller 2 is transmitted to the latch circuit SDL, ADL, BDL, or CDL via the latch circuit XDL. The data retained in the latch circuit SDL, ADL, BDL, or CDL is transmitted to the controller 2 via the latch circuit XDL.

Figure 6:
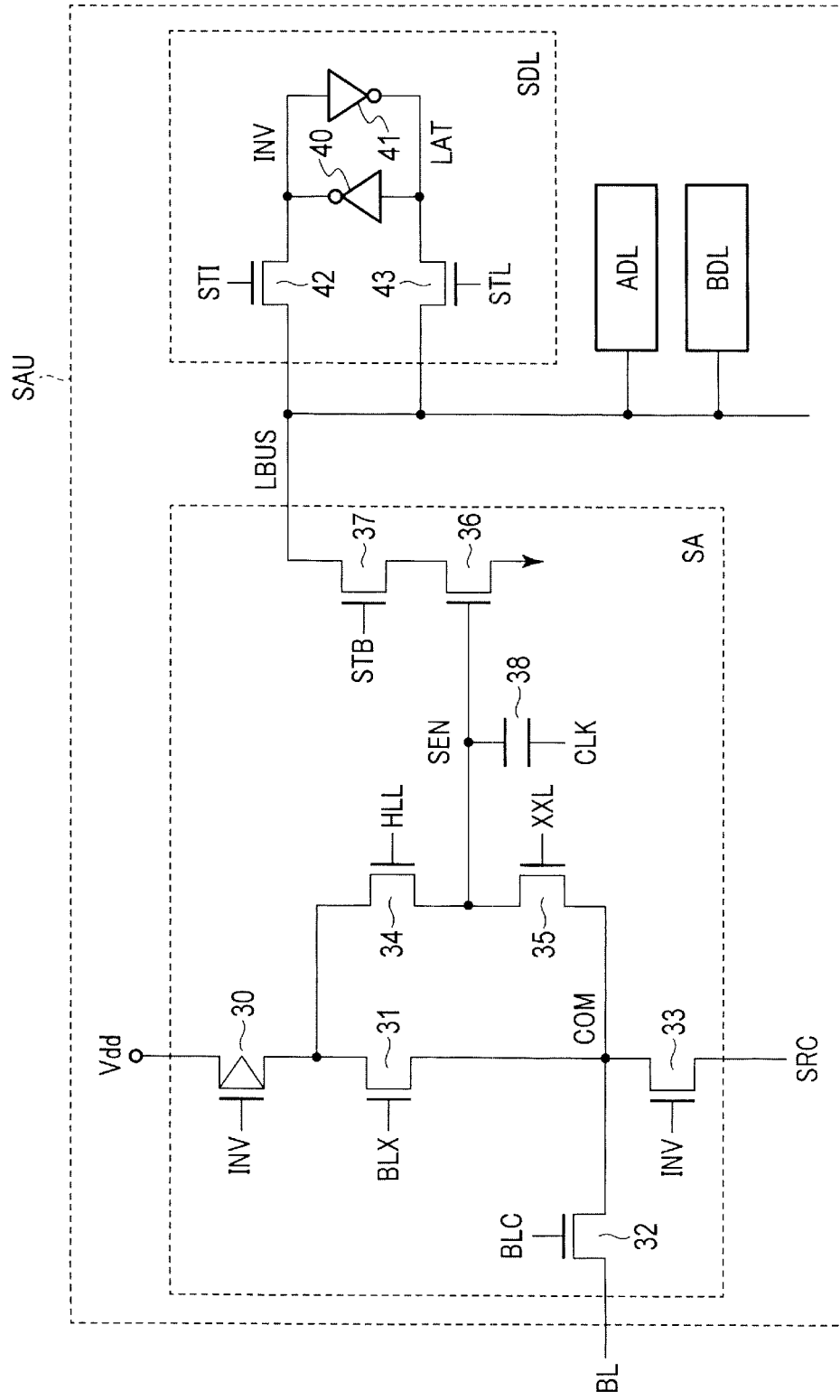
FIG. 6 is a circuit diagram illustrating the sense amplifier module included in the semiconductor memory device according to the first embodiment.

The circuit configuration of the sense amplifier unit SAU described above is illustrated in, for example, FIG. 6. FIG. 6 is a circuit diagram illustrating the sense amplifier unit SAU. FIG. 6 illustrates the detailed circuit configurations of the sense amplifier unit SA and the latch circuit SDL.

First, the circuit configuration of the sense amplifier unit SA will be described. As illustrated in FIG. 6, the sense amplifier unit SA includes a p-channel MOS transistor 30, n-channel MOS transistors 31 to 37, and a capacitor 38.

In the transistor 30, one end is connected to a power terminal and the gate is connected to a node INV. In the transistor 31, one end is connected to the other end of the transistor 30, the other end is connected to a node COM, and a control signal BLX is input to the gate. In the transistor 32, one end is connected to the node COM, the other end is connected to the corresponding bit line BL, and a control signal BLC is input to the gate. In the transistor 33, one end is connected to the node COM, the other end is connected to a node SRC, and the gate is connected to the node INV.

In the transistor 34, one end is connected to the other end of the transistor 30, the other end is connected to a node SEN, and a control signal HLL is input to the gate. In the transistor 35, one end is connected to the node SEN, the other end is connected to the node COM, and a control signal XXL is input to the gate. In the transistor 36, one end is connected to a ground terminal and the gate is connected to the node SEN. In the transistor 37, one end is connected to the other end of the transistor 36, the other end is connected to a bus LBUS, and a control signal STB is input to the gate. In the capacitor 38, one end is connected to the node SEN and a clock CLK is supplied to the other end.

A voltage to be applied to the power terminal connected to the one end of the transistor 30 is, for example, Vdd and a voltage to be applied to the node SRC is, for example, Vss. Vdd is power voltage in the semiconductor memory device 1 and Vss is a ground voltage in the semiconductor memory device 1.

Next, the circuit configuration of the latch circuit SDL will be described. As illustrated in FIG. 6, the latch circuit SDL includes inverters 40 and 41 and transistors 42 and 43.

In the inverter 40, an input terminal is connected to a node LAT and an output terminal is connected to the node INV. In the inverter 41, an input terminal is connected to the node INV and an output terminal is connected to the node LAT. In the transistor 42, one end is connected to the node INV, the other end is connected to the bus LBUS, and the control signal STI is input to the gate. In the transistor 43, one end is connected to the node LAT, the other end is connected to the bus LBUS, and the control signal STL is input to the gate.

The circuit configurations of the latch circuits ADL, BDL, and CDL are the same as the above-described circuit configuration of the latch circuit SDL, and thus the description thereof will be omitted.

In the configuration of the sense amplifier unit SAU described above, various control signals are generated by, for example, the sequencer 16. In the read operation, a timing at which the read data is determined by the sense amplifier unit SAU is based on a timing at which the signal STB is asserted. In various operations, the transistor 32 clamps the voltage of the bit line BL based on the signal BLC.

The configuration of the sense amplifier module 11 is not limited thereto, but may be modified in various forms. For example, the number of latch circuits included in the sense amplifier unit SAU is designed based on the number of bits of the data retained by one memory cell transistor MT.

For example, the sense amplifier module 11 may have the configuration disclosed in U.S. patent application Ser. No. 13/052,148, filed on Mar. 21, 2011, titled "THRESHOLD DETECTING METHOD AND VERIFY METHOD OF MEMORY CELLS." The entire contents of this patent application are incorporated by reference in the present disclosure.

[1-1-5] Configurations of Voltage Generator 17 and Plane Switch 18

Figure 7:
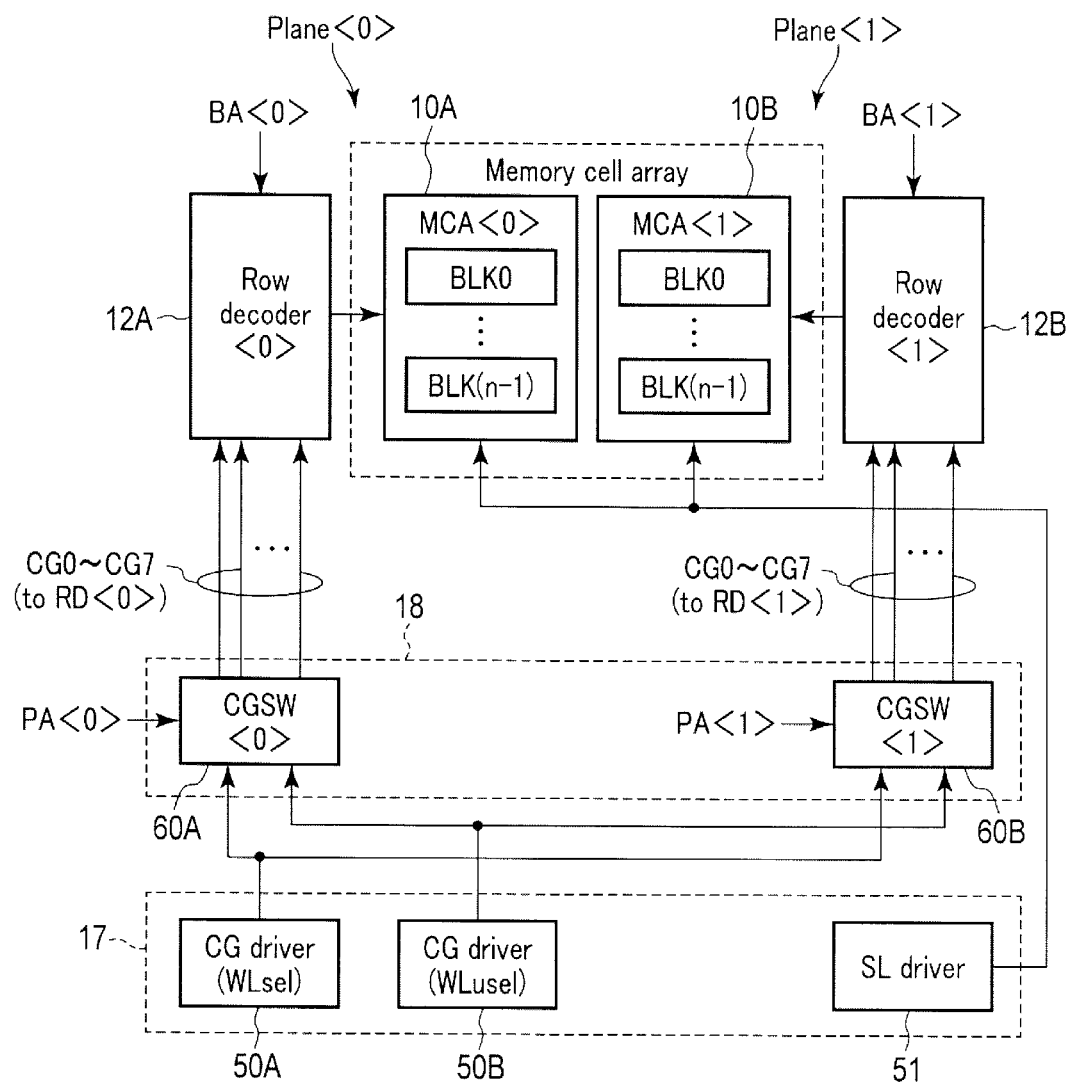
FIG. 7 is a block diagram illustrating a voltage generator and a plane switch included in the semiconductor memory device according to the first embodiment.

Next, the configurations of the voltage generator 17 and the plane switch 18 will be described with reference to FIG. 7. FIG. 7 is a block diagram illustrating the detailed configurations of the voltage generator 17 and the plane switch 18. As illustrated in FIG. 7, the voltage generator 17 includes CG driver 50A and 50B and an SL driver 51. The plane switch 18 includes CG switches 60A and 60B.

The CG drivers 50 generate voltages to be applied to the word lines WL via the plane switch 18 and the row decoder 12. In the present embodiment, the CG driver 50A generates a voltage to be applied to a selected word line WLsel and the CG driver 50B generates a voltage to be applied to a non-selected word line WLusel. The selected word line WLsel corresponds to a word line WL of a data reading target page and the non-selected word line WLusel corresponds to a word line WL other than the selected word line WLsel among the plurality of word lines WL.

The SL driver 51 generates a voltage to be applied to a source line SL of each memory cell array 10. The voltage generator 17 includes a charge pump (not illustrated), and the CG drivers 50 and the SL driver 51 generate desired voltages based on a voltage generated by the charge pump. The voltage generator 17 also includes a driver (not illustrated) such as an SG driver that generates a voltage to be applied to the select gate line SGD.

The CG switches 60 transmit the voltages supplied from the CG drivers 50A and 50B to the CG lines CG0 to CG7 based on the page address PA. The voltages transmitted to the CG lines CG0 to CG7 are transmitted to the word lines WL0 to WL7 of the block BLK selected by the row decoder 12 based on the block address BA.

Figure 8:
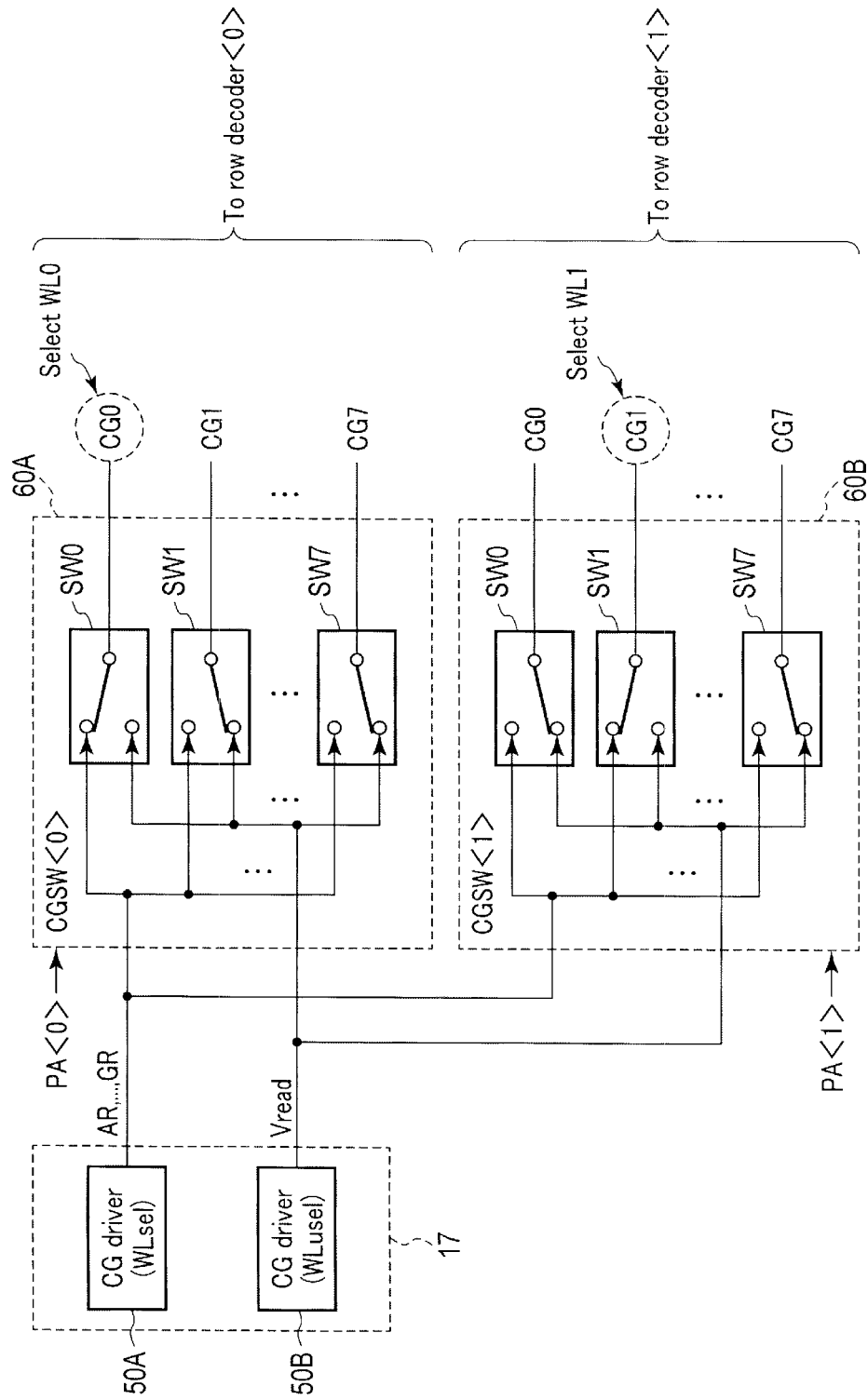
FIG. 8 is a circuit diagram illustrating the voltage generator and the plane switch included in the semiconductor memory device according to the first embodiment.

The specific circuit configuration of the CG switches 60 described above is illustrated in, for example, FIG. 8. As illustrated in FIG. 8, each of the CG switches 60A and 60B includes switch elements SW0 to SW7 corresponding to the CG lines CG0 to CG7, respectively.

Each switch element SW includes two input terminals and one output terminal and electrically connects between one of the two input terminals and the output terminal based on the page address PA input to the CG switch 60. In each switch element SW, read voltages AR, BR, . . . , or GR supplied from the CG driver 50A is input to one of the input terminals, the read pass voltage Vread supplied from the CG driver 50B is input to the other input terminal, and the output terminal is connected to the corresponding CG line.

In the example illustrated in FIG. 8, states of the CG switches 60A and 60B are illustrated when the word line WL0 is selected in plane <0> and the word line WL1 is selected in the plane <1>. In this case, in the CG switch 60A, the output terminal of the switch element SW0 is electrically connected to the CG driver 50A and the output terminal of another switch SW is electrically connected to the CG driver 50B. On the other hand, in the CG switch 60B, the output terminal of the switch element SW1 is electrically connected to the CG driver 50A and the output terminal of another switch element SW is electrically connected to the CG driver 50B.

The semiconductor memory device 1 according to the present embodiment shares the CG driver 50A supplying the voltage to the selected word line WLse1 and the CG driver 50B supplying the voltage to the non-selected word line WLuse1 in the planes <0> and <1>. That is, in the semiconductor memory device 1 according to the present embodiment, the voltage to be applied to the selected word line WLse1 in each plane is substantially the same and the voltage to be applied to the non-selected word line WLuse1 is similarly substantially the same in the read operation. The semiconductor memory device 1 according to the present embodiment can select a different page for each plane in the multi-plane read by using the plane switch 18.

[1-2] Operation

Next, operations of the semiconductor memory device 1 and the memory system 3 will be described.

[1-2-1] Read Operation of Semiconductor Memory Device 1

First, a read operation of the semiconductor memory device 1 will be described. In the read operation of the semiconductor memory device 1 according to the present embodiment, page-by-page reading is executed simultaneity on a plurality of planes. The semiconductor memory device 1 can read page data of different levels in the plurality of planes in such a multi-plane read.

Hereinafter, an example of the read operation in the semiconductor memory device 1 will be described with reference to FIG. 9. FIG. 9 illustrates combinations of cases in which pages at different data levels are read from the planes <0> and <1> and kinds of read operations executed by the semiconductor memory device 1 in correspondence to the combinations in the TLC scheme.

As illustrated in FIG. 9, the semiconductor memory device 1 executes first to third read operations based on a combination of pages to be read. The first read operation is executed when a lower page read is necessary in one plane between the planes <0> and <1> and a middle page read is necessary in the other plane (cases 1 and 2). The second read operation is executed when the lower page read is necessary in one plane between the planes <0>s and <1> and an upper page read is necessary in the other plane (cases 3 and 4). The third read operation is executed when the middle page read is necessary in one plane between the planes <0> sand <1> and the upper page read is necessary in the other plane (cases 5 and 6).

Figure 10:
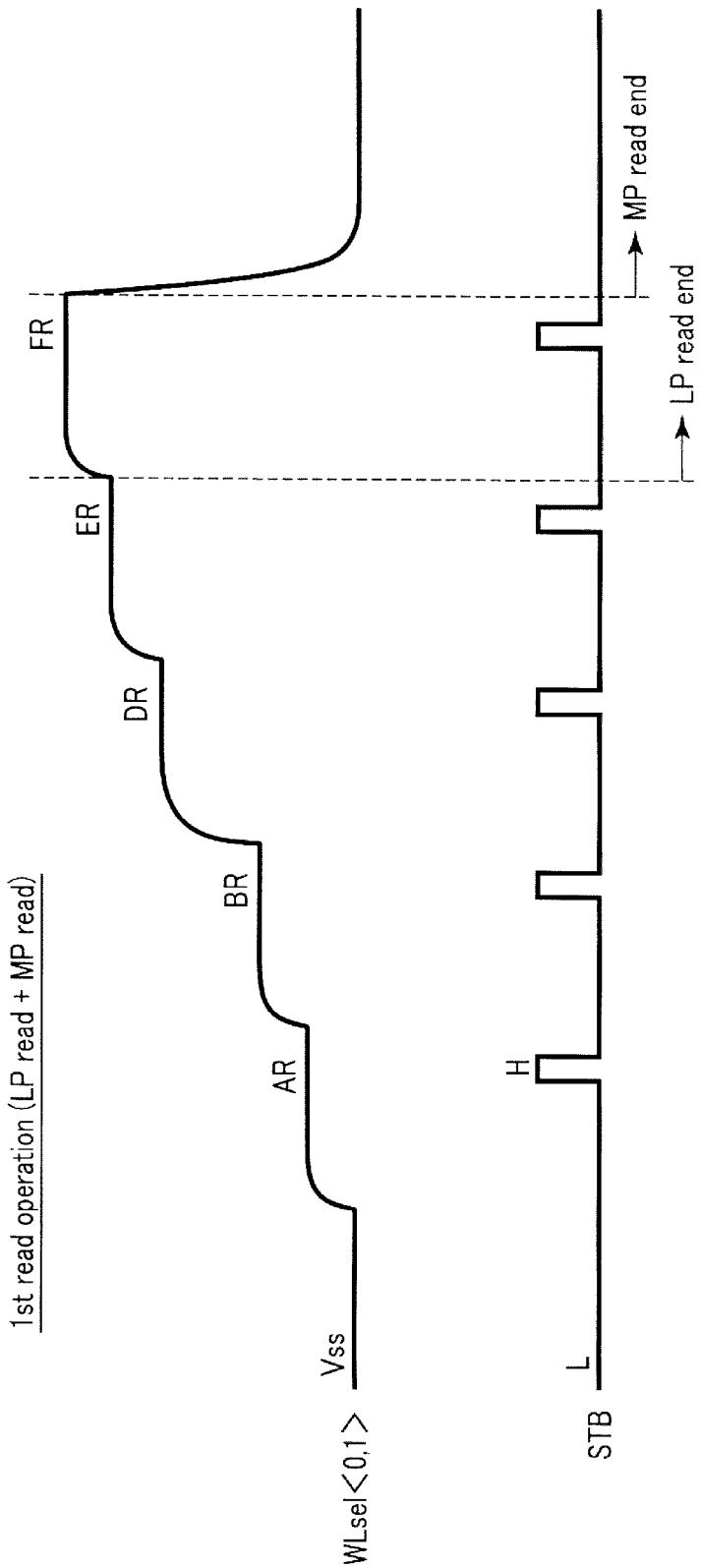
FIG. 10 is a waveform diagram illustrating a read operation in the memory system according to the first embodiment.
Figure 11:
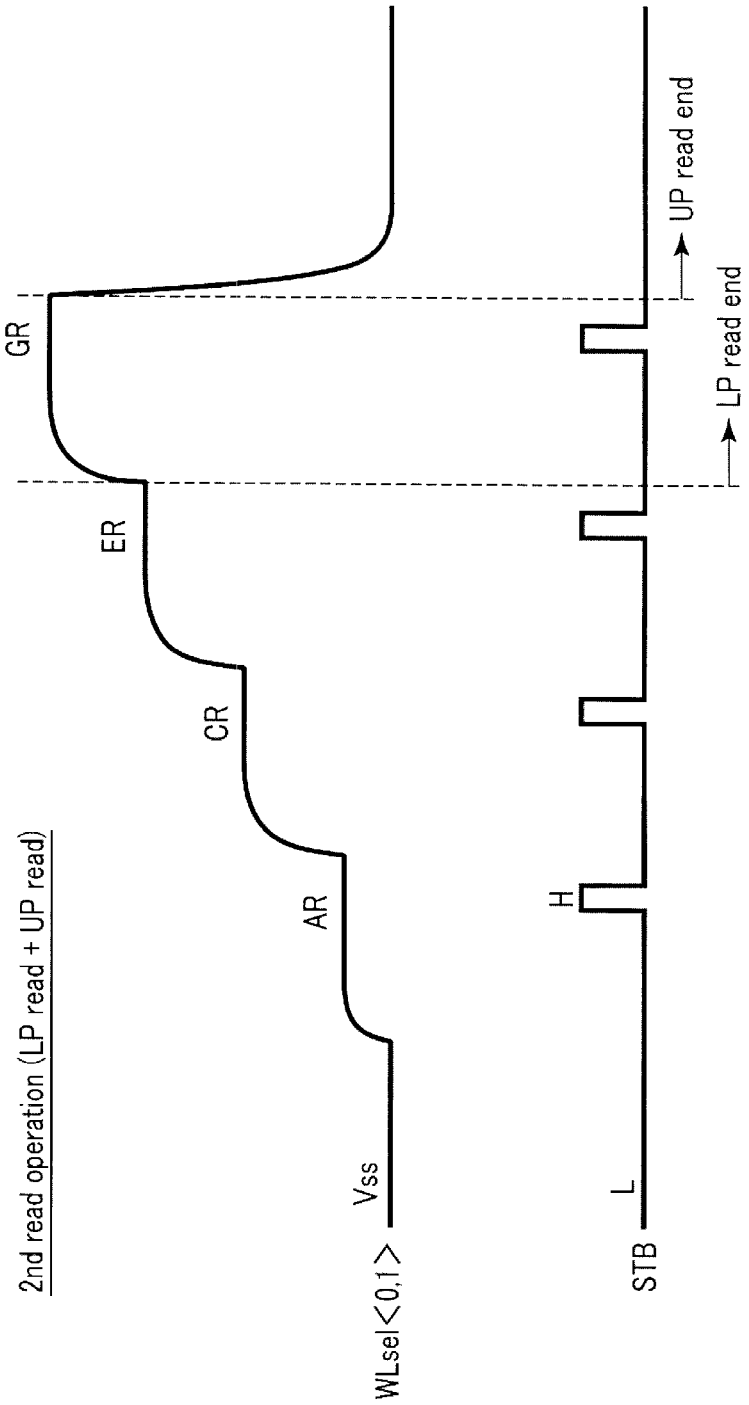
FIG. 11 is a waveform diagram illustrating a read operation in the memory system according to the first embodiment.
Figure 12:
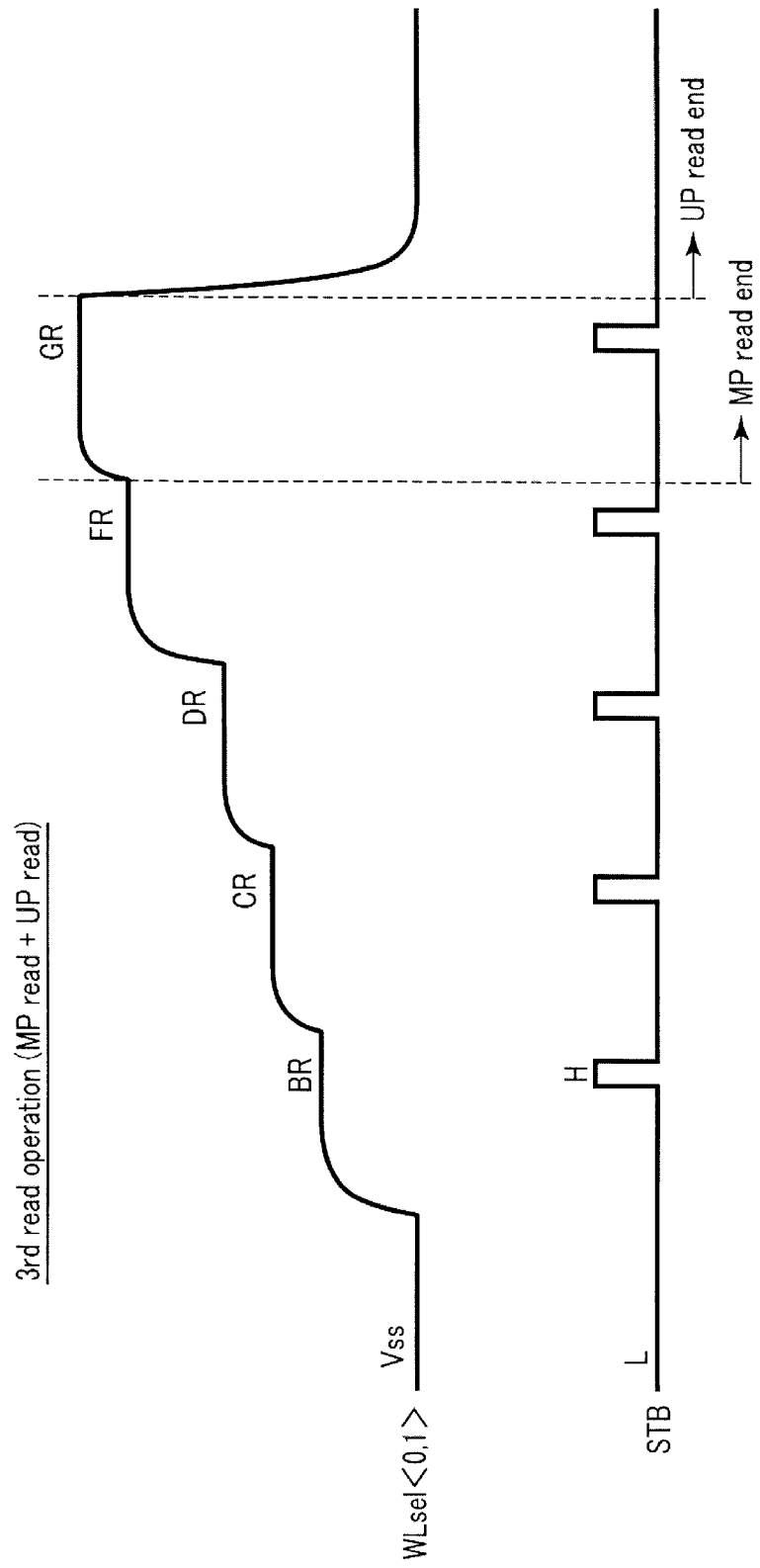
FIG. 12 is a waveform diagram illustrating a read operation in the memory system according to the first embodiment.

Examples of waveforms corresponding to the first to third read operation are illustrated in FIGS. 10 to 12, respectively. FIGS. 10 to 12 illustrates waveforms of control signals STB and voltages applied to the selected word lines WLse1 <0> and <1> corresponding to the planes <0> sand <1> in the respective read operations. For the selected word lines WLse1 <0> and <1>, pages at different data levels are designated and different word lines WL are designated in some cases.

In the first place, the details of the first read operation will be described with reference to FIG. 10. As illustrated in FIG. 10, the row decoders 12A and 12B apply read voltages AR, BR, DR, ER, and FR to the selected word lines WLse1 <0, 1> in order. In this example, of the read voltages, the voltages AR and ER correspond to the lower page read and the voltages BR, DR, and FR correspond to the middle page read.

The sequencer 16 asserts each control signal STB during application of each read voltage to the selected word line WLse1. Then, each sense amplifier unit SAU determines data to be read to the bit line BL corresponding to a timing at which the signal STB is asserted and retains the data in the latch circuit SDL.

In this way, the read data read at each read voltage and retained in the latch circuit SDL is transmitted to another latch circuit when calculation is necessary to obtain desired data. For example, the sense amplifier unit SAU corresponding to the plane in which the lower page is read transmits the data retained in the latch circuit SDL to, for example, the latch circuit ADL since the read data by the voltage AR is used to calculate the lower page.

Conversely, when the read data by the voltage AR is not used for the calculation as in the plane in which the middle page is read, the sense amplifier unit SAU corresponding to this plane may transmit or may not transmit the data retained in the latch circuit SDL to another latch circuit. In this way, the latch circuit retaining the unnecessary read data is used to overwrite data through a subsequent operation. Accordingly, the sense amplifier unit SAU ensures the number of latch circuits necessary to calculate each page.

In this example, the lower page read ends at a timing at which the calculation ends after the data is read by the voltage ER since the data of the lower page is calculated based on the data read by the voltages AR and ER. The middle page read ends at a timing at which the calculation ends after the data is read by the voltage FR since the data of the middle page is calculated based on the data read by the voltages BR, DR and ER.

The above-described description corresponds to the first read operation. In the second and third read operations, voltages to be applied to the selected word lines WLse1 are different. Hereinafter, the details of the second and third read operations will be described focusing on differences from the first read operation.

In the second read operation, as illustrated in FIG. 11, the read voltages AR, CR, ER, and GR are applied to the selected word lines WLse1 <0, 1> in order and the control signal STB is asserted during the application of the respective voltages. In this example, of the read voltages, the voltages AR and ER correspond to the lower page read and the voltages CR and GR correspond to the upper page read. The lower page read in this example ends at a timing at which calculation ends after the data is read by the voltage ER. The upper page read ends at a timing at which the calculation ends after the data is read by the voltage GR since the data of the upper page is calculated based on the data read by the voltages CR and GR.

In the third read operation, as illustrated in FIG. 12, the read voltages BR, CR, DR, FR, and GR are applied to the selected word lines WLse1 in order and the control signal STB is asserted during the application of the respective voltages. The middle page read in this example ends at a timing at which the read operation is executed by the voltage FR, and the upper page read ends at a timing at which the read operation is executed by the voltage GR.

In the read operations of the semiconductor memory device 1 according to the present embodiment, the read voltages necessary to calculate the page data of both planes are applied to the selected word lines WLse1 <0, 1> of both planes when pages at different data levels are read for each plane. Then, page data of a desired level is calculated by extracting each piece of data necessary for the calculation in each plane based on the data read using each read voltage. In this way, the semiconductor memory device according to the present embodiment can read one-page data of a different data level for each plane through the one-time read operation.

Figure 13:
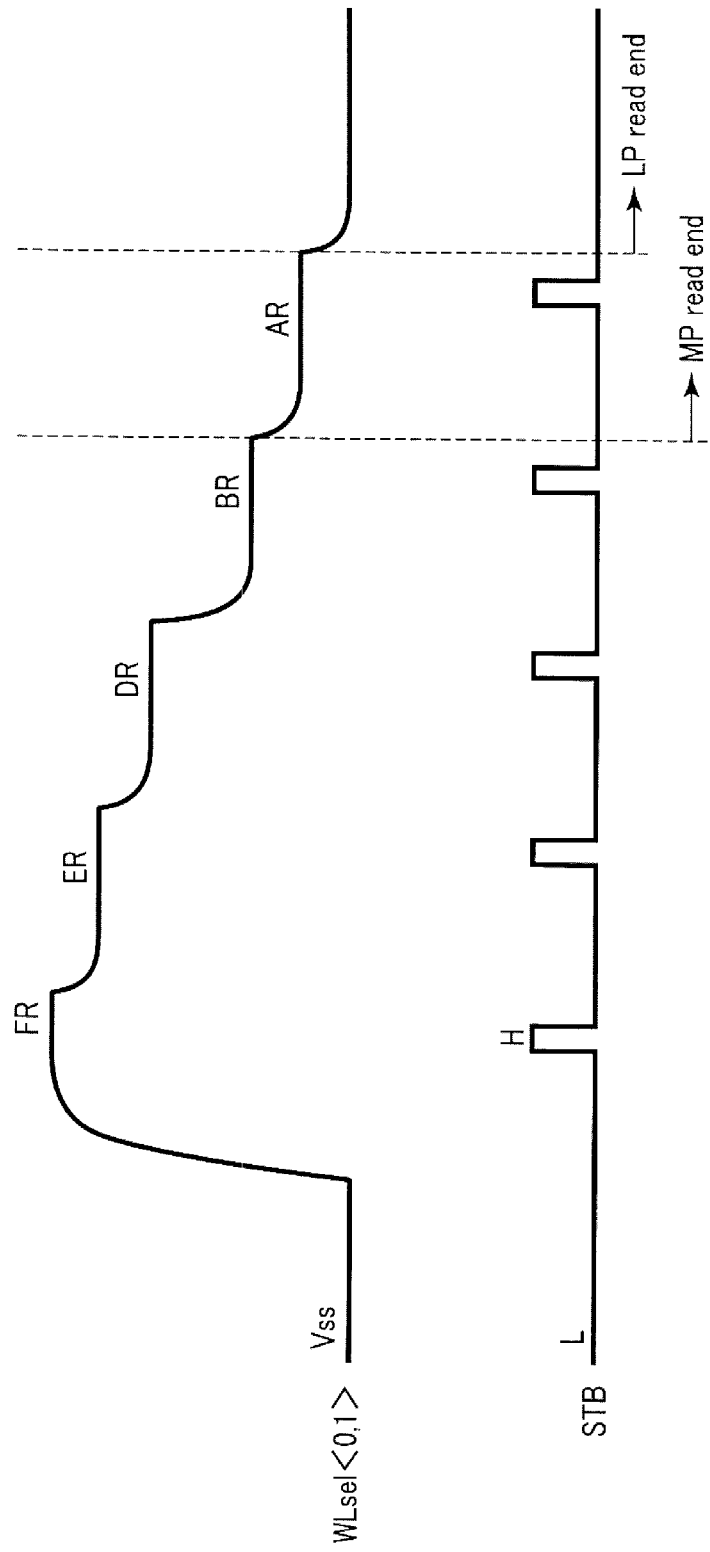
FIG. 13 is a waveform diagram illustrating a read operation in the memory system according to the first embodiment.

The semiconductor memory device 1 may apply the voltages in the order illustrated in FIG. 13 when the lower page read is necessary in one of the planes and the middle page read is necessary in the other plane. Specifically, the read voltages FR, ER, DR, BR, and AR may be applied to the selected word lines WLse1 in order. Even in this case, the sequencer 16 can read the data by asserting the control signal STB during the application of the respective read voltages. In this example, the middle page read ends earlier than the lower page read. In the operation illustrated in FIG. 13, it is considered that the order in which the read voltages are applied is considered to be reversed in the first read operation and the read voltages are applied similarly in the reverse order even in the second and third read operations.

The timing at which the reading of the page data of each level illustrated in FIGS. 10 to 13 ends is a timing at which each read voltage is switched to a voltage to be subsequently applied, but an embodiment is not limited thereto. For example, the timing is deviated from the timing illustrated in FIGS. 10 to 13 in accordance with a calculation time of each piece of page data at which necessary data is arranged for execution in some cases.

In the above description, the case is illustrated in which the order in which the reading of each piece of page data ends is an order of the lower page, the middle page, and the upper page, but an embodiment is not limited thereto. For example, when allocation of the data is changed in the case in which data of a plurality of bits is retained, the order in which the reading of each page ends is changed in some cases.

[1-2-2] Read Operation of Memory System 3

Next, the read operation of the memory system 3 will be described. In the read operation of the memory system 3 according to the present embodiment, the controller 2 instructs the semiconductor memory device 1 including the plurality of planes to execute the multi-plane read including a read at different data levels for each plane. Then, the semiconductor memory device 1 executes the multi-plane read based on the data level read from each plane and outputs the read data for each plane in response to an instruction of the controller 2.

Figure 14:
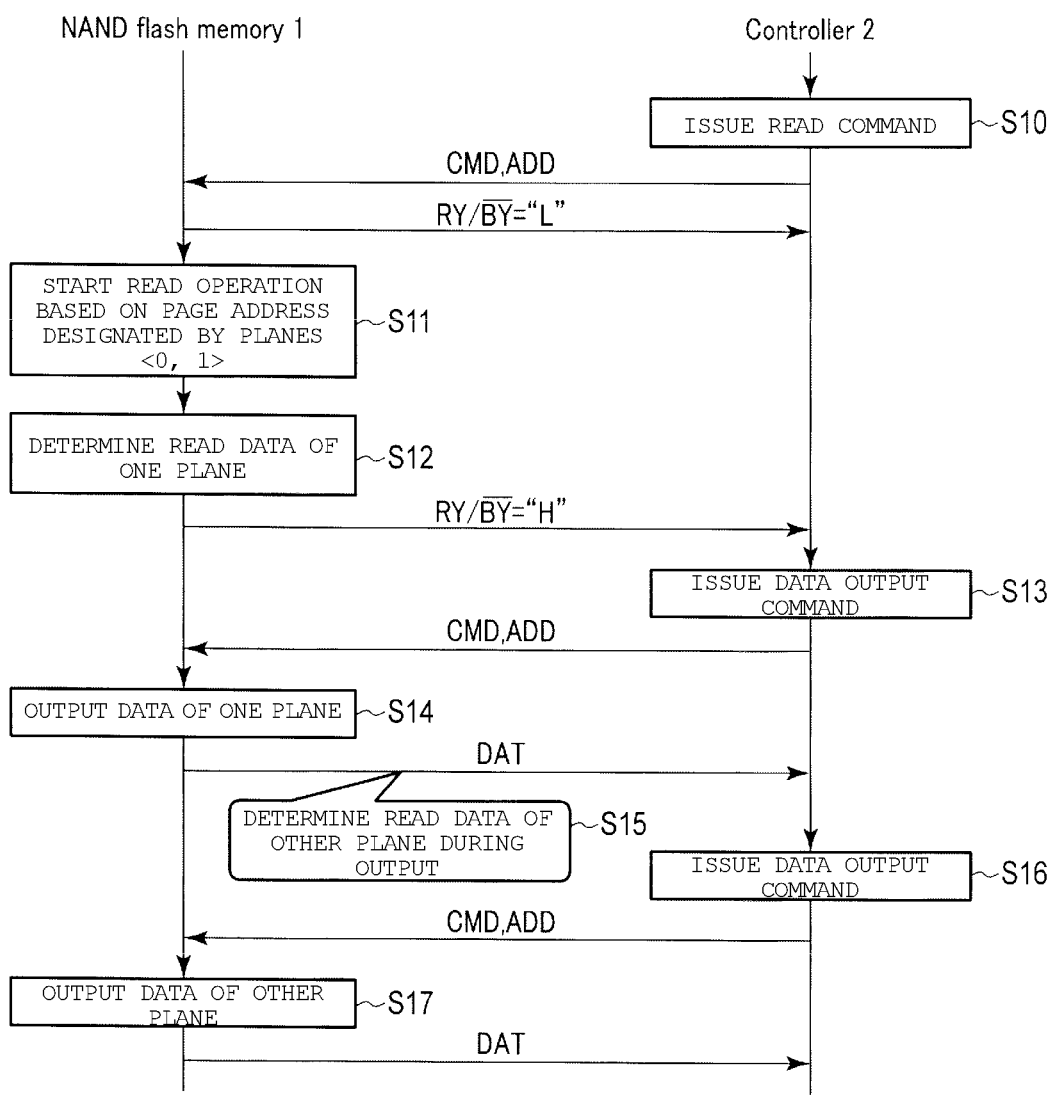
FIG. 14 is a flowchart illustrating the read operation in the memory system according to the first embodiment.

Hereinafter, an example of the read operation of the memory system 3 will be described with reference to FIG. 14. FIG. 14 is a flowchart illustrating an example of the read operation of the memory system 3.

As illustrated in FIG. 14, the controller 2 first issues a read command (the command CMD and the address information ADD) to transmit the read command to the semiconductor memory device 1 (step S10). The read command is used to give an instruction of the page-by-page reading at mutually different levels in regard to the planes <0, 1>. The semiconductor memory device 1 that has received the read command from the controller 2 sets the ready/busy signal from an "H" level to an "L" level and starts the read operation based on pages designated by the planes <0, 1> (step S11). The read operation in step S11 corresponds to the read operation of the semiconductor memory device 1 described in section [1-2-1].

Next, when the semiconductor memory device 1 detects that the read data is determined in one plane between the planes <0, 1> (step S12), the semiconductor memory device 1 sets the ready/busy signal from the "L" level to the "H" level. Then, the controller 2 detecting that the semiconductor memory device 1 enters the ready state issues a data output command corresponding to the one plane in which the read data is determined (step S13) to transmit the data output command to the semiconductor memory device 1.

Then, the semiconductor memory device 1 that has received the data output command from the controller 2 outputs the read data DAT of the one plane to the controller 2 (step S14). When the read data of the other plane is determined during the output of the data DAT (step S15), the semiconductor memory device 1 maintains the ready/busy signal at the "H" level.

When the controller 2 confirms that the semiconductor memory device 1 maintains the ready state at the time of ending of the data output of the one plane in step S14, the controller 2 issues the data output command corresponding to the other plane (step S16) to transmit the data output command to the semiconductor memory device 1. Then, the semiconductor memory device 1 that has received the data output command from the controller 2 outputs the read data DAT of the other plane to the controller 2 (step S17).

Figure 15:
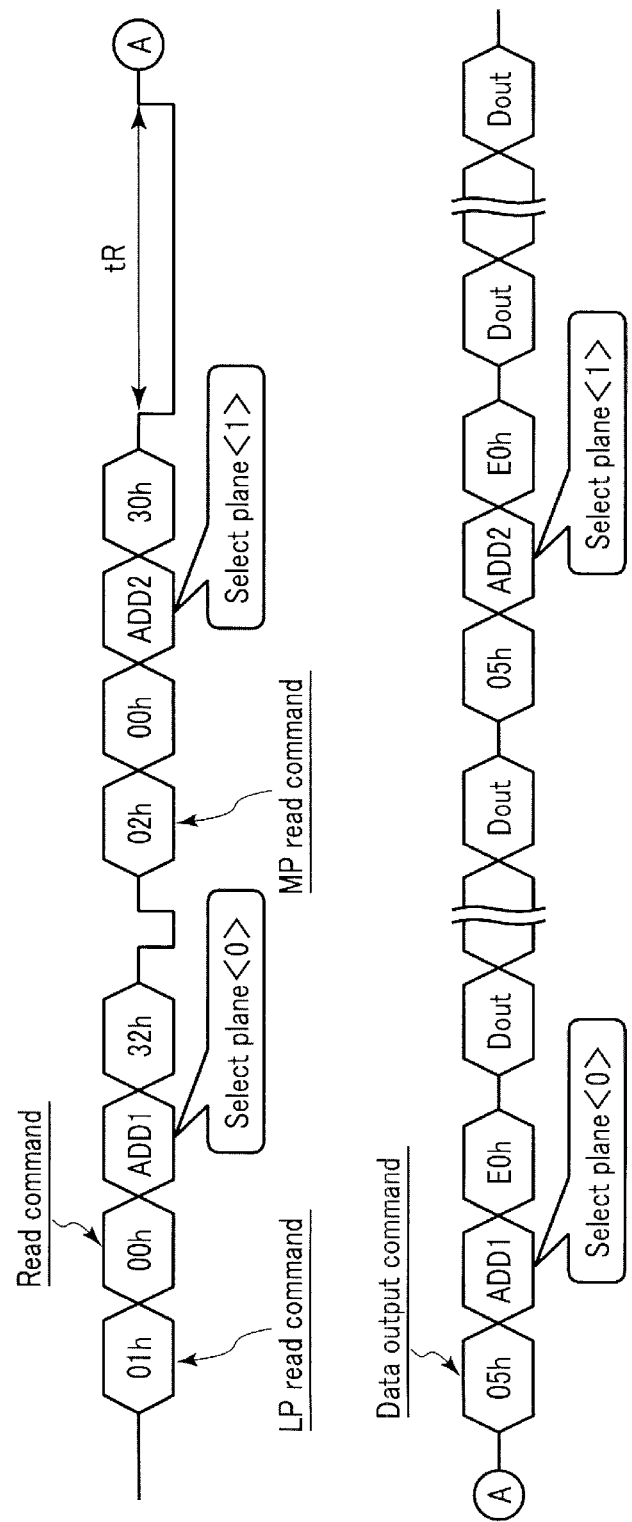
FIG. 15 is a diagram illustrating a command sequence of the read operation in the memory system according to the first embodiment.

The command sequence in the read operation of the memory system 3 described above is illustrated in, for example, FIG. 15. An example illustrated in FIG. 15 is a command sequence when the semiconductor memory device 1 is instructed to execute the multi-plane read in which the lower page read on the plane <0> and the middle page read on the plane <1> are simultaneously executed. In this example, the semiconductor memory device 1 executes the first read operation.

Hereinafter, the command sequence of the memory system 3 will be described with reference to FIG. 15. In the following description, when the input and output circuit 13 of the semiconductor memory device 1 receives the command and the address information, the input and output circuit 13 is assumed to transmit the received command and address information to the command register 14C and the address register 14B, respectively.

As illustrated in FIG. 15, the controller 2 first issues the read command corresponding to the planes <0> and <1>.

Specifically, the controller 2 first successively issues a command "01h" and a read command "00h" to transmit the command "01h" and the read command "00h" to the semiconductor memory device 1. The command "01h" is used to command the semiconductor memory device 1 to execute the lower page read. The command "00h" corresponds to an address input reception command for reading and used to command the semiconductor memory device 1 to execute the data read operation.

Next, the controller 2 issues address information ADD1 to transmit the address information ADD1 to the semiconductor memory device 1. The address information ADD1 includes information for designating the plane <0> and information for designating the page address PA corresponding to a lower page. The controller 2 thereafter issues a command "32h" to transmit the command "32h" to the semiconductor memory device 1. The command "32h" is used to command the multi-plane operation and indicates that the previously transmitted command and address information correspond to a single plane.

When the command "32h" is stored in the command register 14C, the sequencer 16 sets the ready/busy signal from the "H" level to the "L" level and thereafter sets the ready/busy signal from the "L" level to the "H" level. This operation indicates that the semiconductor memory device 1 can receive the read commands from the controller 2.

When the controller 2 detects that the ready/busy signal is changed from the "L" level to the "H" level, the controller 2 successively issues a command "02h" and a read command "00h" to transmit the command "02h" and the read command "00h" to the semiconductor memory device 1.

The command "02h" is used to command the semiconductor memory device 1 to execute the middle page read.

Next, the controller 2 issues the address information ADD2 to transmit the address information ADD2 to the semiconductor memory device 1. The address information ADD2 includes information for designating the plane <1> and information for designating the page address PA corresponding to a middle page. The controller 2 thereafter issues a command "30h" to transmit the command "30h" to the semiconductor memory device 1. The command "30h" is used to instruct the semiconductor memory device 1 to start the read operation based on the received command and address information corresponding to each plane. In this example, the multi-plane read is executed based on a command set including an instruction related to the plane <0> and the command "32h" and a command set including an instruction related to the plane <1> and the command "30h".

When the command "30h" is stored in the command register 14C, the sequencer 16 changes the ready/busy signal from the "H" level to the "L" level to start the first read operation. As illustrated, tR corresponds to a time until the data of the lower page is determined in the first read operation.

When the data of the lower page read is determined in the plane <0>, the sequencer 16 sets the ready/busy signal to the "H" level. Then, the controller 2 issues a data transmission command corresponding to the plane <0> in response to the fact that the semiconductor memory device 1 enters the ready state.

Specifically, the controller 2 first issues a data output command "05h" to transmit the data output command "05h" to the semiconductor memory device 1. The command "05h" is used to instruct the semiconductor memory device 1 to output data retained in a cache (for example, the latch circuit XDL of each sense amplifier unit SAU) of each plane to the controller 2. Next, the controller 2 issues the address information ADD1 to transmit the address information ADD1 to the semiconductor memory device 1. The address information ADD1 includes information for designating the plane <0>. The controller 2 thereafter issues a command "E0h" to transmit the command "E0h" to the semiconductor memory device 1. The command "E0h" causes the semiconductor memory device 1 to start outputting data to the controller 2 based on the previously transmitted address information.

When the command "E0h" is stored in the command register 14C, the sequencer 16 outputs read data Dout of the lower page retained in the sense amplifier module 11A corresponding to the plane <0> to the controller 2 via the input and output circuit 13. Then, when the controller 2 detects that the semiconductor memory device 1 maintains the ready state at the time of reception of all the pieces of read data Dout of the plane <0>, the controller 2 thereafter issues the command "05h", the address information ADD2, and the command "E0h" in order to transmit the command "05h", the address information ADD2, and the command "E0h" to the semiconductor memory device 1. The address information ADD2 includes information for designating the plane <1>.

When the command "E0h" is stored in the command register 14C, the sequencer 16 outputs the read data Dout of the middle page retained in the sense amplifier module 11B corresponding to the plane <1> to the controller 2 via the input and output circuit 13.

In this way, in the example, the controller 2 issues a data output command in the plane <0> earlier than in the plane <1> since the lower page read in the plane <0> ends earlier than the middle page read in the plane <1>.

Figure 16:
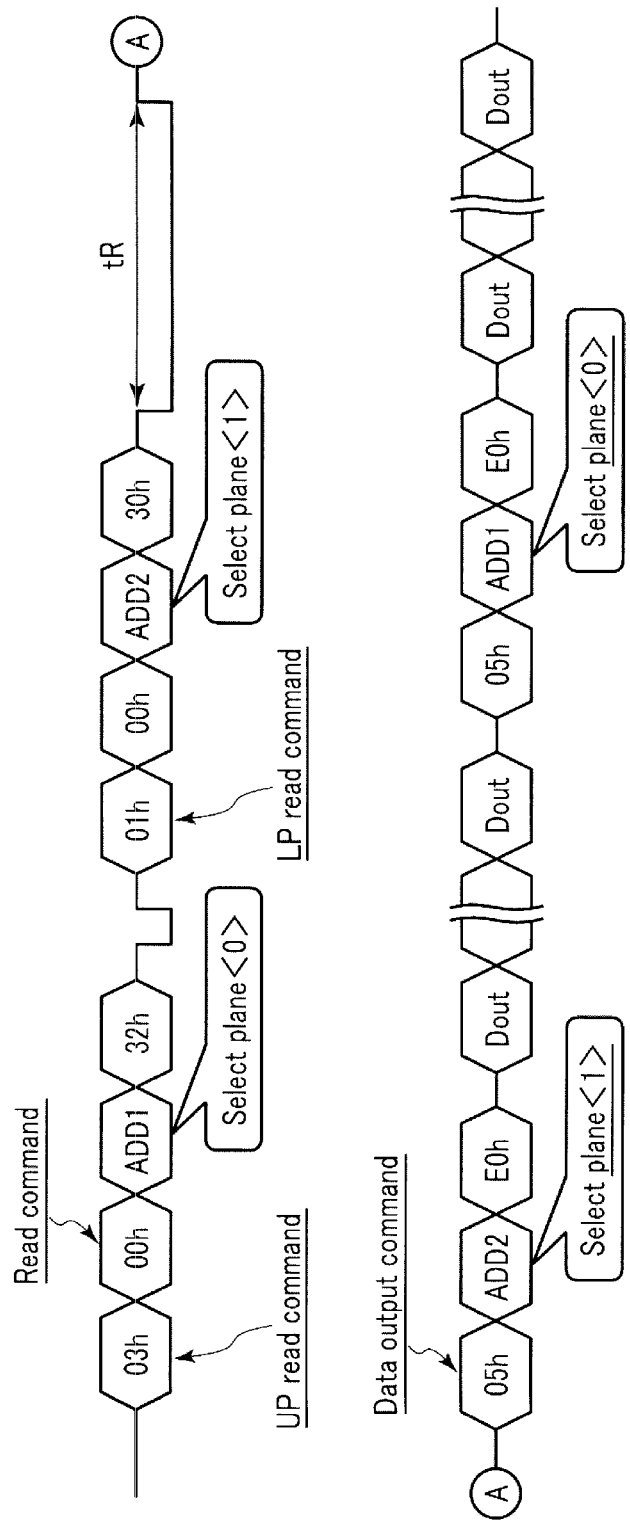
FIG. 16 is a diagram illustrating a command sequence of the read operation in the memory system according to the first embodiment.

In the read operation of the memory system 3 according to the present embodiment, when the controller 2 issues a read command, as illustrated in FIG. 16, an order of planes instructed to output data is different from an order in which read commands corresponding to the planes are issued in some cases. An example illustrated in FIG. 16 is a command sequence when the semiconductor memory device 1 is instructed to execute the multi-plane read in which the upper page read on the plane <0> and the lower page read on the plane <1> are simultaneously executed. In this example, the semiconductor memory device 1 executes the third read operation.

In the command sequence of the read command illustrated in FIG. 16, the command "01h" in the read command corresponding to the plane <0> in the command sequence illustrated in FIG. 15 is replaced with the command "03h" and the command "02h" in the read command corresponding to the continuous plane <1> is replaced with the command "01h". The command "03h" is used to command the semiconductor memory device 1 to execute the upper page read.

In this example, the read data is determined earlier in the plane <1> in which the reading of the lower page is executed than in the plane <0> in which the reading of the upper page is executed. That is, the plane <1> enters a state in which the read data can be output earlier. In this case, the controller 2 issues the data output command in the plane <1> earlier than in the plane <0>. Specifically, the address information ADD2 corresponding to the earlier issued data output command is set to designate the plane <1>, and the address information ADD1 corresponding to the later issued data output command is set to designate the plane <0>.

The memory system 3 according to the present embodiment can execute the multi-plane read to read the pages at the different levels in the plurality of planes, and the controller 2 can output the read data to the semiconductor memory device 1 in order from the plane in which the read data is confirmed earlier.

Figure 17:
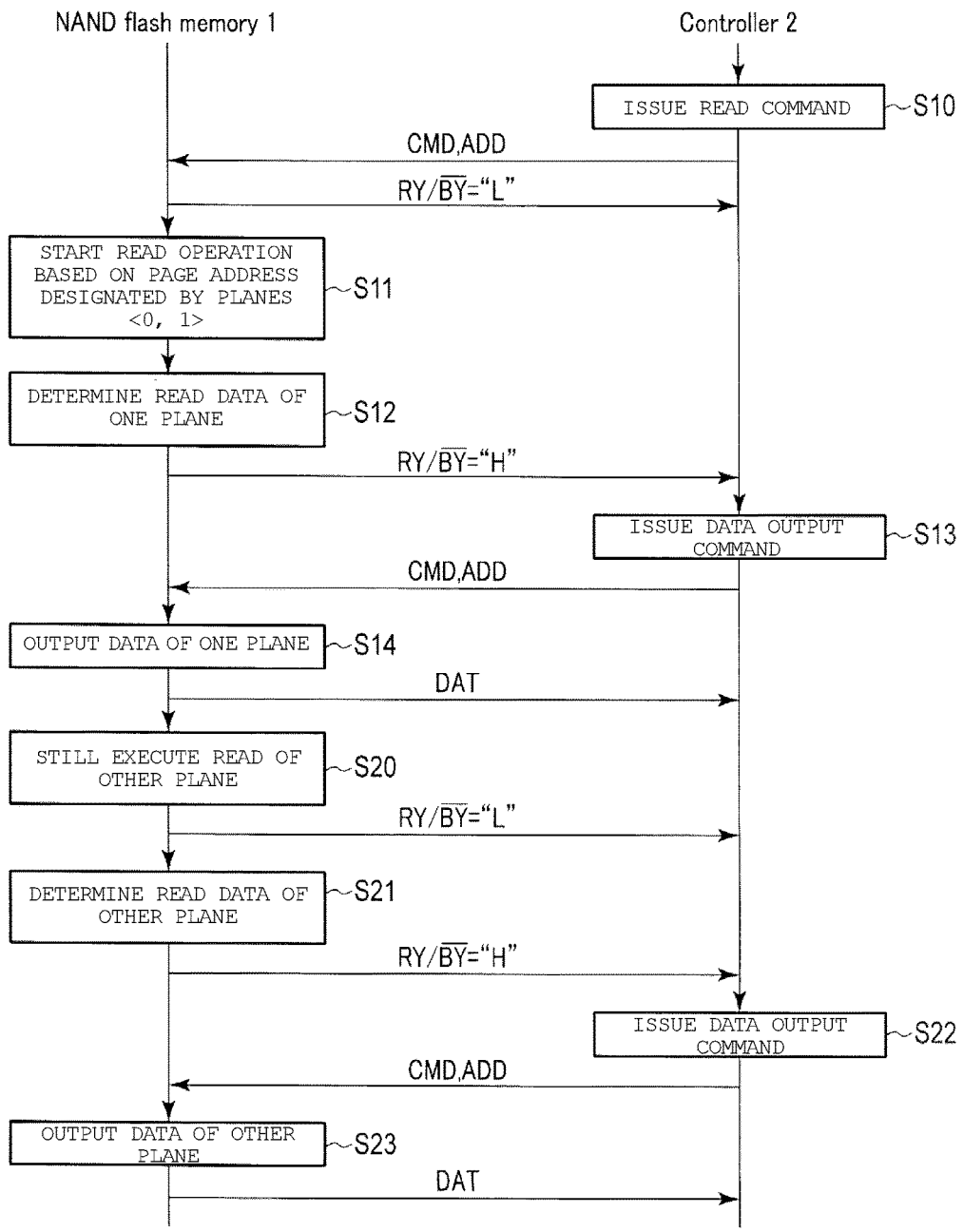
FIG. 17 is a flowchart illustrating the read operation in the memory system according to the first embodiment.

When the data output of one plane ends in the read operation of the memory system 3 according to the present embodiment, the read data of the other plane is not determined in some cases. A flowchart of the read operation in this case is illustrated in, for example, FIG. 17. The operations of steps S10 to S14 illustrated in FIG. 17 are the same as the operations described with reference to FIG. 14. Hereinafter, differences of the operation of this example from FIG. 14 will be described.

When the read operation of the other plane is not completed at the time of ending of the operation in step S14 (S20), the semiconductor memory device 1 sets the ready/busy signal from the "H" level to the "L" level. That is, when the read data of the other plane is not determined at the timing at which the output of the read data of the one plane in which the data is determined earlier ends, the semiconductor memory device 1 notifies the controller 2 of the busy state. At this time, when the controller 2 detects that the state of the semiconductor memory device 1 is changed to the busy state at a timing at which reception of the read data of the one plane ends, the controller 2 waits until the semiconductor memory device 1 enters the ready state without issuing a subsequent data output command.

When the read data of the other plane is determined (S21), the semiconductor memory device 1 sets the ready/busy signal from the "L" level to the "H" level. Then, the controller 2 issues a data output command corresponding to the other plane in response to the fact that the semiconductor memory device 1 enters the ready state (step S22) to transmit the data output command to the semiconductor memory device 1. Then, the semiconductor memory device 1 that has received the data output command from the controller 2 outputs the read data DAT of the other plane to the controller 2 (step S23).

Figure 18:
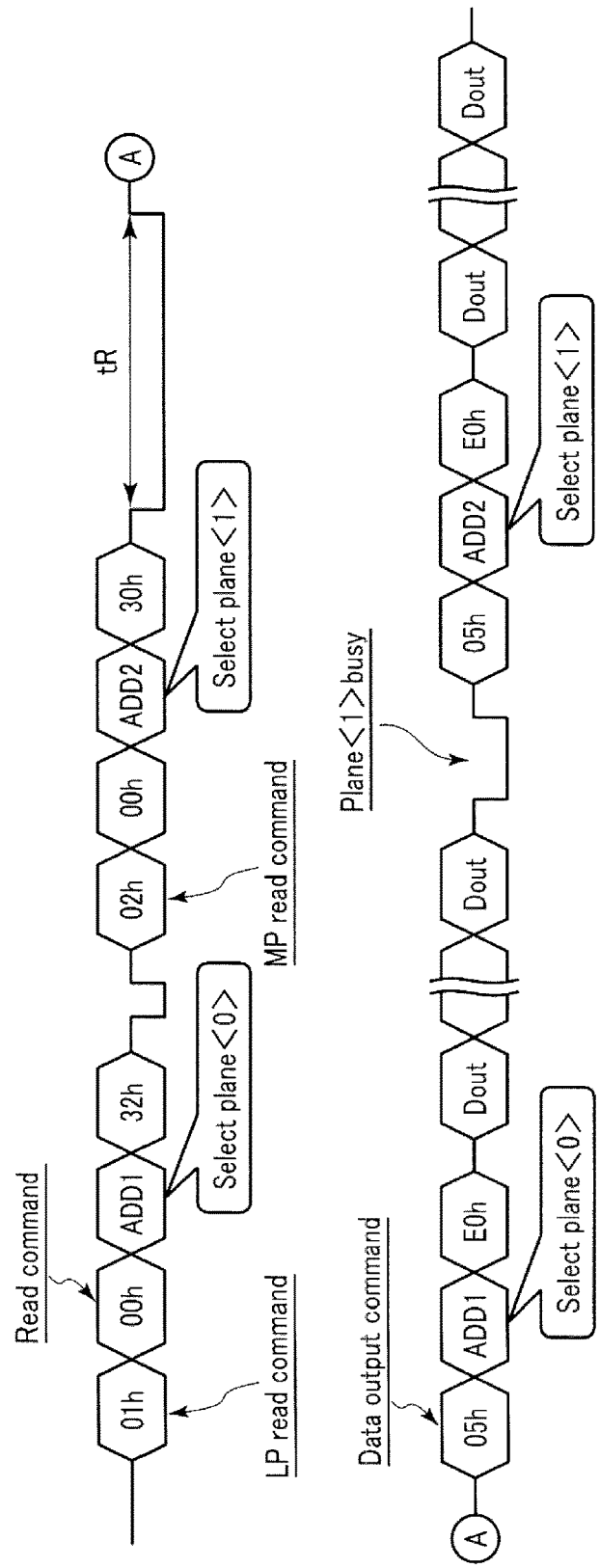
FIG. 18 is a diagram illustrating a command sequence of the read operation in the memory system according to the first embodiment.

In this case, a command sequence of the read operation is illustrated in, for example, FIG. 18. The command sequence illustrated in FIG. 18 is different from the command sequence illustrated in FIG. 15 in that there is a time at which the semiconductor memory device 1 enters the busy state while the data output command is being issued for each plane.

Specifically, the controller 2 issues the data output command corresponding to the plane <0> to transmit the data output command to the semiconductor memory device 1, and the semiconductor memory device 1 outputs the read data of the plane <0> to the controller 2 in response to this command. Then, the sequencer 16 of the semiconductor memory device 1 detects that the read data of the plane <1> is not determined when the output of the read data of the plane <0> to the controller 2 ends, and sets the ready/busy signal from the "H" level to the "L" level. That is, the sequencer 16 sets the state of the semiconductor memory device 1 to the busy state when the sequencer 16 detects that the data of the plane <1> may not be output immediately after the output of the data of the plane <0>.

When the read data of the plane <1> is determined, the sequencer 16 sets the ready/busy signal from the "L" level to the "H" level and notifies the controller 2 that the read data of the plane <1> can be output. The subsequent operations are the same as those of the command sequence illustrated in FIG. 15.

[1-3] Advantages of First Embodiment

The memory system 3 according to the first embodiment can accelerate the operation. Hereinafter, the details of this advantage will be described.

There is known a semiconductor memory device including memory cell arrays that are capable of storing data of a plurality of bits and including a plurality of independently operable planes. In one example configuration of such a semiconductor memory device, a CG driver supplying voltages to word lines is shared between the plurality of planes. In this case, the same voltage is supplied to the selected word lines and the non-selected word lines corresponding to the respective planes at the time of a read operation of the semiconductor memory device by the shared CG driver.

The semiconductor memory device including the plurality of planes can execute a read operation called a multi-plane read of reading data simultaneously from the plurality of planes. For example, when semiconductor memory device includes two planes, the controller issues read commands corresponding to the two planes, respectively, and thereafter transmits the read commands to the semiconductor memory device. Then, the semiconductor memory device controls the two planes based on the commands received from the controller and starts the multi-plane read. Accordingly, the read data is output for each plane based on the commands issued by the controller.

In the memory system 3 according to the present embodiment, the multi-plane read can further be executed to read pages at different levels (where the levels correspond to lower page, middle page, and upper page) in the plurality of planes. Specifically, the controller 2 outputs a command to instruct the read at the different level in each plane and a corresponding page address to the semiconductor memory device 1 including, for example, the planes <0> and <1>. Then, the semiconductor memory device 1 that has received the command and the page address from the controller 2 applies various read voltages to the selected word lines WLsel based on a combination of the data levels read from the planes <0> and <1>.

More specifically, a read voltage necessary to calculate data at a desired level in the plane <0> and a read voltage necessary to calculate data at a desired level from the plane <1> are applied to the selected word lines WLsel <0, 1> respectively corresponding to the planes <0> and <1>. Then, the sense amplifier module 11 corresponding to each plane obtains the page data at the desired level by extracting and calculating only the necessary read data among the data read by each read voltage.

For example, when the data of the lower page is read from the plane <0> and the data of the middle page is read from the plane <1>, the data is read by applying the read voltages AR and ER corresponding to the lower page read as the read voltages and applying the read voltages BR, DR, and FR corresponding to the middle page read in order from the lower voltage or the higher voltage. Then, the sense amplifier module 11A calculates the data of the lower page using the read data at the voltages AR and ER and the sense amplifier module 11B calculates the data of the middle page using the read data at the voltages BR, DR, and FR. That is, a first page associated with the low-order bit is read in the units of pages from the memory cell array 10A and a second page associated with the middle bit is read in the units of pages from the memory cell array 10B in parallel with the reading of the first page.

The memory system 3 according to the present embodiment can execute the multi-plane read to read the pages at the different levels in the plurality of planes. The memory system 3 according to the present embodiment can simply control the controller 2 since the restriction that a page address of the same data level is input in the plurality of planes in the multi-plane read is removed. Accordingly, the memory system 3 according to the present embodiment can improve a performance in the multi-plane operation and accelerate a read speed.

When the semiconductor memory device 1 according to the present embodiment gives an instruction to execute the reading at the different data levels from the plurality of planes in the multi-plane read, a timing at which the read data is determined is different for each plane according to the level of the read data.

Accordingly, the memory system 3 according to the present embodiment sequentially outputs the data from the plane in which the read data is determined earlier in the multi-plane read of reading the different data levels from the plurality of planes.

Specifically, the read of the lower page ends earlier than the middle page in the multi-plane read in which the lower page read is executed in the plane <0> and the middle page read is executed in the plane <1>, as illustrated in, for example, FIG. 10.

In this case, when the read data of the plane <0> is determined, the sequencer 16 detects the determination of the read data and causes the semiconductor memory device 1 to enter the ready state. When the controller 2 detects that the semiconductor memory device 1 enters the ready state, the controller 2 issues the data output command for the plane <0> in which the read data is determined earlier. Then, the semiconductor memory device 1 that has received this command continues to execute the middle page read of the plane <1> and outputs the lower page data read in the plane <0> to the controller 2.

In this way, in the memory system 3 according to the present embodiment, the data can be output from the plane in which the read data is determined even while the semiconductor memory device 1 executes the multi-plane read. Accordingly, the memory system 3 according to the present embodiment can accelerate the read speed since the timing at which the semiconductor memory device 1 starts outputting the read data can be advanced.

The order of the planes in which the controller 2 gives an instruction to transmit the data is determined based on the command used to instruct the read operation. For example, when the upper page read is executed in the plane <0> and the lower page read is executed in the plane <1>, as illustrated in FIG. 16, in the multi-plane read, the controller 2 can beforehand know that the read data is determined in the plane <1> earlier than in the plane <0>. Therefore, the controller 2 instructs the plane <1> to output the data earlier.

[2] Second Embodiment

Next, a semiconductor memory device 1 and a memory system 3 according to a second embodiment will be described. In the second embodiment, unnecessary data is not read in the read operation of the semiconductor memory device 1 described in the first embodiment by controlling the control signal STB for each plane by the sequencer 16. Hereinafter, differences between the first and second embodiments will be described.

[2-1] Configuration of Semiconductor Memory Device 1

Figure 19:
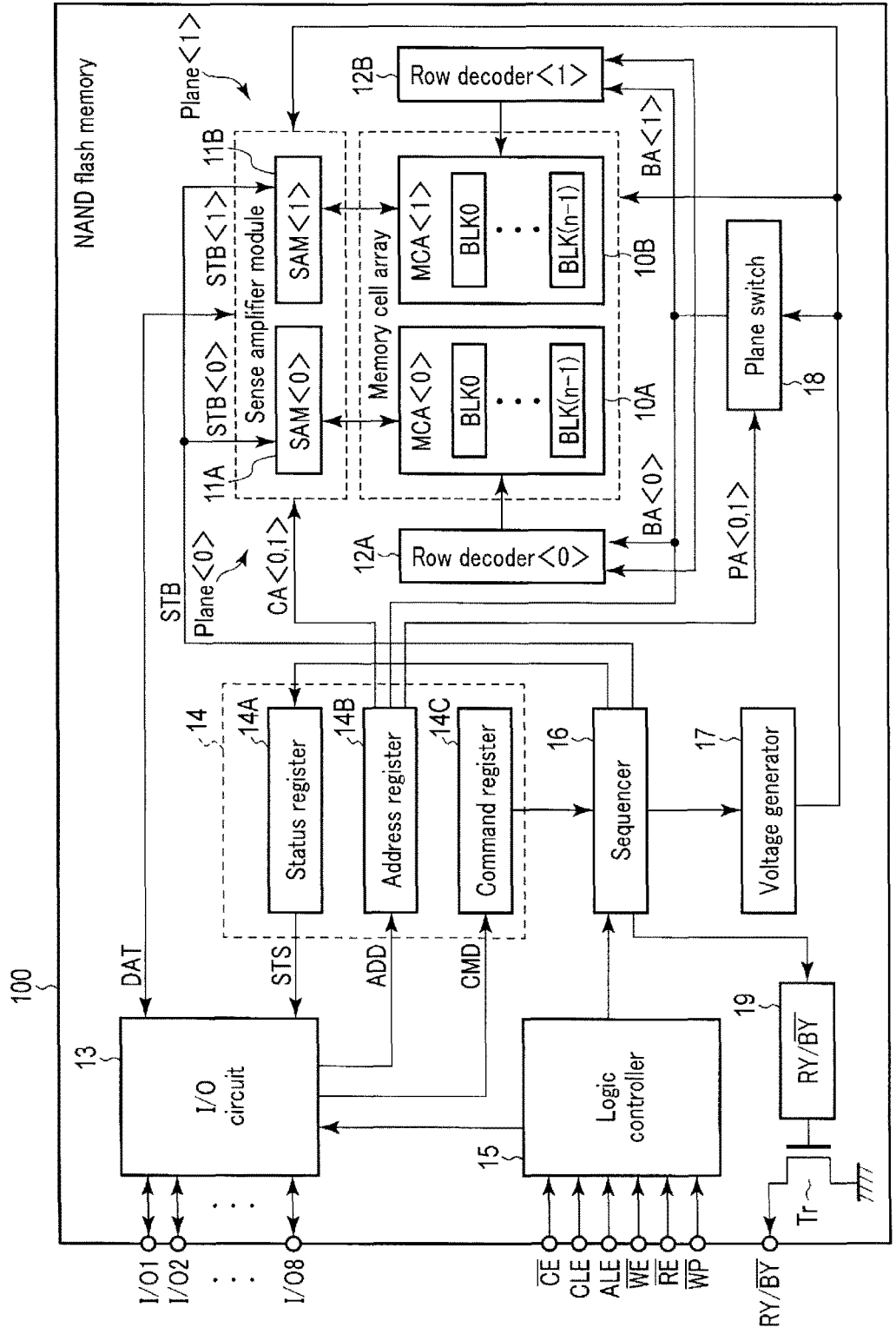
FIG. 19 is a block diagram illustrating a semiconductor memory device according to a second embodiment.

First, the configuration of the semiconductor memory device 1 will be described with reference to FIG. 19. FIG. 19 is a block diagram illustrating the semiconductor memory device 1 according to the present embodiment and is different from FIG. 2 described in the first embodiment in that the sequencer 16 generates a different control signal STB for each plane.

Specifically, as illustrated in FIG. 19, the sequencer 16 generates a control signal STB <0> for the sense amplifier module 11A and generates a control signal STB <1> for the sense amplifier module 11B. That is, the sequencer 16 according to the present embodiment can assert the control signal STB used for the read operation for each plane at different timings or can change assertion time. The other remaining configuration is the same as that illustrated in FIG. 2 in the first embodiment, and thus the description thereof will be omitted.

[2-2] Read Operation of Semiconductor Memory Device 1

Next, a read operation of the semiconductor memory device 1 will be described. In the read operation of the semiconductor memory device 1 according to the present embodiment, the sequencer 16 reads only data necessary to calculate desired page data by controlling the control signal STB for each plane. Specifically, the first read operation, the second read operation, and the third read operation according to the present embodiment are the same as the operations illustrated in FIGS. 20 to 22. Hereinafter, the details of the respective read operations will be described with reference to FIGS. 20 to 22.

Figure 20:
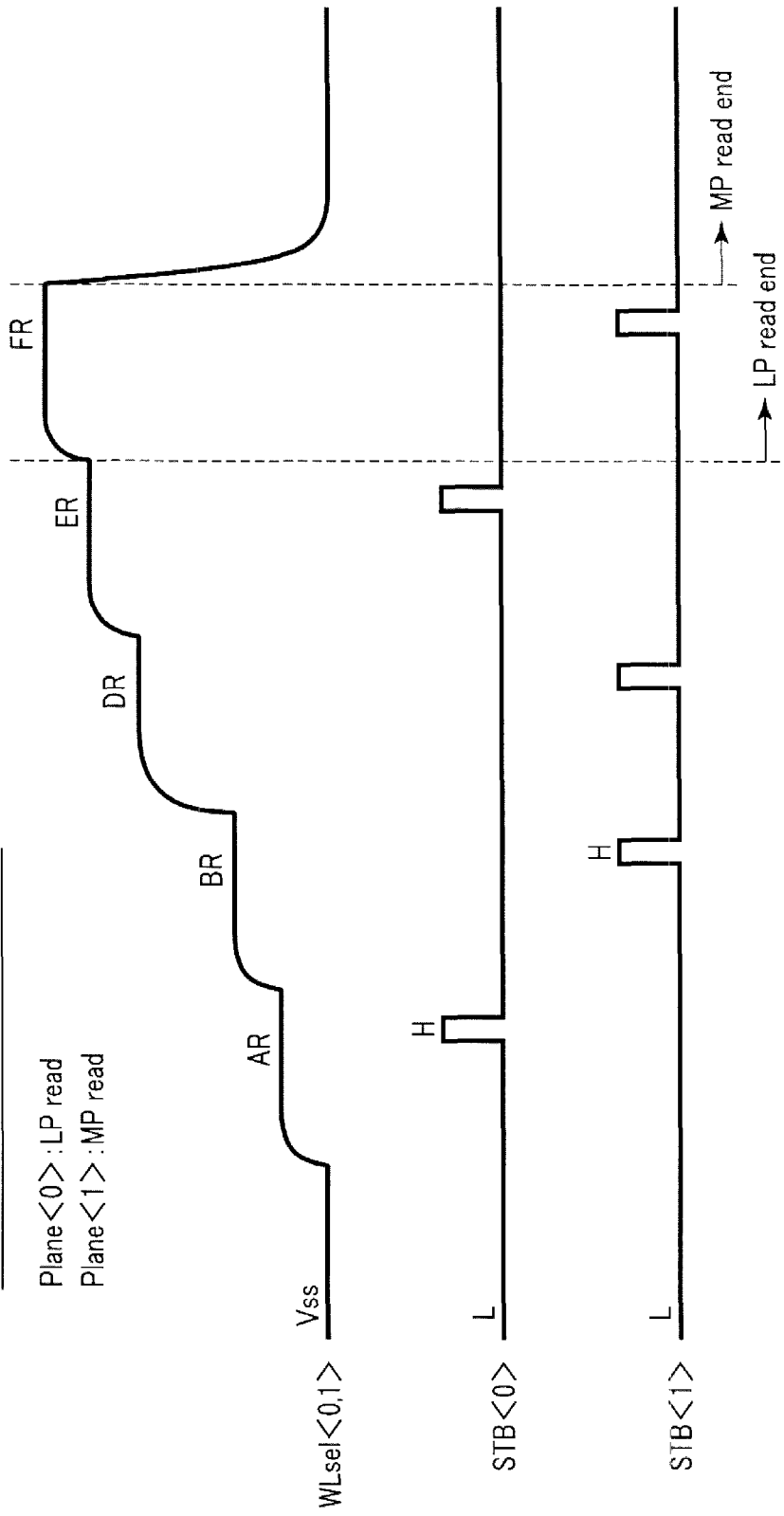
FIG. 20 is a waveform diagram illustrating a read operation in the memory system according to the second embodiment.

FIG. 20 corresponding to a first read operation illustrates an example of a case in which data of a lower page is read from the plane <0> and data of a middle page is read from the plane <1>. The waveforms of the selected word lines WLsel illustrated in FIG. 20 are the same as those illustrated in FIG. 10 described in the first embodiment.

As illustrated in FIG. 20, the sequencer 16 asserts the control signal STB <0> during application of the read voltages AR and ER corresponding to the lower page read to the selected word lines WLsel <0, 1>. The sequencer 16 asserts the control signal STB <1> during application of the read voltages BR, DR, and FR corresponding to the middle page read to the selected word lines WLsel <0, 1>.

Figure 21:
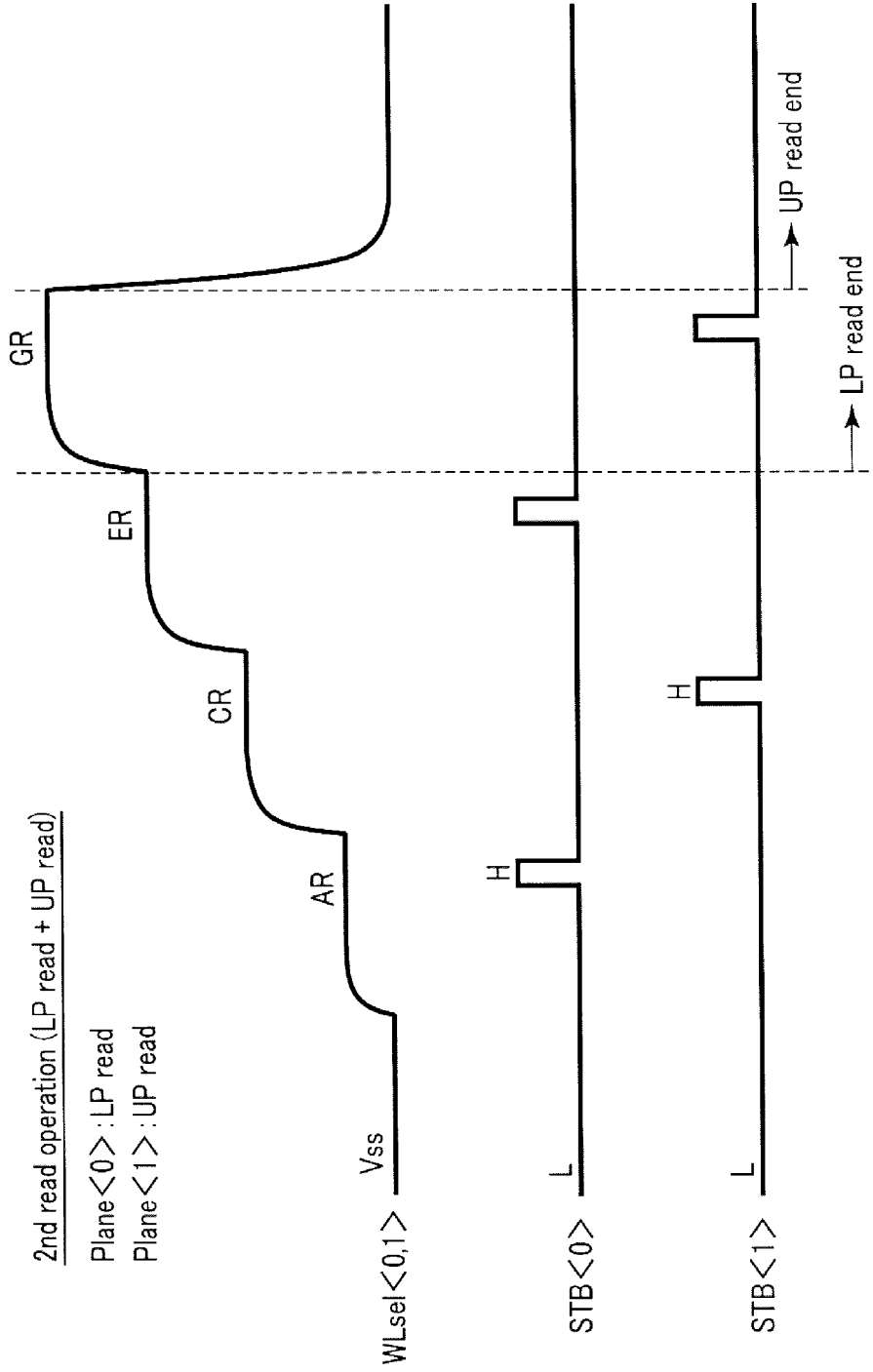
FIG. 21 is a waveform diagram illustrating a read operation in the memory system according to the second embodiment.

FIG. 21 corresponding to a second read operation illustrates an example of a case in which data of a lower page is read from the plane <0> and data of an upper page is read from the plane <1>. The waveforms of the selected word lines WLsel illustrated in FIG. 21 are the same as those illustrated in FIG. 11 described in the first embodiment.

As illustrated in FIG. 21, the sequencer 16 asserts the control signal STB<0> during application of the read voltages AR and ER corresponding to the lower page read to the selected word lines WLsel <0, 1>. The sequencer 16 asserts the control signal STB<1> during application of the read voltages CR and GR corresponding to the upper page read to the selected word lines WLsel <0, 1>.

FIG. 22 corresponding to a third read operation illustrates an example of a case in which data of a middle page is read from the plane <0> and data of an upper page is read from the plane <1>. The waveforms of the selected word lines WLsel illustrated in FIG. 22 are the same as those illustrated in FIG. 12 described in the first embodiment.

As illustrated in FIG. 22, the sequencer 16 asserts the control signal STB<0> during application of the read voltages BR, DR, and FR corresponding to the middle page read to the selected word lines WLsel <0, 1>. The sequencer 16 asserts the control signal STB<1> during application of the read voltages CR and GR corresponding to the upper page read to the selected word lines WLsel <0, 1>.

In the semiconductor memory device 1 according to the present embodiment, the sequencer 16 asserts the control signal STB during application of the read voltages corresponding to the page at the designated data level to the selected word lines WLsel for each plane. That is, the sense amplifier units SA of the sense amplifier modules 11A and 11B according to the present embodiment sense only data necessary to calculate the data levels designated in the planes <0> and <1>, respectively.

In the above description, the case in which only the data necessary for the calculation in each plane is read is illustrated, but embodiments are not limited thereto. For example, as in the first embodiment, data unnecessary for calculation to obtain desired data may be read and an operation may be executed so that the data is not used.

[2-3] Advantages of Second Embodiment

In the memory system 3 according to the present embodiment, it is possible to obtain the same advantages as those of the first embodiment. Hereinafter, the details of the advantages will be described.

The semiconductor memory device 1 in the memory system 3 according to the present embodiment controls the control signal STB used to instruct the sense amplifier module 11 of a timing at which the data read to each bit line BL is sensed for each plane.

Accordingly, the semiconductor memory device 1 according to the present embodiment can selectively take the data used to calculate each piece of page data in the multi-plane read in the sense amplifier modules 11.

For example, when the pieces of data of the lower page and the upper page are read from the planes <0> and <1> in the multi-plane read, the sequencer 16 asserts the control signal STB <0> corresponding to the plane <0> and does not assert the control signal STB <1> corresponding to the plane <1> during application of the voltages corresponding to the lower page read to the selected word lines WLse1. Similarly, during application of the voltages corresponding to the upper page read to the selected word lines WLse1, the sequencer 16 asserts the control signal STB <1> corresponding to the plane <1> and does not assert the control signal STB <0> corresponding to the plane <0>.

In this way, the semiconductor memory device 1 according to the present embodiment can execute the multi-plane read on the pages in which the data levels are different without reading unnecessary data not used to calculate the desired data levels.

The memory system 3 according to the present embodiment can execute the multi-plane read to read the pages at the different levels on the plurality of planes as in the first embodiment and can control the controller 2 more simply than in the first embodiment. Accordingly, the memory system 3 according to the present embodiment can improve a performance in the multi-plane operation and accelerate a read speed as in the first embodiment.

[3] Third Embodiment

Next, a semiconductor memory device 1 and a memory system 3 according to a third embodiment will be described. In the third embodiment, different threshold voltage levels are determined for each plane in parallel in the read operation of the semiconductor memory device 1 described in the first embodiment by controlling the voltages of the source lines for each plane. Hereinafter, differences from the first embodiment will be described.

[3-1] Configuration of Semiconductor Memory Device 1

Figure 23:
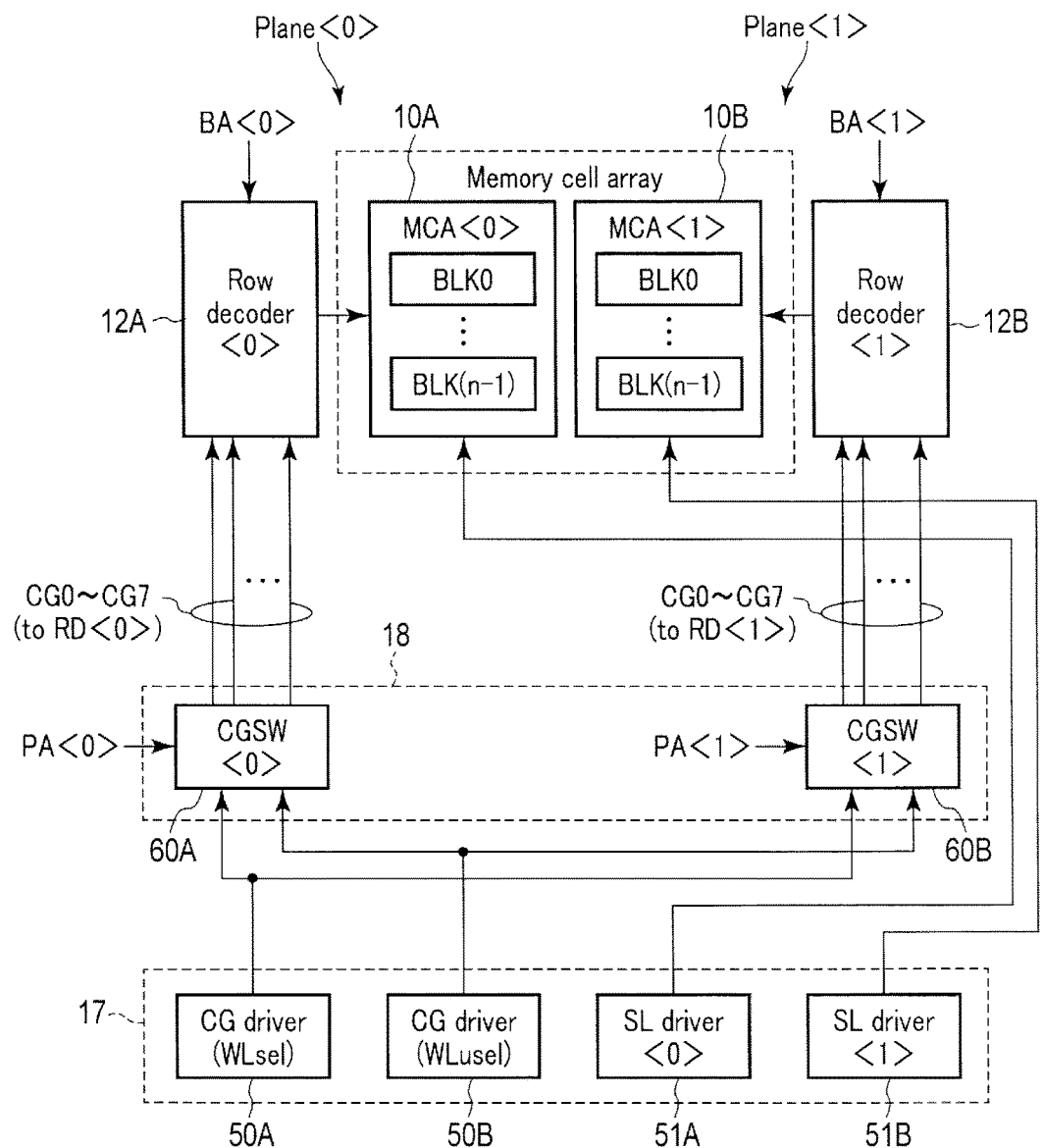
FIG. 23 is a circuit diagram illustrating a voltage generator and a plane switch included in a semiconductor memory device according to a third embodiment.

First, the configuration of the semiconductor memory device 1 will be described with reference to FIG. 23. FIG. 23 is a block diagram illustrating a voltage generator 17 according to the present embodiment and is different from FIG. 7 described in the first embodiment in that an SL driver 51 is provided for each plane.

Specifically, the voltage generator 17 illustrated in FIG. 23 includes SL drivers 51A and 51B. The SL driver 51A supplies voltages to source lines SL provided in the memory cell array 10A and the SL driver 51B supplies voltages to source lines SL provided in the memory cell array 10B. That is, the SL driver 51A is provided to correspond to the plane <0> and the SL driver 51B is provided to correspond to the plane <1>.

Accordingly, the voltage generator 17 according to the present embodiment can apply different voltages to the source lines SL for each plane in various operations. The other remaining configuration is the same as that described in the first embodiment, and thus the description thereof will be omitted.

[3-2] Read Operation of Semiconductor Memory Device 1

Next, a read operation of the semiconductor memory device 1 will be described. In the read operation of the semiconductor memory device 1 according to the present embodiment, the multi-plane read is executed to read the different data levels for each plane in a configuration in which the CG drivers 50 are shared between the plurality of planes, as in the first embodiment. Further, in the semiconductor memory device 1 according to the present embodiment, different threshold voltage levels for each plane are determined at one kind of read voltage to be applied to the selected word lines WLse1 of each plane by applying different voltages to the source lines SL of each plane using the plurality of SL drivers 51.

Figure 24:
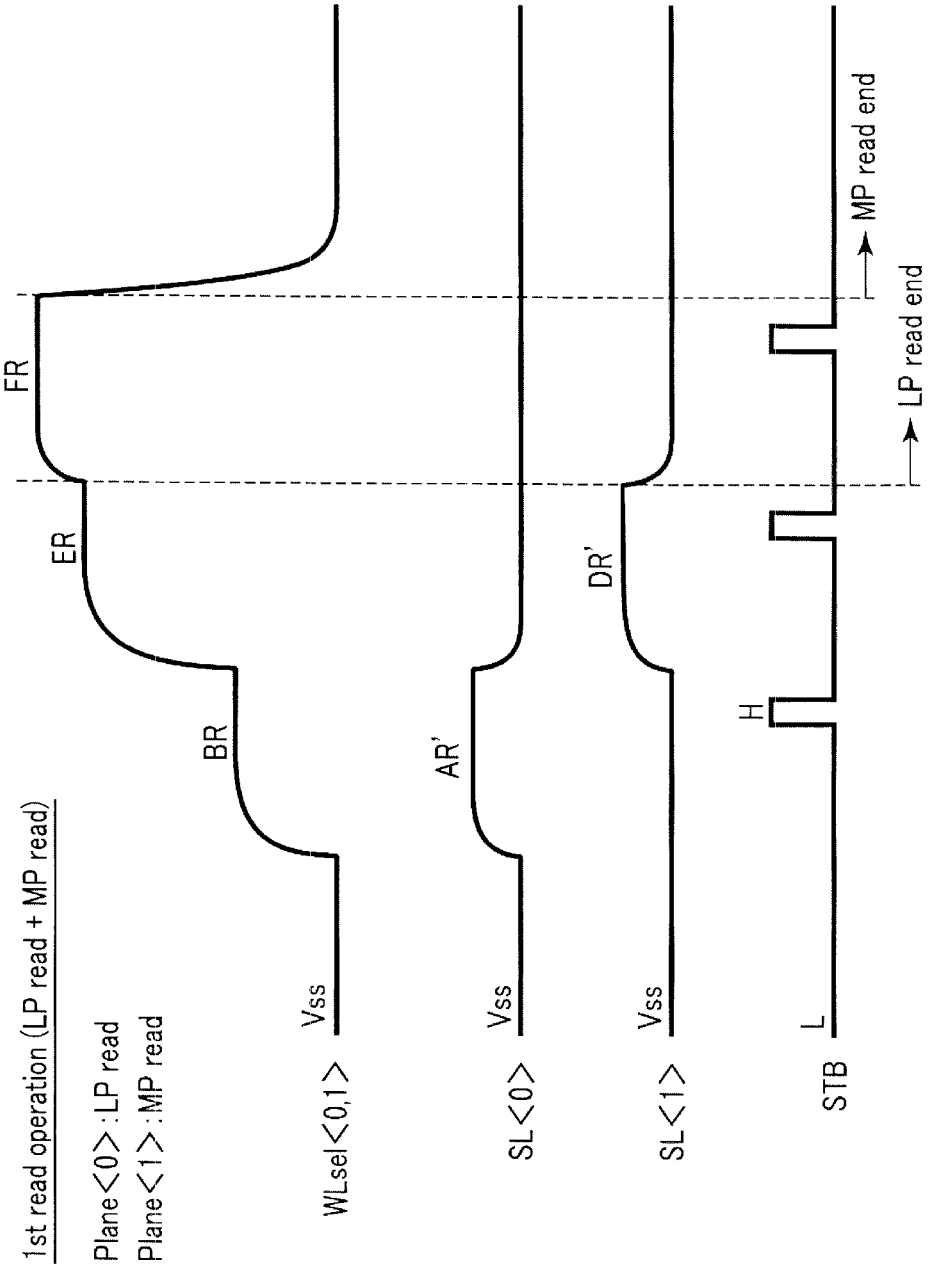
FIG. 24 is a waveform diagram illustrating a read operation in a memory system according to the third embodiment.
Figure 25:
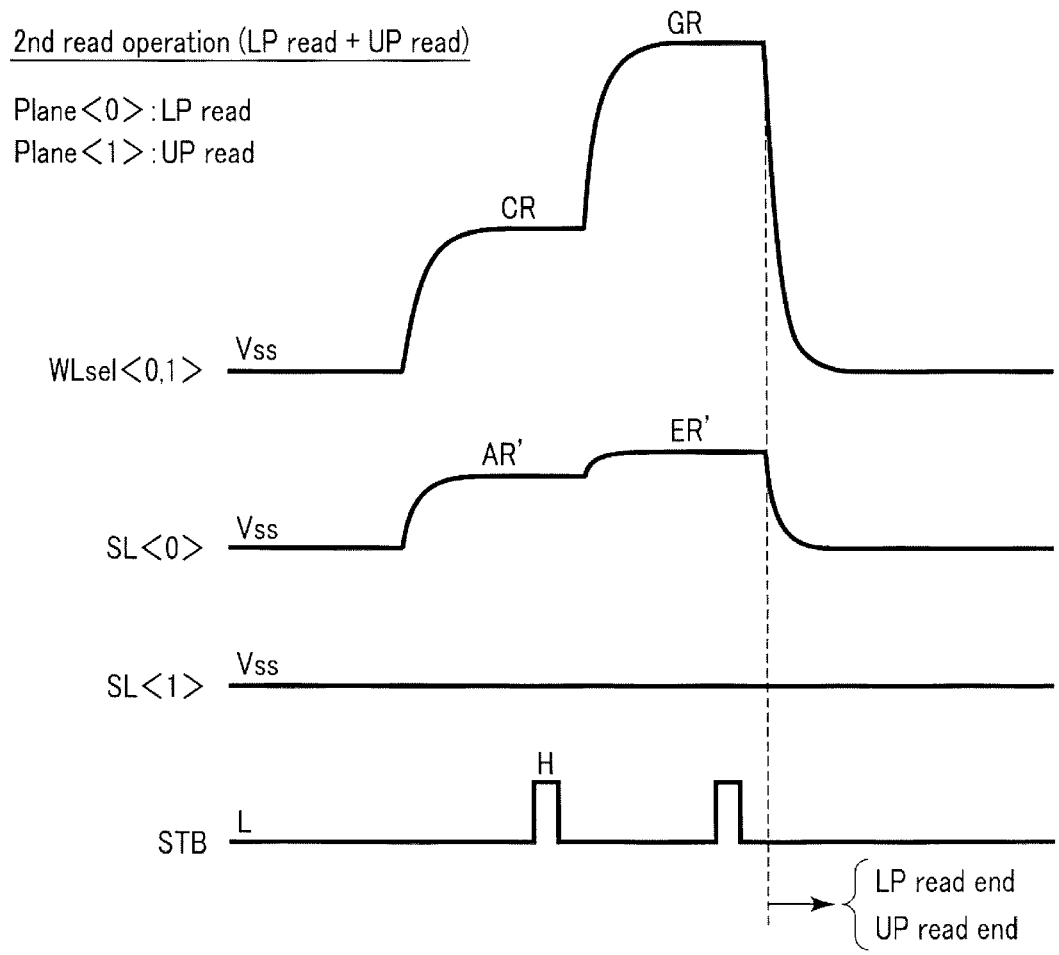
FIG. 25 is a waveform diagram illustrating a read operation in the memory system according to the third embodiment.
Figure 26:
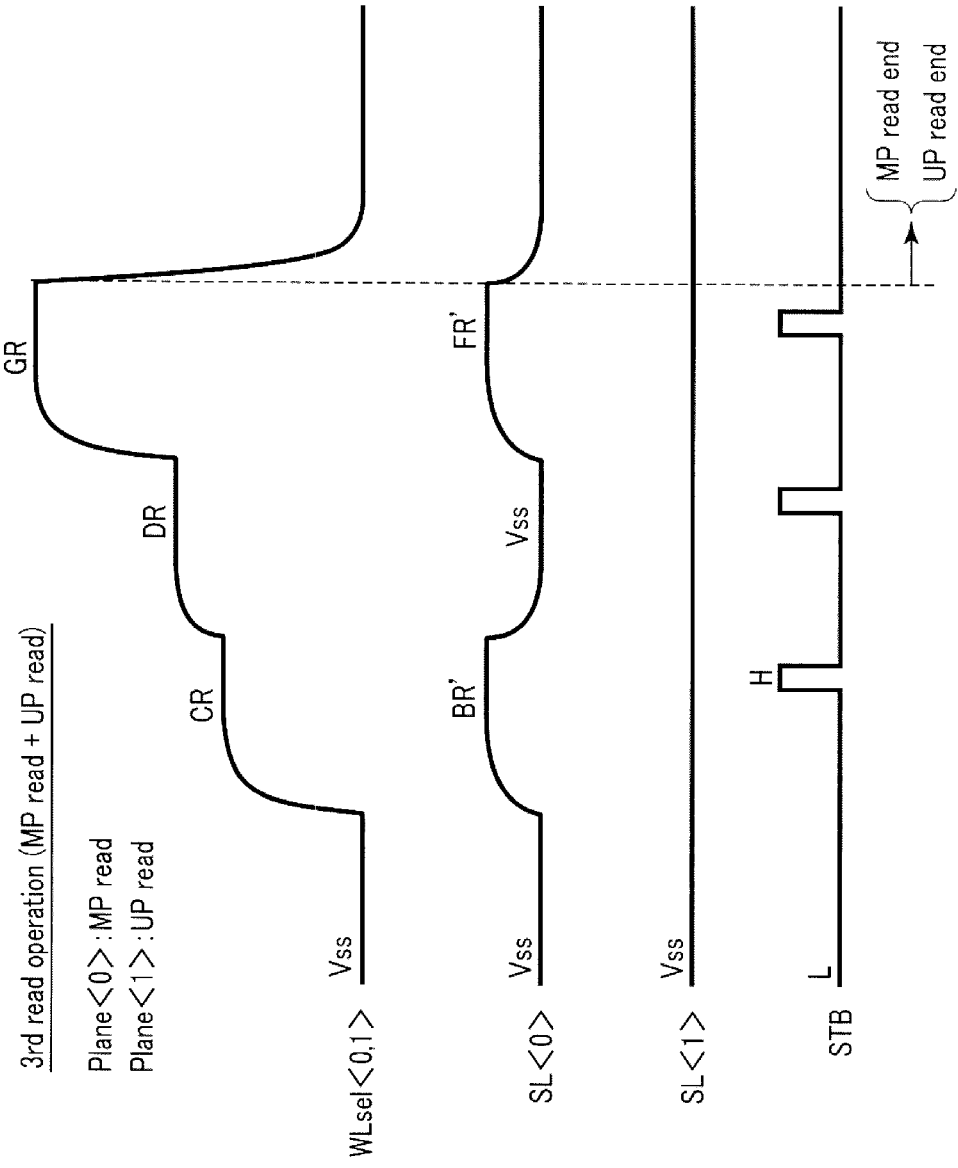
FIG. 26 is a waveform diagram illustrating a read operation in the memory system according to the third embodiment.

Specifically, the first read operation, the second read operation, and the third read operation according to the present embodiment are the same as the operations illustrated in FIGS. 24 to 26. Hereinafter, the details of the first to third read operations will be described with reference to FIGS. 24 to 26.

FIG. 24 corresponding to a first read operation illustrates an example of a case in which data of a lower page is read from the plane <0> and data of a middle page is read from the plane <1>.

As illustrated in FIG. 24, the row decoders 12A and 12B each apply the read voltages BR, ER, and FR to the selected word lines WLse1 <0, 1> in order.

The SL driver 51A applies a voltage AR' to the source line <0> during the application of the voltage BR to the selected word lines WLse1 <0, 1> and applies a voltage Vss during the application of the voltages ER and FR to the selected word lines WLse1 <0, 1>. The voltage AR' is set so that a difference from the voltage BR is the voltage AR, and a potential difference between the gate and the channel of the memory cell selected in the plane <0> is accordingly the voltage AR.

The SL driver 51B applies a voltage DR' to the source line <1> during the application of the voltage ER to the selected word lines WLse1 <0, 1> and applies the voltage Vss during the application of the voltages BR and FR to the selected word lines WLse1 <0, 1>. The voltage DR' is set so that a difference from the voltage ER is the voltage DR, and a potential difference between the gate and channel of the memory cell selected in the plane <1> is accordingly the voltage DR.

The sequencer 16 first asserts the control signal STB during the application of the read voltage BR to the selected word lines WLse1 <0, 1>. Then, in the memory cell selected in the plane <0>, a threshold voltage is determined by the voltage AR. In the memory cell selected in the plane <1>, the threshold voltage is determined by the voltage BR.

Next, the sequencer 16 asserts the control signal STB during the application of the read voltage ER to the selected word lines WLse1 <0, 1>. Then, in the memory cell selected in the plane <0>, a threshold voltage is determined by the voltage ER. In the memory cell selected in the plane <1>, the threshold voltage is determined by the voltage DR. Here, calculation of the lower page is executed from the determination result of the threshold voltage by the voltages AR and ER, and the lower page read ends.

Next, the sequencer 16 asserts the control signal STB during the application of the read voltage FR to the selected word lines WLse1 <0, 1>. Then, in the memory cell selected in the plane <0>, a threshold voltage is determined by the voltage FR. In the memory cell selected in the plane <1>, the threshold voltage is determined by the voltage FR. Here, calculation of the middle page is executed from the determination result of the threshold voltage by the voltages BR, DR, and FR, and the middle page read ends. At this time, the data read in the plane <0> is not used for the calculation.

In this way, in the first read operation according to the present embodiment, the pieces of data of the lower page and the middle page can be obtained at three kinds of read voltages applied to the selected word lines WLse1.

FIG. 25 corresponding to a second read operation illustrates an example of a case in which data of a lower page is read from the plane <0> and data of an upper page is read from the plane <1>.

As illustrated in FIG. 25, the row decoders 12A and 12B each apply the read voltages CR and GR to the selected word lines WLse1 <0, 1> in order.

The SL driver 51A applies the voltage AR' to the source line <0> during the application of the voltage CR to the selected word lines WLse1 <0, 1> and applies a voltage ER' during the application of the voltage GR to the selected word lines WLse1 <0, 1>. The voltage AR' is set so that a difference from the voltage CR is the voltage AR, and a potential difference between the gate and the channel of the memory cell selected in the plane <0> is accordingly the voltage AR. The voltage ER' is set so that a difference from the voltage GR is the voltage ER, and a potential difference between the gate and the channel of the memory cell selected in the plane <0> is accordingly the voltage ER.

The SL driver 51B applies the voltage Vss to the source line <1> during the application of the voltages CR and GR to the selected word lines WLse1 <0, 1>.

The sequencer 16 first asserts the control signal STB during the application of the read voltages CR and GR to the selected word lines WLse1 <0, 1>.

Next, the sequencer 16 asserts the control signal STB during the application of the read voltage BR to the selected word lines WLse1 <0, 1>. Then, in the memory cell selected in the plane <0>, the threshold voltage is determined by the voltage AR. In the memory cell selected in the plane <1>, the threshold voltage is determined by the voltage CR.

Next, the sequencer 16 asserts the control signal STB during the application of the read voltage ER to the selected word lines WLse1 <0, 1>. Then, in the memory cell selected in the plane <0>, the threshold voltage is determined by the voltage ER. In the memory cell selected in the plane <1>, the threshold voltage is determined by the voltage GR. Here, calculation of the lower page is executed from the determination result of the threshold voltage by the voltages AR and ER, and the lower page read ends. Calculation of the upper page is executed from the determination result of the threshold voltage by the voltages CR and GR, and the upper page read ends.

In this way, in the second read operation according to the present embodiment, the pieces of data of the lower page and the upper page can be obtained at two kinds of read voltages applied to the selected word lines WLse1.

FIG. 26 corresponding to a third read operation illustrates an example of a case in which data of a middle page is read from the plane <0> and data of an upper page is read from the plane <1>.

As illustrated in FIG. 26, the row decoders 12A and 12B each apply the read voltages CR, DR, and GR to the selected word lines WLse1 <0, 1> in order.

The SL driver 51A applies a voltage BR' to the source line <0> during the application of the voltage CR to the selected word lines WLse1 <0, 1>, applies the voltage Vss during the application of the voltage DR to the selected word lines WLse1 <0, 1>, and applies a voltage FR' during the application of the voltage GR to the selected word lines WLse1 <0, 1>. The voltage BR' is set so that a difference from the voltage CR is the voltage AR, and a potential difference between the gate and the channel of the memory cell selected in the plane <0> is accordingly the voltage AR. The voltage FR' is set so that a difference from the voltage GR is the voltage FR, and a potential difference between the gate and the channel of the memory cell selected in the plane <0> is accordingly the voltage FR.

The SL driver 51B applies the voltage Vss to the source line <1> during the application of the voltages CR, DR, and GR to the selected word lines WLse1 <0, 1>.

The sequencer 16 first asserts the control signal STB during the application of the read voltage CR to the selected word lines WLse1 <0, 1>. Then, in the memory cell selected in the plane <0>, the threshold voltage is determined by the voltage BR. In the memory cell selected in the plane <1>, the threshold voltage is determined by the voltage CR.

Next, the sequencer 16 asserts the control signal STB during the application of the read voltage DR to the selected word lines WLse1 <0, 1>. Then, in the memory cell selected in the planes <0> and <1>, the threshold voltage is determined by the voltage DR. At this time, the data read in the plane <0> is not used for the calculation.

Next, the sequencer 16 asserts the control signal STB during the application of the read voltage GR to the selected word lines WLse1 <0, 1>. Then, in the memory cell selected in the plane <0>, a threshold voltage is determined by the voltage FR. In the memory cell selected in the plane <1>, the threshold voltage is determined by the voltage GR. Here, calculation of the middle page is executed from the determination result of the threshold voltage by the voltages BR and FR, and the middle page read ends. Calculation of the upper page is executed based on the determination result of the threshold voltage by the voltages CR and GR, and the upper page read ends.

In this way, in the third read operation according to the present embodiment, the pieces of data of the middle page and the upper page can be obtained at three kinds of read voltages applied to the selected word lines WLse1.

In the read operation of the semiconductor memory device 1 according to the present embodiment, by applying the voltage of the source line SL at a desired timing and magnitude, the different threshold voltage is determined for plane when the sequencer 16 asserts the control signal STB once.

Figure 27:
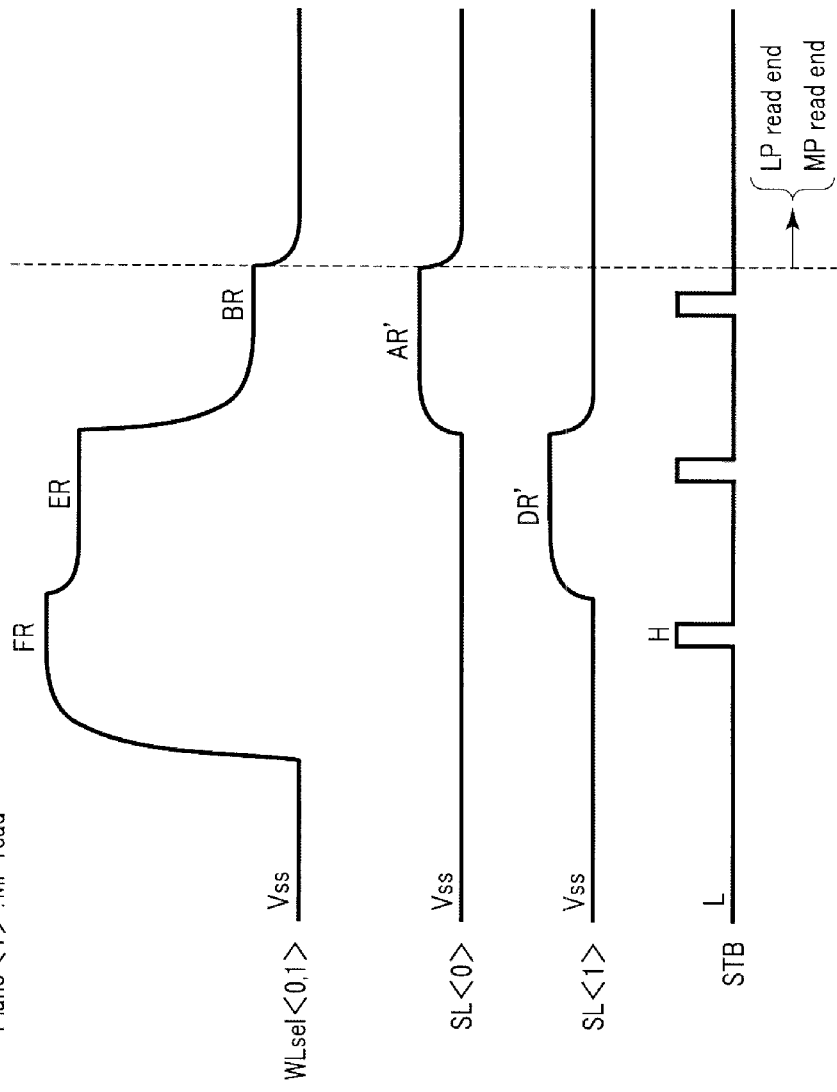
FIG. 27 is a waveform diagram illustrating a read operation in the memory system according to the third embodiment.

The semiconductor memory device 1 may apply the voltages in the order illustrated in FIG. 27 when the lower page read is necessary in one of the planes and the middle page read is necessary in the other plane. In the operation illustrated in FIG. 27, an order in which the read voltages are applied to the selected word lines WLse1 is reversed to the order of the first read operation illustrated in FIG. 24, and voltages to be applied to the source lines SL are changed in conformity to the reversal of the order.

Specifically, as illustrated in FIG. 27, the read voltages FR, ER, and BR are applied to the selected word lines WLse1 in this order, a voltage DR' is applied to the source line SL <1> during application of the voltage ER to the word line WLse1 <0, 1>, and the voltage AR' is applied to the source line SL <0> during the application of the voltage BR to the word line WLse1 <0, 1>. When the data illustrated in FIG. 4 is to be read, the middle page read ends earlier than the lower page read, as illustrated in FIG. 27. In the second and third read operations, an order in which the read voltages are applied to the selected word lines WLse1 is reversed to the order of the read voltages illustrated in FIGS. 25 and 26, and voltages to be applied to the source lines SL are changed in conformity to the reversal of the order.

The kinds of read voltages to be applied to the selected word lines WLse1 in the first to third read operations are determined based on data levels of pages read from the plurality of planes. For example, in the case of the first read operation, two kinds of pieces of data are used for determination in reading of the lower page and three kinds of pieces of data are used for determination in reading of the middle page. Therefore, a minimum of three kinds of read voltages is necessary as voltages to be applied to the selected word lines WLse1.

[3-3] Advantages of Third Embodiment

In the memory system 3 according to the present embodiment, it is possible to obtain the same advantages as those of the first embodiment and it is possible to accelerate the operations more than in the first embodiment. Hereinafter, the details of the advantages will be described.

In the read operation of the memory system 3 according to the present embodiment, the semiconductor memory device 1 controls the voltages to be applied to the source lines SL for each plane by using the plurality of SL drivers 51.

Accordingly, the semiconductor memory device 1 according to the present embodiment can determine different thresholds in regard to the memory cells selected for each plane even when the voltages to be applied to the selected word lines WLse1 are the same in the multi-plane read.

For example, when the data of the lower page is read in the plane <0> and the data of the upper page is read in the plane <1> in the multi-plane read, the SL driver 51A applies, for example, the voltage Vss to the source line SL corresponding to the plane <0> during the application of the voltages corresponding to the lower page read to the selected word lines WLse1. On the other hand, the SL driver 51A applies a voltage in which a difference from the voltage applied to the selected word lines WLse1 is a potential difference corresponding to the upper page read, to the source line SL corresponding to the plane <1>.

In this way, the semiconductor memory device 1 according to the present embodiment can adjust a potential difference between the gate and the channel of the memory cell in each plane to a desired voltage corresponding to a threshold voltage desired to be determined in each plane by applying the voltage of the source line SL at a desired timing and magnitude, even when the voltages to be applied to the word lines WLse1 are the same in each plane. Since the thresholds corresponding to the different data levels can be simultaneously determined, it is possible to reduce the kinds of read voltages to be applied to the word lines WLse1.

The memory system 3 according to the present embodiment can execute the multi-plane read to read the pages at the different levels in the plurality of planes, as in the first embodiment, and can shorten a read time more than in the first embodiment. Accordingly, the memory system 3 according to the present embodiment can improve a performance in the multi-plane operation further than in the first embodiment and accelerate a read speed.

In the first to third read operations described in the present embodiment, the voltages applied to the selected word lines WLse1 and the source lines SL are merely examples and an embodiment is not limited thereto. Diverse variations of the present embodiment are considered. By adjusting the voltages to be applied to the selected word lines WLse1 and the source lines SL of each plane, it is possible to determine a desired threshold voltage for each plane.

[4] Fourth Embodiment

Next, a semiconductor memory device 1 and a memory system 3 according to a fourth embodiment will be described. In the fourth embodiment, unnecessary data is not read in the read operation of the semiconductor memory device 1 described in the third embodiment by controlling the control signal STB for each plane by the sequencer 16. Hereinafter, differences between the first to third embodiments will be described.

[4-1] Read Operation of Semiconductor Memory Device 1

First, a read operation of the semiconductor memory device 1 will be described. In the read operation of the semiconductor memory device 1 according to the present embodiment, the control signal STB is controlled for each plane and a plurality of SL drivers 51 are used to apply different voltages to the source lines SL for each plane. Accordingly, the semiconductor memory device 1 achieves determination of different threshold voltage levels for each plane at one kind of read voltage to be applied to the selected word lines WLse1 of each plane and reads only data necessary to calculate desired page data.

Figure 28:
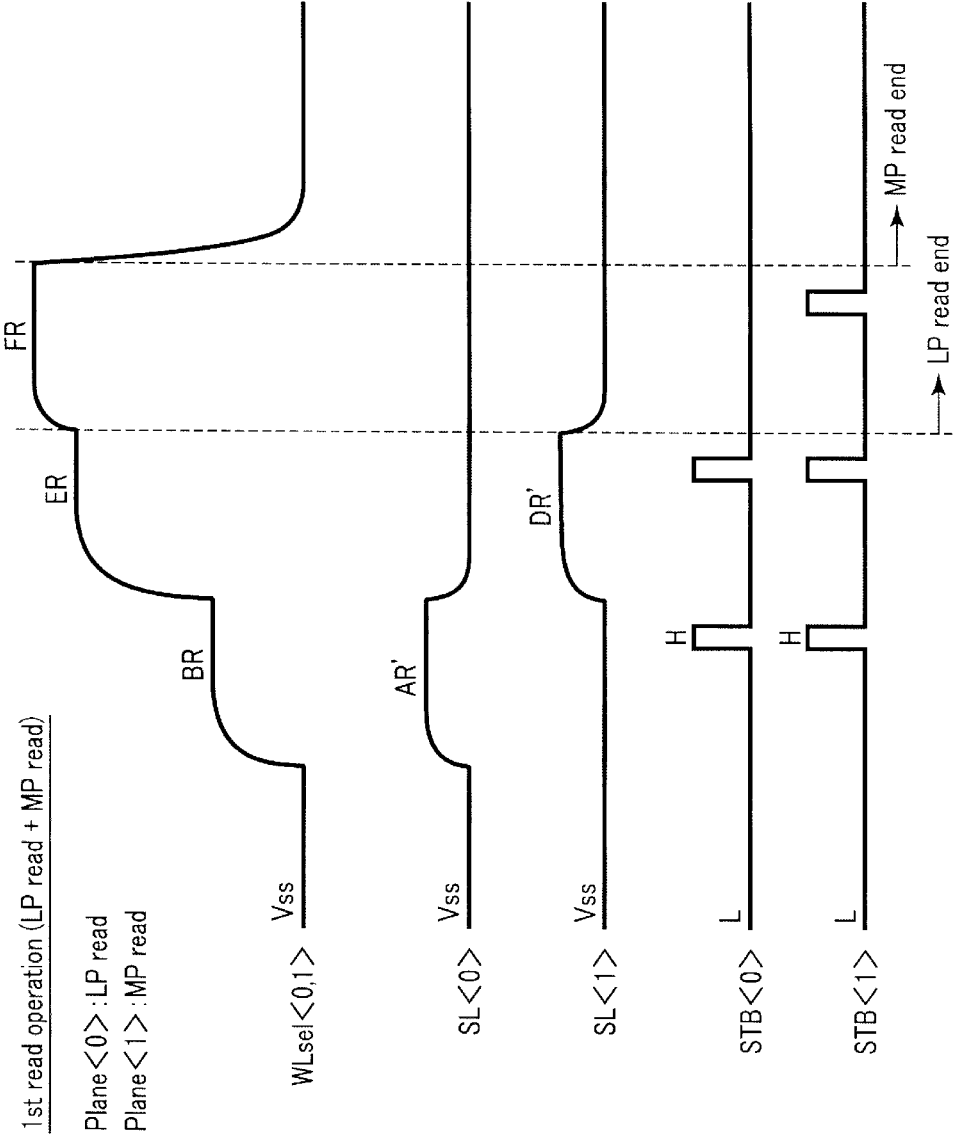
FIG. 28 is a waveform diagram illustrating a read operation in a memory system according to a fourth embodiment.
Figure 29:
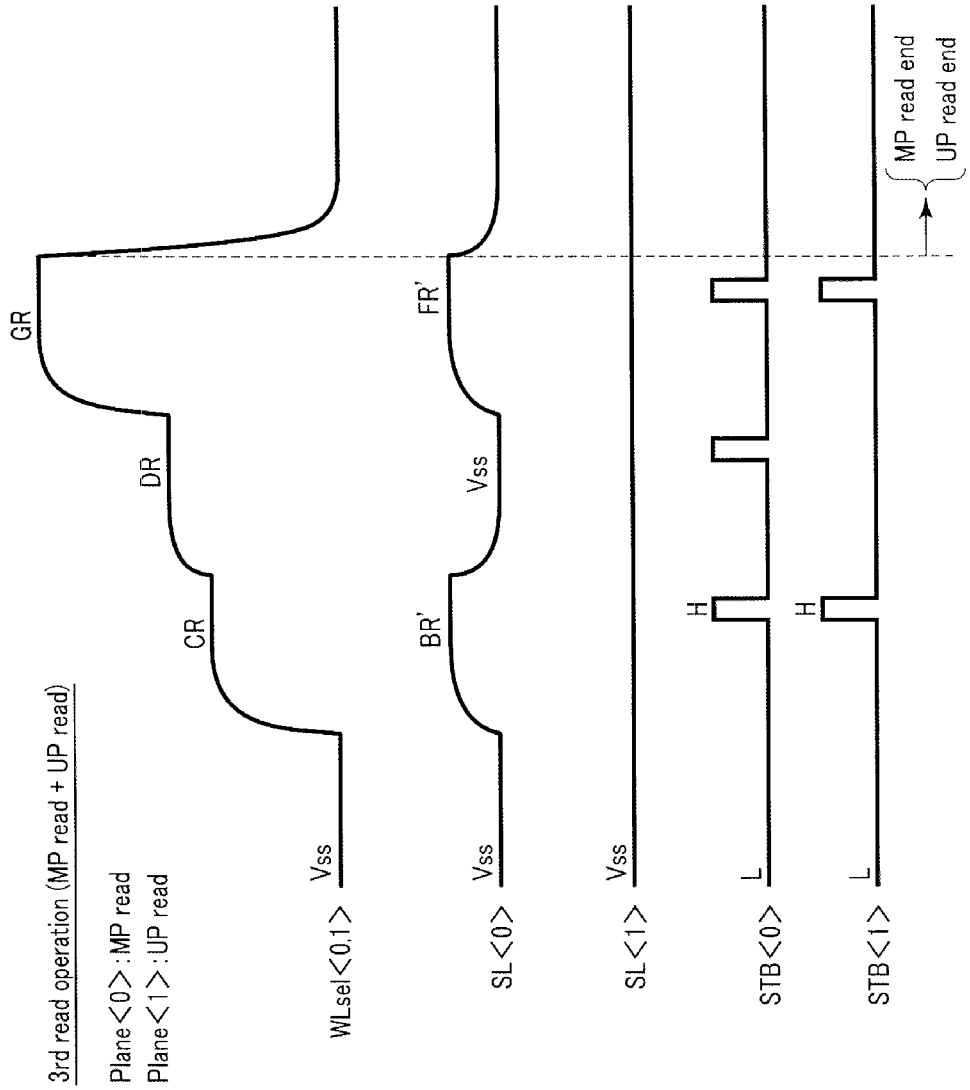
FIG. 29 is a waveform diagram illustrating a read operation in the memory system according to the fourth embodiment.

Specifically, the first and third read operations according to the present embodiment are the same operation, as illustrated in FIGS. 28 and 29. Hereinafter, the details of the first and third read operations will be described with reference to FIGS. 28 and 29.

FIG. 28 corresponding to a first read operation illustrates an example of a case in which data of a lower page is read from the plane <0> and data of a middle page is read from the plane <1>. The waveforms of the selected word lines WLse1 and the source lines SL illustrated in FIG. 28 are the same as those illustrated in FIG. 24 described in the third embodiment.

As illustrated in FIG. 28, the sequencer 16 asserts the control signal STB <0> during application of the read voltages AR and ER corresponding to the lower page read to the selected word lines WLse1 <0, 1>. The sequencer 16 asserts the control signal STB <1> during application of the read voltages BR, DR, and FR corresponding to the middle page read to the selected word lines WLse1 <0, 1>.

FIG. 29 corresponding to a third read operation illustrates an example of a case in which data of a middle page is read from the plane <0> and data of an upper page is read from the plane <1>. The waveforms of the selected word lines WLse1 and the source lines SL illustrated in FIG. 29 are the same as those illustrated in FIG. 26 described in the third embodiment.

As illustrated in FIG. 29, the sequencer 16 asserts the control signal STB<0> during application of the read voltages BR, DR and FR corresponding to the middle page read to the selected word lines WLse1 <0, 1>. The sequencer 16 asserts the control signal STB<1> during application of the read voltages CR and GR corresponding to the upper page read to the selected word lines WLse1 <0, 1>.

In the semiconductor memory device 1 according to the present embodiment, the sequencer 16 asserts the control signal STB during application of the read voltages corresponding to the page at the designated data level to the selected word lines WLse1 for each plane. That is, the sense amplifier modules 11A and 11B according to the present embodiment sense only data necessary to calculate the data levels designated in the planes <0> and <1>, respectively.

In the above description, the case in which only the data necessary for the calculation in each plane is read is illustrated, but embodiments are not limited thereto. For example, as in the third embodiment, data unnecessary for calculation to obtain desired data may be read and an operation may be executed so that the data is not used.

[4-2] Advantages of Fourth Embodiment

In the memory system 3 according to the present embodiment, it is possible to obtain the same advantages as those of the third embodiment. Hereinafter, the details of the advantages will be described.

In the semiconductor memory device 1 in the memory system 3 according to the present embodiment, voltages to be applied to the source lines SL are controlled for each plane and the control signal STB is controlled for each plane.

Accordingly, the semiconductor memory device 1 according to the present embodiment can selectively take in the data used to calculate each piece of page data in the multi-plane read in the sense amplifier modules 11. Further, even when the voltages to be applied to the selected word lines WLsel are the same, it is possible to determine different threshold voltage levels.

The memory system 3 according to the present embodiment can execute the multi-plane read as in the third embodiment and can control the controller 2 more simply than in the third embodiment. That is, the memory system 3 according to the present embodiment corresponds to application of the second embodiment to the third embodiment. Accordingly, the memory system 3 according to the present embodiment can improve a performance in the multi-plane operation and accelerate a read speed as in the third embodiment.

[5] Fifth Embodiment

Next, a semiconductor memory device 1 and a memory system 3 according to a fifth embodiment will be described. In the fifth embodiment, sequential reading is simultaneously executed on a plurality of planes in the configuration of the semiconductor memory device 1 described in the foregoing first embodiment. Hereinafter, differences between the first to fourth embodiments will be described.

[5-1] Operation

[5-1-1] Read Operation of Semiconductor Memory Device 1

First, a read operation of the semiconductor memory device 1 will be described. In the read operation of the semiconductor memory device 1 according to the present embodiment, data is output from a page in which read data is determined in multi-plane read in which the sequential reading is executed on a plurality of planes. In the following description, such a read operation is referred to as a fourth read operation.

Figure 30:
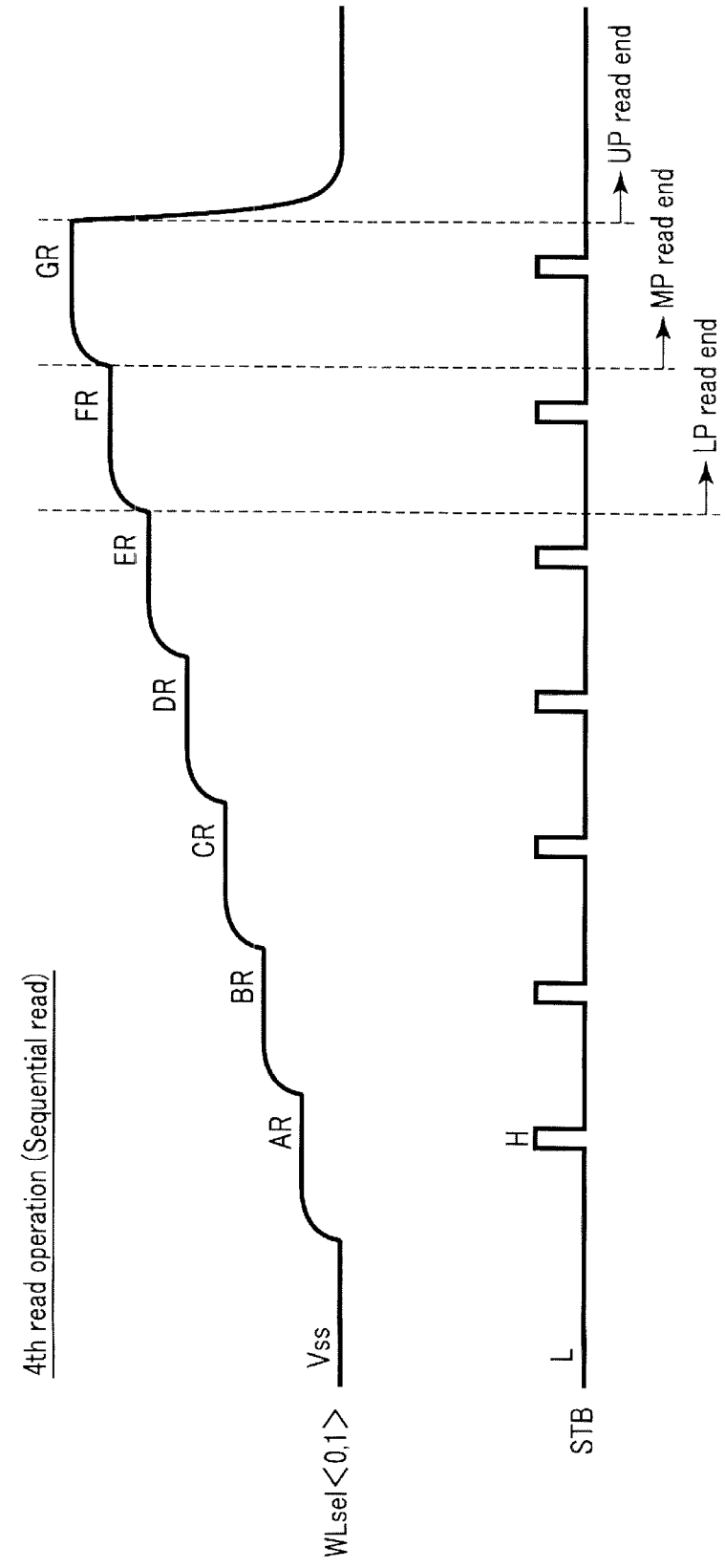
FIG. 30 is a waveform diagram illustrating a read operation in a memory system according to a fifth embodiment.

Examples of waveforms corresponding to the fourth read operation are illustrated in FIG. 30. FIG. 30 illustrates an example of a case in which the sequential reading is executed in the planes <0> and <1> in the TLC scheme and illustrates waveforms of a control signal STB and voltages to be applied to the selected word lines WLsel <0> and <1> corresponding to the planes <0> and <1> in each read operation.

As illustrated in FIG. 30, the row decoders 12A and 12B apply read voltages AR, BR, CR, DR, ER, FR, and GR to the selected word lines WLsel <0, 1> in order. In this example, of the read voltages, the voltages AR and ER correspond to the lower page read, the voltages BR, DR, and FR correspond to the middle page read, and the voltages CR and GR correspond to the upper page read.

The sequencer 16 asserts each control signal STB during application of each read voltage to the selected word line WLsel. Then, each sense amplifier unit SAU determines data to be read to the bit line BL corresponding to a timing at which the signal STB is asserted and retains the data in the latch circuit SDL.

In this way, the read data read by each read voltage and retained in the latch circuit SDL is transmitted to other latch circuits. As the latch circuits included in the sense amplifier unit SAU according to the present embodiment, for example, seven latch circuits are provided to retain all of the pieces of read data used to calculate the data levels in addition to the sense latch circuit SDL and the data transmission latch circuit XDL. The number of latch circuits is not limited thereto. For example, by executing calculation during the read operation, it is possible to suppress the number of necessary latch circuits.

In this example, the lower page read ends at a timing at which the calculation ends after the reading of the data by the voltage ER ends, the middle page read ends at a timing at which the calculation ends after the reading of the data by the voltage FR ends, and the upper page read ends at a timing at which the calculation ends after the reading of the data by the voltage FR ends.

The determined data of each page is transmitted to, for example, the latch circuit XDL along with the end of the calculation corresponding to the page and the semiconductor memory device 1 enters a waiting state of the data output command from the controller 2. Each sense amplifier module 11 transmits the data to the latch circuit XDL at a subsequent output level, for example, in response to the output of the data from the latch circuit XDL. The timing at which the data determined by the sense amplifier module 11 is transmitted to the latch circuit XDL is not limited thereto. The data may be started to be transmitted after a reply to the data output command from the controller 2 is given.

In the read operation of the semiconductor memory device 1 according to the present embodiment, the sequential reading of a plurality of planes is executed in parallel. Then, the semiconductor memory device 1 starts calculation whenever data necessary to calculate the data of each page is arranged, and thus advances the determination timing of the data in a case in which the data is determined at a low voltage.

Figure 31:
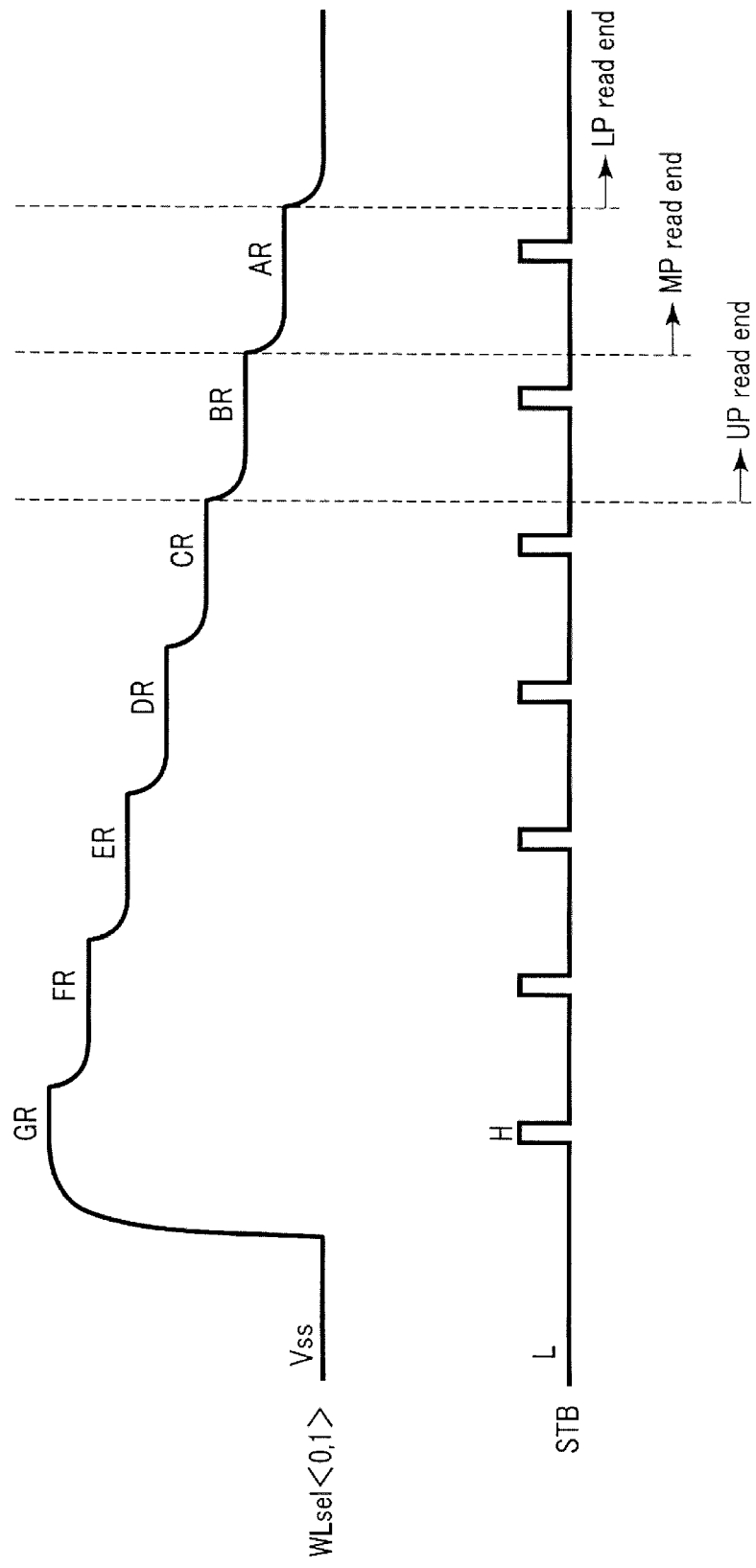
FIG. 31 is a waveform diagram illustrating a read operation in the memory system according to the fifth embodiment.

The semiconductor memory device 1 may apply the voltages in the order illustrated in FIG. 31 in the multi-plane read in which the sequential reading is executed in the plurality of planes. In the operation illustrated in FIG. 31, an order at which the read voltages are applied to the selected word lines WLsel is reversed to the order of the fourth read operation illustrated in FIG. 30.

Specifically, as illustrated in FIG. 31, the read voltages GR, FR, ER, DR, CR, BR, and AR are applied in this order to the selected word lines WLsel and the control signal STB is asserted during the application of the read voltages. When the data illustrated in FIG. 4 is to be read, the data is determined in the order of the upper page, the middle page, and the lower page, as illustrated in FIG. 31.

[5-1-2] Read Operation of Memory System 3

Next, the read operation of the memory system 3 will be described. In the read operation of the memory system 3 according to the present embodiment, the controller 2 instructs the semiconductor memory device 1 including the plurality of planes to execute the multi-plane read in which data of a plurality of bits stored in the memory cell connected to a common word line is read. Then, the semiconductor memory device 1 outputs the data read through the multi-plane read in order from the page in which the read data is determined in response to an instruction of the controller 2.

Figure 32:
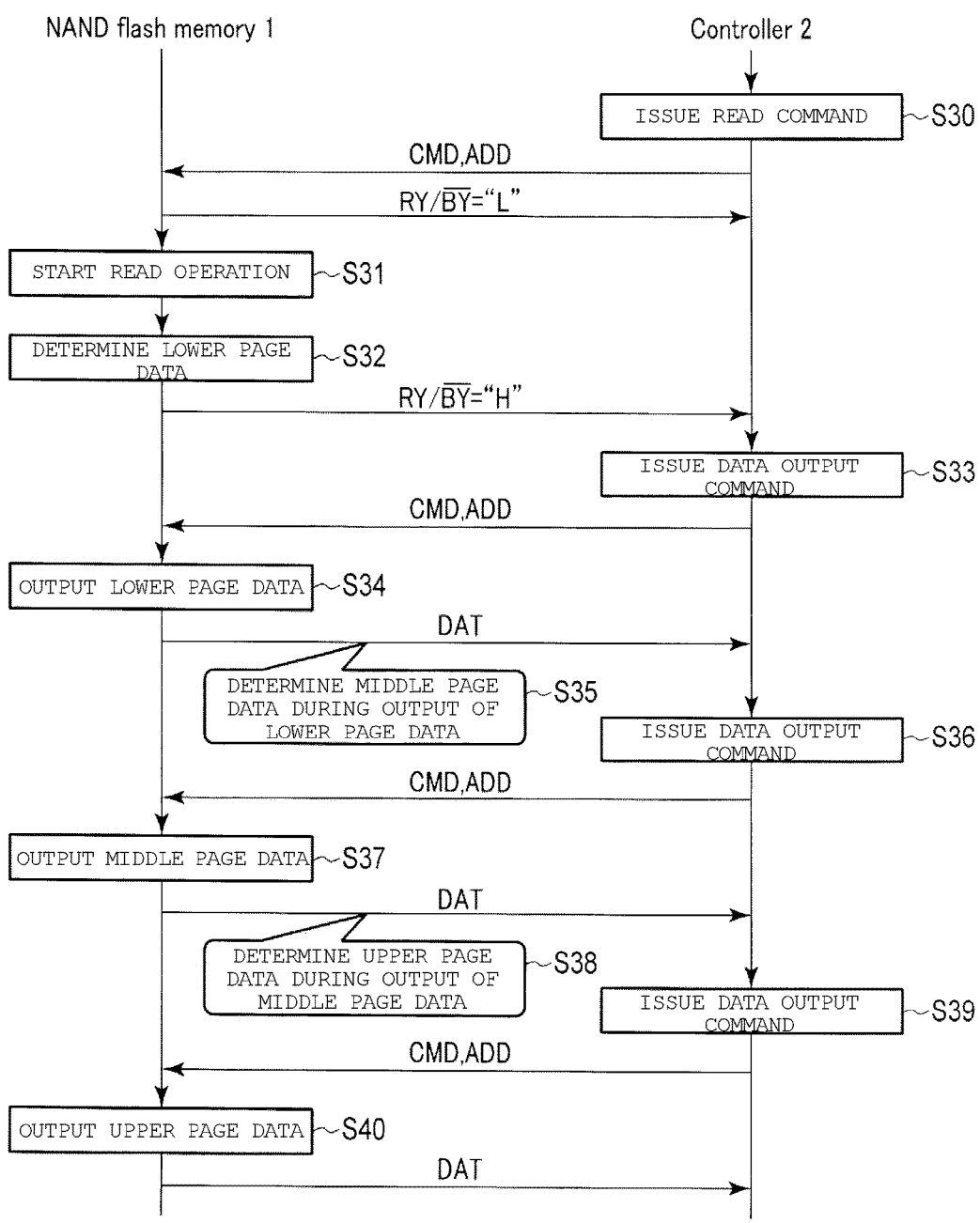
FIG. 32 is a flowchart illustrating the read operation in the memory system according to the fifth embodiment.

Hereinafter, an example of the read operation of the memory system 3 will be described with reference to FIG. 32. FIG. 32 is a flowchart illustrating an example of the read operation of the memory system 3.

As illustrated in FIG. 32, the controller 2 first issues a read command (the command CMD and the address information ADD) to transmit the read command to the semiconductor memory device 1 (step S30). The read command is used to give an instruction of the sequential reading in regard to the planes <0, 1>. The semiconductor memory device 1 that has received the read command from the controller 2 sets the ready/busy signal from an "H" level to an "L" level and starts the read operation (step S31). The read operation in step S31 corresponds to the read operation of the semiconductor memory device 1 described in section [5-1-1].

Next, when the semiconductor memory device 1 detects that the data of the lower page is determined (step S32), the semiconductor memory device 1 sets the ready/busy signal from the "L" level to the "H" level. Then, the controller 2 detecting that the semiconductor memory device 1 enters the ready state issues a data output command to output the data of the lower page in which the read data is determined (step S33) to transmit the data output command to the semiconductor memory device 1.

Then, the semiconductor memory device 1 that has received the data output command from the controller 2 outputs the data DAT of the lower page to the controller 2 (step S34). When the data of the middle page is determined during the output of the data DAT (step S35), the semiconductor memory device 1 maintains the ready/busy signal at the "H" level.

When the controller 2 confirms that the semiconductor memory device 1 maintains the ready state at the time of ending of the data output of the middle page in step S34, the controller 2 issues the data output command corresponding to the middle page (step S36) to transmit the data output command to the semiconductor memory device 1.

Then, the semiconductor memory device 1 that has received the data output command from the controller 2 outputs the data DAT of the lower page to the controller 2 (step S37). When the data of the upper page is determined during the output of the data DAT (step S38), the semiconductor memory device 1 maintains the ready/busy signal at the "H" level.

When the controller 2 confirms that the semiconductor memory device 1 maintains the ready state at the time of ending of the data output of the middle page in step S37, the controller 2 issues the data output command to output the data of the upper page (step S39) to transmit the data output command to the semiconductor memory device 1. Then, the semiconductor memory device 1 that has received the data output command from the controller 2 outputs the data DAT of the upper page to the controller 2 (step S40).

Figure 33:
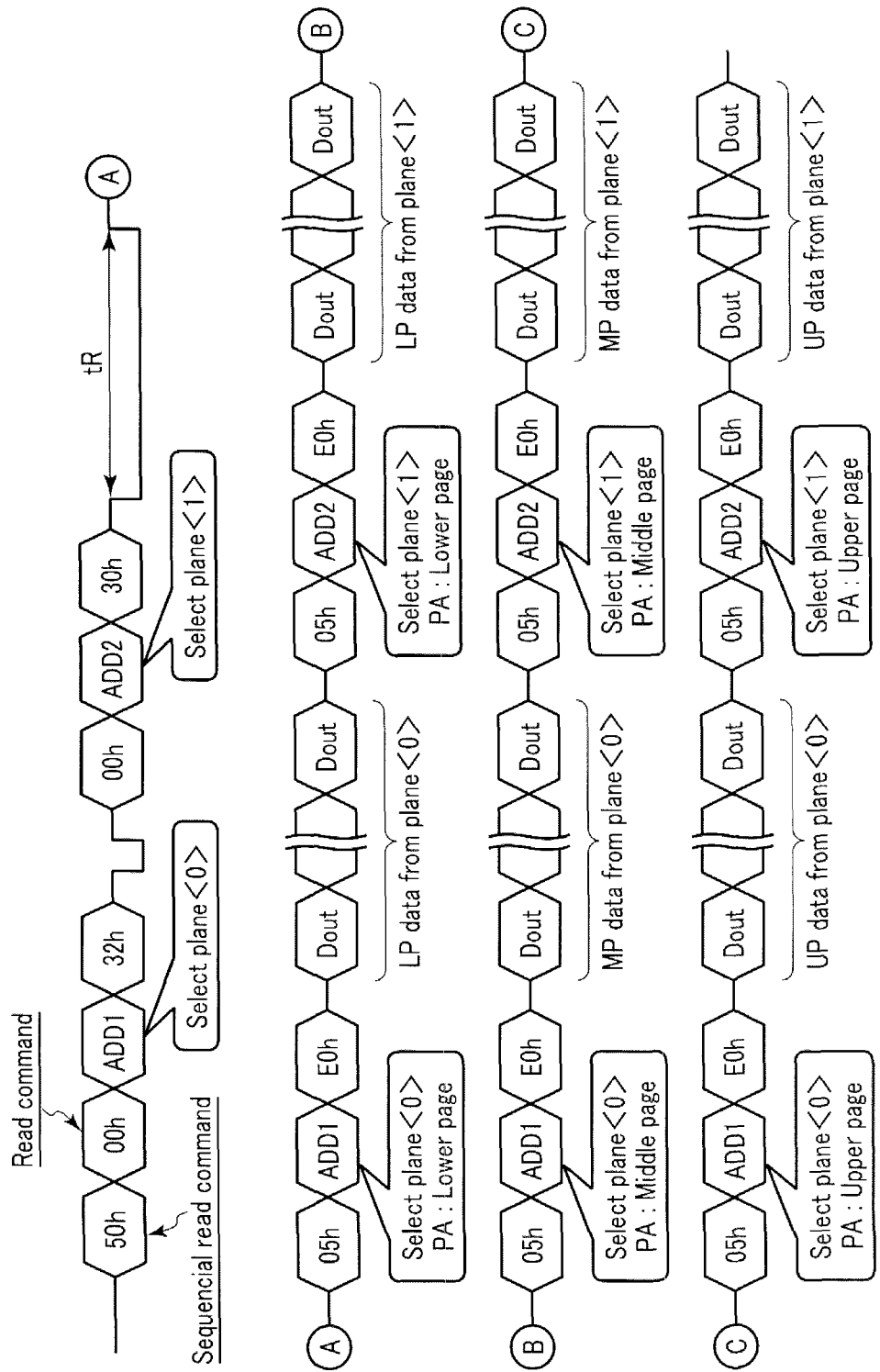
FIG. 33 is a diagram illustrating a command sequence of the read operation in the memory system according to the fifth embodiment.

The command sequence in the fourth read operation of the memory system 3 described above is illustrated in, for example, FIG. 33. An example illustrated in FIG. 33 is a command sequence when the semiconductor memory device 1 is instructed to execute the sequential reading in the planes <0> and <1>. Hereinafter, differences between this command sequence and the command sequence of the page-by-page reading described in the first embodiment will be described.

As illustrated in FIG. 33, the controller 2 first issues read commands corresponding to the planes <0> and <1>. The command sequence is the same as the command sequence illustrated in FIG. 15 except that a sequential read command "50h" is issued in the first place and the commands "01h" and "02h" are excluded. The command "50h" is used to command the semiconductor memory device 1 to execute the sequential reading.

That is, the controller 2 first issues the command "50h", the command "00h", the address information ADD1, and the command "32h" to transmit the command "50h", the command "00h", the address information ADD1, and the command "32h" to the semiconductor memory device 1. When the semiconductor memory device 1 temporarily enters the busy state and subsequently enters the ready state again, the controller 2 issues the command "00h", the address information ADD2, and the command "30h" to transmit the command "00h", the address information ADD2, and the command "30h" to the semiconductor memory device 1. In this way, in this example, the read command corresponding to the order of the planes <0> and <1> is transmitted.

When the command "30h" is stored in the command register 14C, the sequencer 16 changes the ready/busy signal from the "H" level to the "L" level and starts the fourth read operation. As illustrated, tR corresponds to a time until the data of the lower page is determined in the fourth read operation.

When the data of the lower page is determined, the sequencer 16 sets the ready/busy signal to the "H" level. Then, the controller 2 issues a data output command used to output the lower page data in response to the fact that the semiconductor memory device 1 enters the ready state.

The configuration of the data output command and the operation of the semiconductor memory device 1 replying to the data output command are the same as those illustrated in FIG. 15 described in the first embodiment. The address information ADD in the configuration of this command includes a page address PA corresponding to the lower page.

Similarly, when the sequencer 16 determines the data of the middle page at the time of the output of the data of the lower page, the controller 2 thereafter issues the data output command to output the data of the middle page. When the data of the upper page is determined at the time of output of the data of the middle page, the controller 2 thereafter issues the data output command to output the data of the upper page.

In the memory system 3 according to the present embodiment, the controller 2 instructs the semiconductor memory device 1 to output the data in order from the page in which the data is determined at the low read voltage. The order of the planes caused to output the data is not limited to the order in which the corresponding read commands are issued, but any order can be set.

As described in the first embodiment with reference to FIGS. 17 and 18, the data of the middle page is not determined, for example, during the output of the data of the lower page in some cases. In this case, as in the first embodiment, when the output of the data of the lower page ends, the semiconductor memory device 1 is considered to be in the busy state. The controller 2 detects that the state of the semiconductor memory device 1 is changed to the ready state again and issues the data output command of a subsequent page.

In the above description, the case is illustrated in which the page data of all the levels is output, but embodiments are not limited thereto. For example, the page not output to the controller 2 in the data read through the sequential reading may be included or the page data at the different level for each plane may be output.

For example, the data of the lower and middle pages is output in the plane <0> and the data of the middle and upper pages is output in the plane <1>. In this case, the controller 2 issues, for example, a data transmission command between the latch circuits in the sense amplifier module 11, for example, since the data of the lower page in the plane <1> is not necessary. Then, the sequencer 16 controls the sense amplifier module 11 such that the sense amplifier module 11 executes a process of overwriting the data of the lower page maintained in the latch circuit XDL on the data of the middle page. Accordingly, the memory system 3 can continue the data output operation.

In the above description, the case is illustrated in which the order of the planes in which the command used to instruct the read operation is issued is the same as the order of the planes in which the data is output for each page at each level, but embodiments are not limited thereto. The controller 2 can freely sort the order of the planes in which the corresponding read command is issued and the order of the planes in which the data is output.

Figure 34:
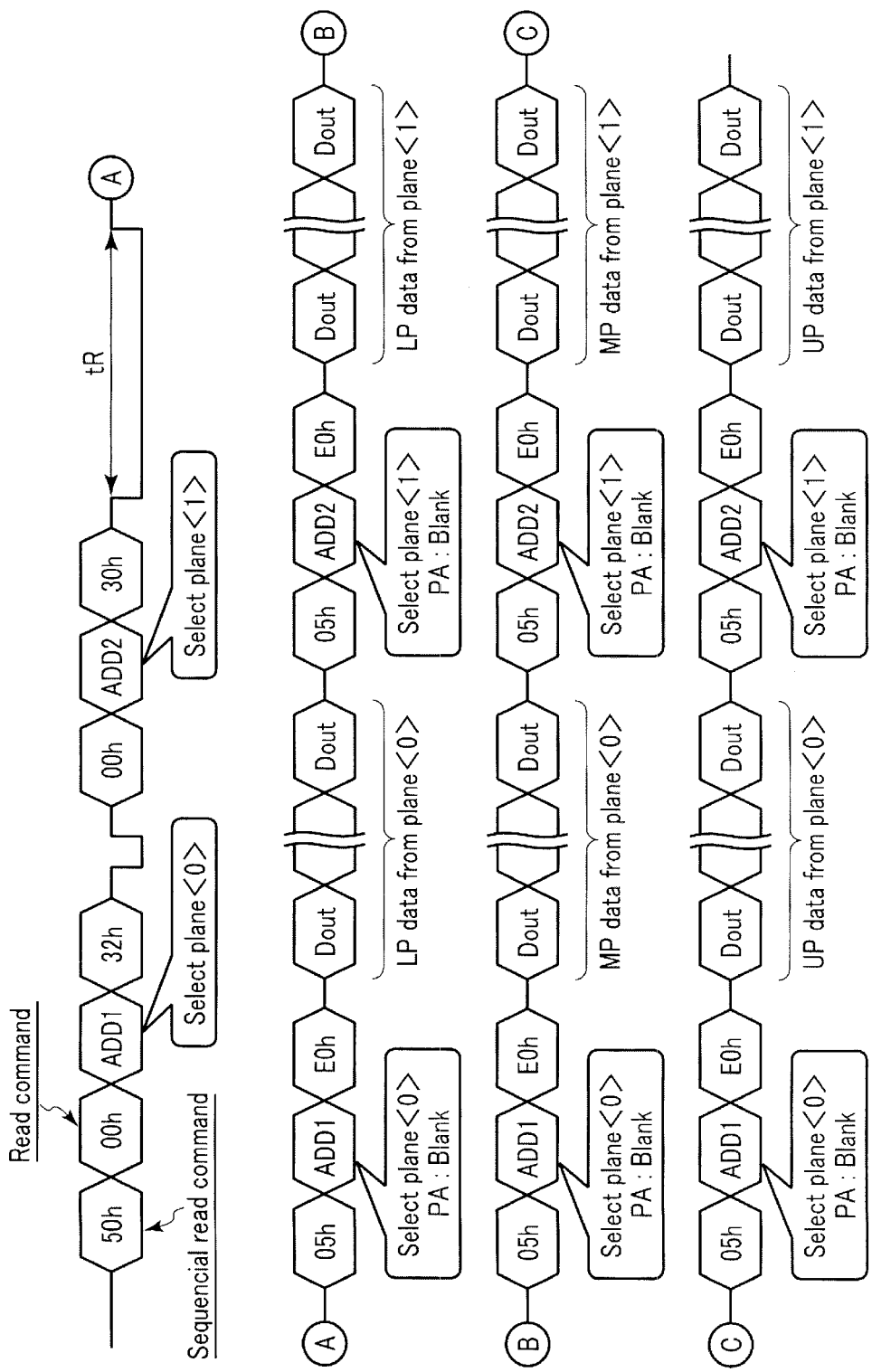
FIG. 34 is a diagram illustrating a command sequence of the read operation in the memory system according to the fifth embodiment.

When the controller 2 requests the semiconductor memory device 1 to transmit all the pieces of data retained in the memory cell connected to the common word line in the read operation of the memory system 3, there is a method in which the controller 2 does not designate the page address PA for the semiconductor memory device 1. A command sequence corresponding to this method is illustrated in FIG. 34. In the command sequence illustrated in FIG. 34, the page address PA included in the address information ADD corresponding to each data output command is blank compared to the command sequence described with reference to FIG. 33.

Even when the page address PA is not designated in this way, the controller 2 can ascertain the order in which the semiconductor memory device 1 determines the data in the multi-plane read. Therefore, by confirming the number of times the semiconductor memory device 1 outputs the data, it is possible to know at which level the output data corresponds to the page.

In response to this, the semiconductor memory device 1 may set the page address PA to an operation mode in which the page address PA is not referred to at the time of the data output of the multi-plane read. In this case, the memory system 3 executes a parameter setting sequence called a Set feature before the read operation to switch the semiconductor memory device 1 to a desired operation mode.

Figure 35:
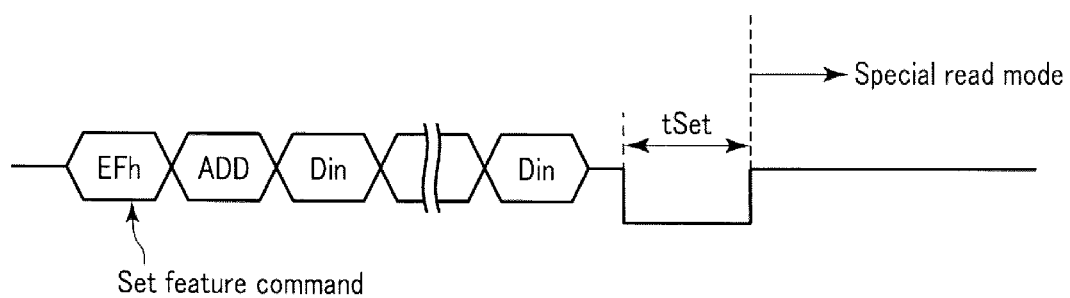
FIG. 35 is a diagram illustrating a command sequence of the read operation in the memory system according to the fifth embodiment.

Here, a command sequence of the Set feature will be described with reference to FIG. 35. FIG. 35 illustrates an example of the command sequence of the Set feature.

As illustrated in FIG. 35, the controller 2 first issues a Set feature command "EFh" to transmit the Set feature command "EFh" to the semiconductor memory device 1. The command "EFh" is a command used to command the semiconductor memory device 1 to change a parameter.

Next, the controller 2 issues the address information ADD to transmit the address information ADD to the semiconductor memory device 1. The address information ADD is used to designate an address corresponding to a parameter desired to be changed. Next, the controller 2 outputs setting data Din to the semiconductor memory device 1 over a period of a plurality of cycles. The data Din output herein corresponds to the parameter to be changed.

When the above command or the like is received, the sequencer 16 starts Set feature. When the Set feature starts, the operation mode of the semiconductor memory device 1 is changed. As illustrated, tSet indicates a period in which the Set feature is executed.

When the Set feature ends, the semiconductor memory device 1 enters, for example, a special read mode. Here, as a special read mode, an operation mode of ignoring the page address at the time of the data of the multi-plane read by the semiconductor memory device 1, for example, as described above, and outputting the data in a predetermined order is used.

In the above-described command sequence, the case is illustrated in which plane information is included in the address information, but embodiments are not limited thereto. For example, when the order in which the commands corresponding to each plane are issued is fixed to a predetermined order (for example, an order of the planes <0> and <1>) in the multi-plane read, the read operation can be executed without particularly designating the planes.

[5-2] Advantages of Fifth Embodiment

The memory system 3 according to the present embodiment can accelerate the operation. Hereinafter, the details of this advantage will be described.

In the memory system 3 according to the present embodiment, the sequential reading executed in the multi-plane read is achieved with the configuration described in the first embodiment. The controller 2 gives an instruction to output the read data in the order from the page in which the read data is determined in the multi-plane read by the semiconductor memory device 1.

Specifically, when the read voltages are applied in order from a lower voltage in the sequential reading of the TLC scheme to determine the threshold, the read data is determined in the order of the lower page, the middle page, and the upper page, for example, as illustrated in FIG. 30. In this case, the semiconductor memory device 1 enters the ready state at a timing at which the data of the lower page is determined. When the controller 2 detects that the semiconductor memory device 1 enters the ready state, the controller 2 issues the data output command in regard to a lower level at which the read data is first determined. Then, the semiconductor memory device 1 that has received this command continues the middle page read of each plane and outputs the lower page data read from each plane to the controller 2. When the data of the middle page is determined at the time of ending of the output of the data of the lower page, the output of the data of the middle page and the upper page read are executed in parallel and the data of the finally determined upper page is output.

In this way, in the memory system 3 according to the present embodiment, the data can be output to the controller 2 in order from the page of the level at which the read data is determined even while the semiconductor memory device 1 executes the multi-plane read. Accordingly, the memory system 3 according to the present embodiment can advance the timing at which the semiconductor memory device 1 starts outputting the read data, and thus can accelerate the read speed.

The timing at which the data of each page is output and the timing at which the read operation on each page is executed are not limited thereto. For example, a case in which the reading of the middle and upper pages ends at a timing at which the output of the data of the lower page ends can be considered. In this case, after the output of the data of the lower page ends, the operation is not executed in parallel with the read operation on another page and the data of the middle and upper page is output.

[6] Sixth Embodiment

Next, a semiconductor memory device 1 and a memory system 3 according to a sixth embodiment will be described.

In the sixth embodiment, a length in which the control signal STB is asserted is changed for each plane in the sequential reading on the plurality of planes described in the fifth embodiment. Hereinafter, differences from the first to fifth embodiments will be described.

[6-1] Operation

[6-1-1] Read Operation of Semiconductor Memory Device 1

First, a read operation of the semiconductor memory device 1 will be described. In the read operation of the semiconductor memory device 1 according to the present embodiment, a different sense time is applied for each plane by controlling the control signal STB for each plane by the sequencer 16. In the following description, such a read operation is referred to as a fifth read operation and will be described below.

Figure 36:
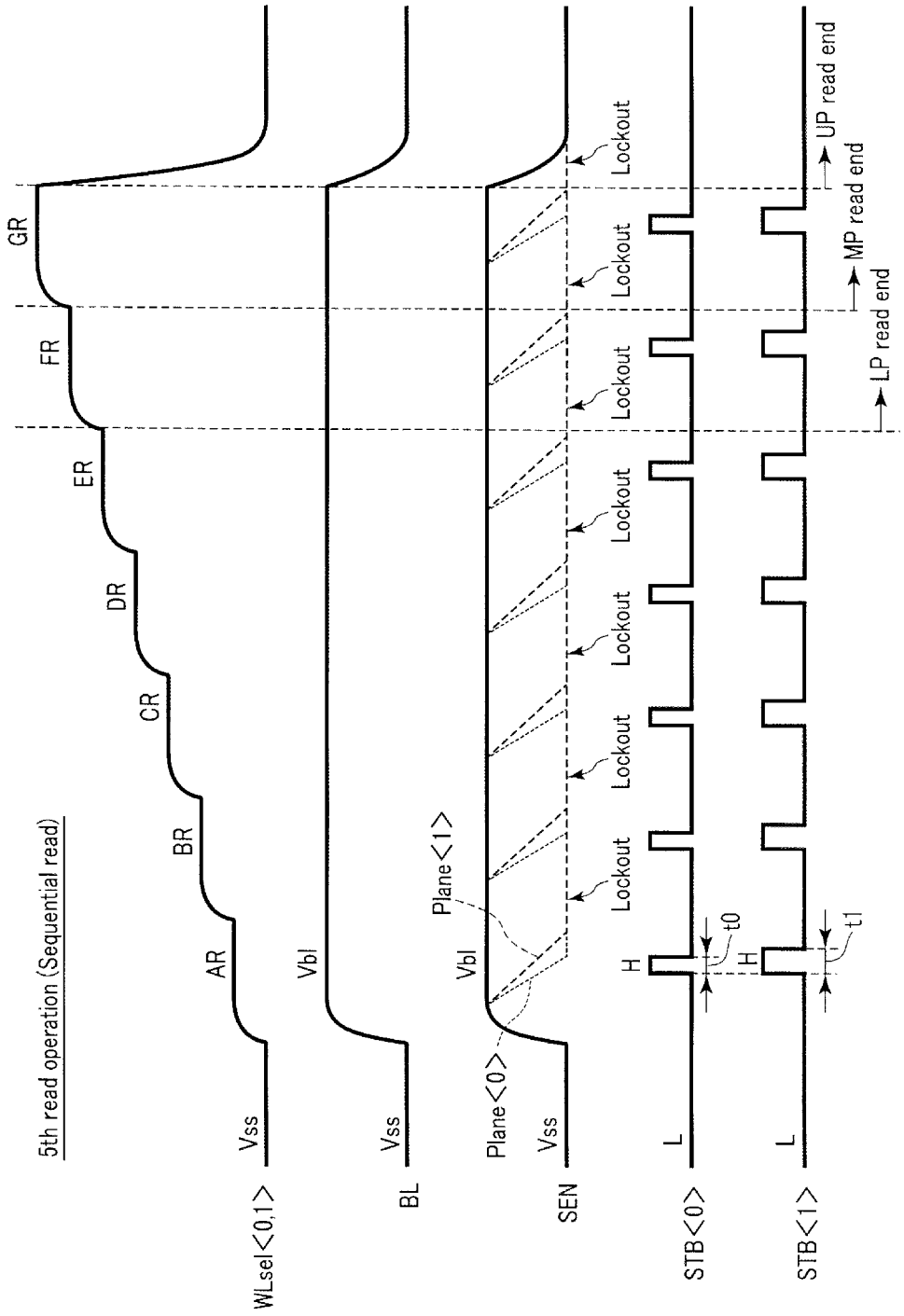
FIG. 36 is a waveform diagram illustrating a read operation in a memory system according to a sixth embodiment.

Examples of waveforms corresponding to the fifth read operation are illustrated in FIG. 36. FIG. 36 illustrates an example of a case in which the sequential reading is executed in the planes <0> and <1> in the TLC scheme and illustrates voltages to be applied to the selected word lines WLse1 <0> and <1> corresponding to the planes <0> and <1> in each read operation and waveforms of control signals STB <0> and <1>. Voltages of a bit line BL and an SEN node are further illustrated in FIG. 36.

As illustrated in FIG. 36, the row decoders 12A and 12B apply read voltages AR, BR, CR, DR, ER, FR, and GR to the selected word lines WLse1 <0, 1> in order.

The sense amplifier module 11 applies a voltage Vb1 to each bit line during application of read voltages to the selected word lines WLse1. The voltage Vb1 is, for example, a power voltage supplied to the sense amplifier module 11. At this time, the potential of the SEN node is charged up to, for example, the voltage Vb1.

The potential of the SEN node starts to drop when each read voltage is applied and the memory cell corresponding to the threshold voltage is turned on. At this time, a drop speed of the potential of the nose SEN is based on the ON state of the memory cell and the ON state of the memory cell is different for each plane in some cases. In the example illustrated in FIG. 36, a current flowing in the memory cell of the plane <0> is greater than a current flowing in the memory cell of the plane <1>. That is, the potential of the SEN node corresponding to the plane <0> drops faster than the potential of the SEN node corresponding to the plane <1>.

When the memory cell is turned on at the time of application of each read voltage and the threshold voltage of the memory cell is determined, the sense amplifier unit SAU corresponding to the memory cell is locked out in a subsequent read operation. That is, the bit line BL corresponding to the memory cell of which the threshold voltage is determined is not charged in a subsequent read operation and remaining noise in the read operation of the memory cell is reduced (not illustrated).

The sequencer 16 asserts the control signals STB <0> and <1> during the application of each read voltage to the selected word lines WLse1. The control signals STB <0> and <1> are different in an asserted length. In this example, an assertion time t0 of the control signal STB <0> is shorter than an assertion time t1 of the control signal STB <1>. In this example, a time in which the sense amplifier module 11B receiving the control signal STB <0> executes sensing is longer than that of the sense amplifier module 11A receiving the control signal STB <0>.

In the read operation of the semiconductor memory device 1 according to the present embodiment, an assertion time of the control signal STB can be changed for each plane and an assertion time of the control signal STB is set based on, for example, the input page address PA.

[6-1-2] Read Operation of Memory System 3

Next, a read operation of the memory system 3 will be described. In the read operation of the memory system 3 according to the present embodiment, the controller 2 executes the fifth read operation based on an input page address unlike the operation described in the fifth embodiment. Hereinafter, differences from the fifth embodiment will be described.

Figure 37:
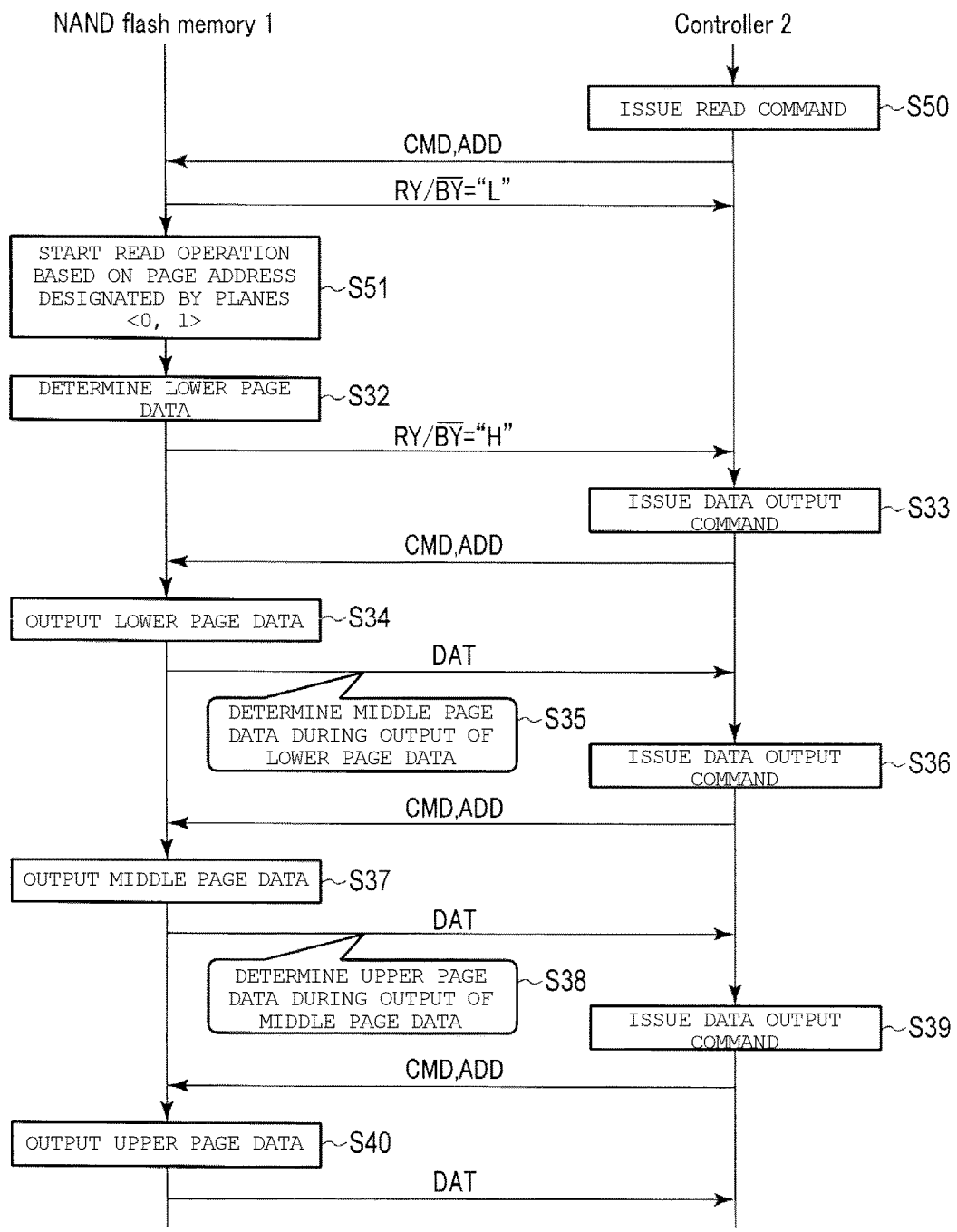
FIG. 37 is a flowchart illustrating the read operation in the memory system according to the sixth embodiment.

Hereinafter, an example of the read operation of the memory system 3 will be described with reference to FIG. 37. FIG. 37 is a flowchart illustrating an example of the read operation of the memory system 3.

As illustrated in FIG. 37, the controller 2 first issues a read command (the command CMD and the address information ADD) to transmit the read command to the semiconductor memory device 1 (step S50). The read command is used to give an instruction of the sequential reading in regard to the planes <0, 1>. The semiconductor memory device 1 that has received the read command from the controller 2 sets the ready/busy signal from an "H" level to an "L" level and starts the read operation based on the page address PA designated in the plane <0, 1> (step S51). The read operation in step S51 corresponds to the read operation of the semiconductor memory device 1 described in section [6-1-1]. The subsequent operations are the same as those in FIG. 32 described in the fifth embodiment.

[6-2] Advantages of Sixth Embodiment

In the memory system 3 according to the present embodiment, it is possible to obtain the same advantages as those of the fifth embodiment and it is further possible to improve reliability of the read data. Hereinafter, the details of this advantage will be described.

In the semiconductor memory device, a variation occurs in precision of the read operation depending on a position at which the memory cell is formed. For example, characteristics of the memory cell are different in some cases depending on a difference in a line width between a word line located at the end of the memory cell array and a word line located in the middle of the memory cell array. In the semiconductor memory device, when a different page is designated for each plane in the multi-plane read, the read operation is executed using the same read voltage in the memory cells with different characteristics in some cases, and thus a variation occurs in the precision of the read operation depending on a designated page address.

Accordingly, in the memory system 3 according to the present embodiment, the sequencer 16 of the semiconductor memory device 1 controls the control signal STB for each plane. Then, the sequencer 16 asserts the control signal STB at a different time for each plane based on the page address input in the multi-plane read. That is, the semiconductor memory device 1 according to the present embodiment applies a different sense time for each plane in the multi-plane read.

For example, when the current flowing in the memory cell turned on in the plane <0> is greater than the current flowing in the memory cell turned on in the plane <1> in the determination of a certain threshold, as illustrated in FIG. 36, a drop speed of the potential in the SEN node in the sense amplifier unit SAU is faster in the plane <0> than in the plane <1>. In this case, when the plane <1> is sensed at a sense time designed for the plane <0>, correct data may not be read.

In contrast, in the semiconductor memory device 1 according to the present embodiment, a sense time (the assertion time t1) for the plane <1> is set to be longer than a sense time (the assertion time t0) for the plane <1>, as illustrated in FIG. 36. Then, the sense amplifier unit SAU can read correct data even in the plane <1> in which the drop of the potential of the SEN node is slow.

That is, the semiconductor memory device 1 improves data determination precision by applying each appropriate sense time according to a difference in the characteristics of the memory cell different for each input page address (corresponding selected word line WL) in the multi-plane read.

Accordingly, the memory system 3 according to the present embodiment can execute the multi-plane read to read the pages of the different levels in the plurality of planes as in the fifth embodiment, and thus can improve the reliability of the read data further than in the fifth embodiment.

In the above description, the case in which the assertion time of the control signal STB is changed for each plane is illustrated, but embodiments are not limited thereto. For example, a timing at which the control signal STB is asserted may be changed for each plane. In this case, a timing at which the control signal STB corresponding to the plane in which the drop speed of the SEN node is expected to be slow is asserted is set late.

[7] Seventh Embodiment

Next, a semiconductor memory device 1 and a memory system 3 according to a seventh embodiment will be described. In the seventh embodiment, sequential reading is executed on a plurality of planes with the configuration of the semiconductor memory device 1 described in the third embodiment to apply different source line voltages to respective planes. Hereinafter, differences from the first to sixth embodiments will be described.

[7-1] Read Operation of Semiconductor Memory Device 1

First, a read operation of the semiconductor memory device 1 will be described. In the read operation of the semiconductor memory device 1 according to the present embodiment, an offset of a source line SL voltage is added for each plane using the SL driver 51 provided for each plane. Specifically, a potential difference added between the gate and the channel of the memory cell is adjusted for each plane by applying a different voltage to the source line SL for each plane in the read operation. Such a read operation is referred to as a sixth read operation. The sixth read operation will be described below.

Figure 38:
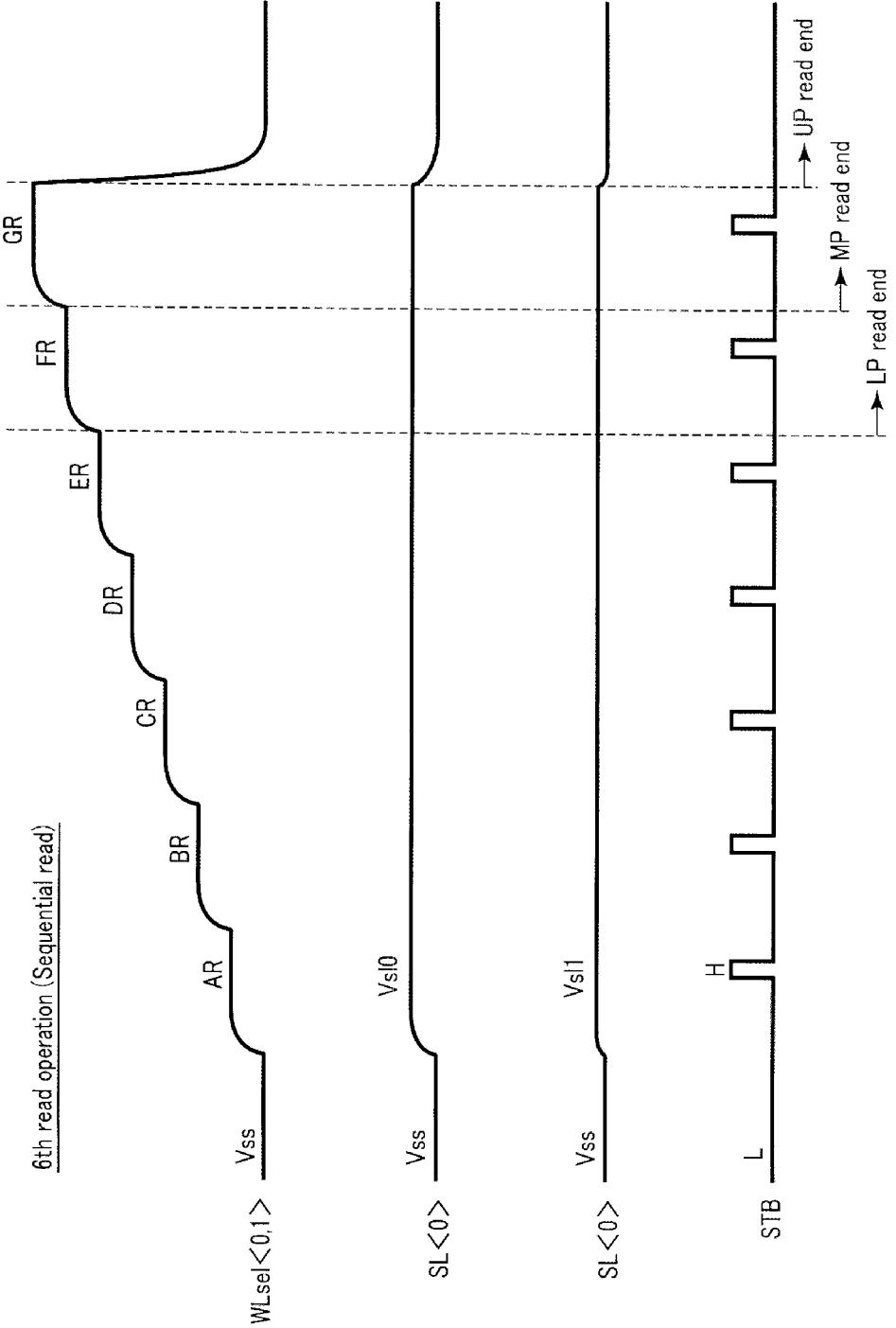
FIG. 38 is a waveform diagram illustrating a read operation in a memory system according to a seventh embodiment.

Examples of waveforms corresponding to the fifth read operation are illustrated in FIG. 38. FIG. 38 illustrates an example of a case in which the sequential reading is executed in the planes <0> and <1> in the TLC scheme and illustrates waveforms of voltages to be applied to the selected word lines WLse1 <0> and <1> and source lines SL <0> and <1> corresponding to the planes <0> and <1> in each read operation and waveforms of the control signals STB <0> and <1>.

As illustrated in FIG. 38, the row decoders 12A and 12B apply read voltages AR, BR, CR, DR, ER, FR, and GR to the selected word lines WLse1 <0, 1> in order.

The SL driver 51A applies a voltage Vs10 to the source line <0> during the application of each read voltage to the selected word lines WLse1. The SL driver 51B applies a voltage Vs11 to the source line <1> during the application of each read voltage to the selected word lines WLse1. Voltage values of the voltages Vs10 and Vs11 are different. The other remaining operations are the same as those in FIG. 30 described in the fifth embodiment.

In the read operation of the semiconductor memory device 1 according to the present embodiment, the voltages to be applied to the source lines SL for each plane are changed. The voltages to be applied to the source lines SL for each plane are set based on, for example, an input page address.

[7-2] Advantages of Seventh Embodiment

In the memory system 3 according to the present embodiment, it is possible to obtain the same advantages as those of the sixth embodiment. Hereinafter, the details of the advantages will be described.

In the semiconductor memory device 1 in the memory system 3 according to the present embodiment, the voltages to be applied to the source lines SL are controlled for each plane and different source line SL voltages are applied for each plane based on the input page address in the multi-plane read.

For example, when an effective potential difference between the gate and the channel of the memory cell selected in the plane <0> is smaller than an effective potential difference between the gate and the channel of the memory cell selected in the plane <1>, for example, a voltage to be applied to the source line <1> corresponding to the plane <1> is set to be greater than a voltage to be applied to the source line SL <0> corresponding to the plane <0>. Then, in the semiconductor memory device 1 at the time of the read operation, the effective potential difference between the gate and the channel of the memory cell selected between different planes is arranged, and thus the variation of a current amount flowing in the memory cell is suppressed for each plane.

Accordingly, the memory system 3 according to the present embodiment can constantly maintain the effective potential difference between the gate and the channel occurring from a difference in the characteristics of the memory cell different at each input page address (corresponding selected word lines WL). That is, the memory system 3 according to the present embodiment can execute the multi-plane read to read the pages at the different levels in the plurality of planes and can improve reliability of the read data as in the sixth embodiment.

[8] Eighth Embodiment

Next, a semiconductor memory device 1 and a memory system 3 according to an eighth embodiment will be described. In the eighth embodiment, the first to seventh embodiments are applied to a semiconductor memory device having a stack structure of memory cells. Hereinafter, differences from the first to seventh embodiments will be described.

[8-1] Configuration of Semiconductor Memory Device 1

[8-1-1] Circuit Configuration of Memory Cell Array 10

Figure 39:
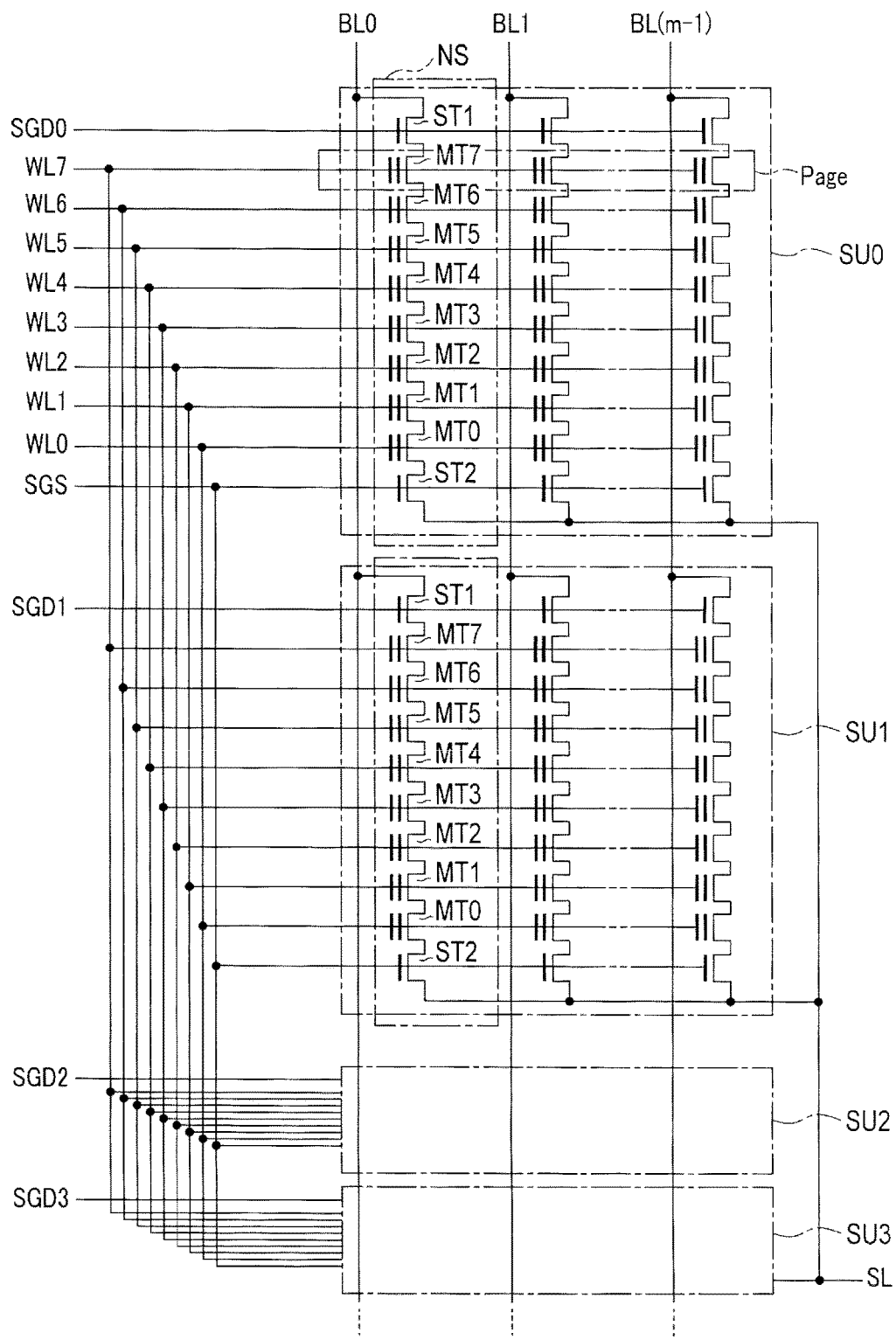
FIG. 39 is a circuit diagram illustrating a memory cell array included in a semiconductor memory device according to an eighth embodiment.

Next, the circuit configuration of the memory cell array 10 will be described with reference to FIG. 39. FIG. 39 is a circuit diagram illustrating a memory cell array 10 in the semiconductor memory device 1 having a stack structure of memory cells. The circuit configuration illustrated in FIG. 39 is different from that illustrated in FIG. 3 in the first embodiment in a configuration inside a block BLK. Hereinafter, differences between the circuit configuration and the circuit configuration in FIG. 3 will be described.

The block BLK includes, for example, four string units SU. Each of the string units SU includes m NAND strings NS. The number of NAND strings NS corresponds to the number of bit lines BL. The configuration of the NAND string NS is the same as that illustrated in FIG. 3 in the first embodiment.

The gates of the select transistors ST1 in the string units SU0 to SU3 are commonly connected to the select gate lines SGD0 to SGD3, respectively. The gates of the select transistors ST2 in the same block are commonly connected to the select gate line SGS. Similarly, the control gates of the memory cell transistors MT0 to MT7 in the same block are commonly connected to word lines WL0 to WL7.

The drains of the select transistors ST1 of the NAND string NS located at the same columns in the memory cell array 10 are commonly connected to the bit lines BL. That is, the bit lines BL commonly connect the NAND strings NS located at the same columns between the plurality of blocks BLK. Further, the sources of the plurality of select transistors ST2 are commonly connected to the source line SL.

[8-1-2] Cross-sectional Structure of Memory Cell Array 10

Figure 40:
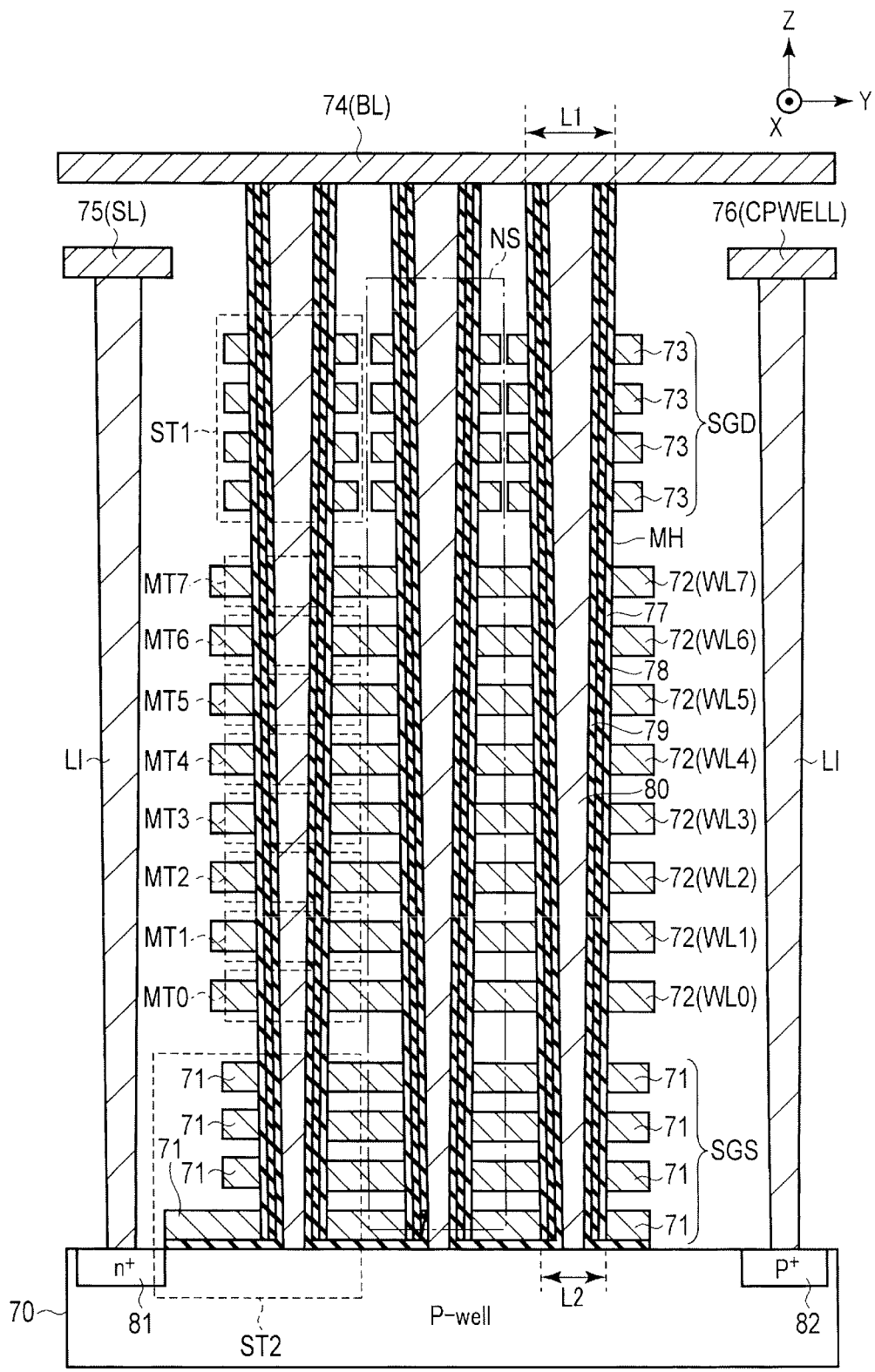
FIG. 40 is a sectional view illustrating the memory cell array included in a semiconductor memory device according to the eighth embodiment.

Next, the cross-sectional structure of the memory cell array 10 will be described with reference to FIG. 40. In FIG. 40, the cross-sectional surface of the memory cell array 10 and X, Y, and Z axes which go straight are illustrated. In FIG. 40, no inter-layer insulation is illustrated.

As illustrated in FIG. 40, the semiconductor memory device 1 includes a P-type well region 70, wiring layers 71 to 76, a plurality of semiconductor pillars MH, and a plurality of contact plugs LI.

The P-type well region 70 is formed in the surface of a semiconductor substrate. The wiring layers 71 to 73 are stacked in order above the P-type well region 70. The wiring layers 71 to 73 function as the select gate line SGS, the word line WL, and the select gate line SGD, respectively. That is, the number of wiring layers 71 to 73 corresponds to the numbers of select gate lines SGS, word lines WL, and select gate lines SGD.

The pluralities of wiring layers 71 and 73 corresponding to the select gate lines SGS and SGD may be provided, as illustrated in FIG. 40. The wiring layers 71 to 73 are provided in a plate shape extending in the X and Y directions.

The plurality of semiconductor pillars MH are formed from the upper surfaces of the wiring layers 73 to the upper surface of the P-type well region 70. That is, for example, the semiconductor pillar MH is provided to pass through the wiring layers 71 to 73 in the Z direction. The semiconductor pillar MH has a shape that is tapered from the upper side to the lower side, as illustrated in FIG. 40. A width L2 of the lower surface of the semiconductor pillar MH is thinner than a width L1 of the upper surface of the semiconductor pillar MH.

On the side surface of the semiconductor pillar MH, a block insulation film 77, an insulation film (charge storage layer) 78, and a tunnel oxide film 79 are formed in order. In the semiconductor pillar MH, a semiconductor material 80 containing a conductive material is embedded inside the tunnel oxide film 79.

The wiring layer 74 corresponding to the bit line BL is formed above the wiring layer 73 and the semiconductor pillar MH. The bit line BL is connected to the corresponding semiconductor pillar MH. A contact plug containing a conductive material may be formed between the bit line BL and the corresponding semiconductor pillar MH.

Wiring layers 75 and 76 respectively corresponding to the source line SL and a well line CPWELL are formed between the wiring layers 73 and 74. The source line SL is connected to an $n^+$ impurity diffusion region 61 formed in the surface of the well region 70 with the contact plug LI interposed therebetween. The well line CPWELL is connected to a $p^+$ impurity diffusion region 82 formed in the surface of the well region 70 with the contact plug LI interposed therebetween. The contact plug LI is provided in a plate shape extending in the X and Z directions.

In the above configuration, one semiconductor pillar MH corresponds to one NAND string NS. Specifically, intersections between the semiconductor pillars MH and the select gate lines SGD and SGS correspond to select transistors ST1 and ST2. Similarly, intersections between the word lines WL and the semiconductor pillar MH correspond to memory cell transistors MT.

The plurality of configurations are arrayed in the X direction. For example, one string unit SU includes a set of the plurality of NAND strings NS arrayed in the X direction. When the plurality of string units SU are provided in the same block BLK, wiring layers 83 corresponding to the select gate line SGD are separated between the string units SU.

The tunnel oxide films 79 and the wiring layer 71 in the lowermost layer are provided up to the vicinity of the $n^+$ type impurity diffusion region 81. Accordingly, when the select transistor ST2 is turned on, a current path is formed between the NAND string NS and the $n^+$ type impurity diffusion region 81.

[8-2] Advantages of Eighth Embodiment

As in the semiconductor memory device 1 according to the present embodiment, the first to seventh embodiments can be applied to a semiconductor memory device in which memory cells are stacked 3-dimensionally. The same advantages can be obtained. In the semiconductor memory device 1 in which the memory cells are stacked, considerable advantages can be obtained by particularly applying the sixth and seventh embodiments.

For example, when the semiconductor memory device 1 has the structure in which the memory cells are stacked 3-dimensionally, the shapes of the memory cells are changed due to stack positions in some cases, as illustrated in FIG. 40. In these cases, depending on the stack position of the memory cell, a variation occurs in an effective potential difference occurring between the gate and the channel of the memory cell by a voltage applied to the selected word line WLsel in some cases.

In contrast, in the sixth and seventh embodiments, a variation in the characteristics of the memory cells can be suppressed. That is, by applying the sixth and seventh embodiments to the semiconductor memory device 1 having the structure described in the present embodiment, it is possible to suppress the variation in the characteristics of the memory cells occurring due to the structure in which the memory cells are stacked, and thus it is possible to improve reliability of the read data.

The configuration in the memory cells stacked above a semiconductor substrate 3-dimensionally is not limited to the above-described configurations. Alternatively, the configurations disclosed in the following applications may be employed, for example, U.S. patent application Ser. No. 12/407,403, filed on Mar. 19, 2009, titled "THREE DIMENSIONAL STACKED NONVOLATILE SEMICONDUCTOR MEMORY," U.S. patent application Ser. No. 12/406,524, filed on Mar. 18, 2009, titled "THREE DIMENSIONAL STACKED NONVOLATILE SEMICONDUCTOR MEMORY," U.S. patent application Ser. No. 12/679,991, filed on Mar. 25, 2010, titled "NON-VOLATILE SEMICONDUCTOR STORAGE DEVICE AND METHOD OF MANUFACTURING THE SAME, and U.S. patent application Ser. No. 12/532,030, filed on Mar. 23, 2009, titled "SEMICONDUCTOR MEMORY AND METHOD FOR MANUFACTURING SAME." The entire contents of these patent applications are incorporated by reference in the present disclosure.

In the above description, the case in which the semiconductor pillar MH has a tapered shape depicted in FIG. 40 is illustrated, but an embodiment is not limited thereto. For example, a middle portion of the semiconductor pillar MH becomes thick in a stack direction of the memory cells in some cases. The NAND string NS may be configured by connecting the plurality of semiconductor pillars MH.

[9] Modification Examples and the Like

The semiconductor memory device <1, FIG. 1> according to the above embodiments includes first and second memory cells that are capable of retaining data of two or more bits including first and second bits, first and second word lines that are connected to the first and second memory cells, respectively, and first and second memory cell arrays that include the first and second memory cells, respectively. The first bit <lower page, FIG. 4> is determined using at least a first voltage. The second bit <middle page, FIG. 4> is determined using at least second and third voltages different from the first voltage. By applying the first to third voltages to the first and second word lines in a data read operation, a first page associated with the first bit is read from the first memory cell array in units of pages and a second page associated with the second bit is read from the second memory cell array in the unit of pages in parallel with the reading of the first page.

The memory system <3, FIG. 1> according to the above embodiments includes the semiconductor memory device <1, FIG. 1> according to the above embodiments and the controller <2, FIG. 1> that is capable of issuing a command to execute a read operation to the semiconductor memory device.

Accordingly, it is possible to provide the semiconductor memory device 1 and the memory system 3 capable of accelerating an operation.

Embodiments are not limited to the first to eighth embodiments, but may be modified in various forms. For example, the case in which the TLC scheme of maintaining 3-bit data in the memory cell is applied to the above embodiments is illustrated, but embodiments are not limited thereto. For example, an MLC scheme of maintaining 2-bit data in the memory cell or a quadruple-level cell (QLC) scheme of maintaining 4-bit data may be applied. Various variations of the read operation described in the above embodiment can be considered according to each scheme.

In the above embodiments, the case in which the data illustrated in FIG. 4 is to be read according to the TLC scheme is illustrated, but embodiments are not limited thereto. There is no restriction on the allocation of the data when the above embodiments are applied, and allocation of desired data may be set and the read operation according to each embodiment may be executed. Even in this case, when the read voltage corresponding to the page of each level is changed, it is possible to obtain the advantages described in the above embodiments. Even when the voltages to be applied to the source lines SL are changed for each plane as in the third and fourth embodiments, the same advantages as those of the third and fourth embodiments can be obtained similarly when the voltages of the source lines SL are set so that the potential difference between the gate and the channel of the selected memory cell is a desired value.

In the above embodiments, the case in which all of the memory cells which are targets reading from each plane maintain the data in the TLC scheme in the multi-plane read of the plurality of planes is illustrated, but embodiments are not limited thereto. For example, the above embodiments can also be applied when one plane is stored in the SLC scheme and the other plane is stored in the TLC scheme in the multi-plane read of two planes.

The operation of the memory system 3 is not described in some embodiments of the above embodiments, but a command sequence corresponding to some of the embodiments is the same as the command sequence in the memory system 3 described in the other embodiments. For example, the command sequence described in the first embodiment can also be used when the semiconductor memory device 1 described in the second to fourth embodiments is operated. Similarly, the command sequence described in the fifth embodiment can also be used when the semiconductor memory device 1 described in the sixth and seventh embodiments is operated.

In the first to fourth embodiments, the case in which the controller 2 issues the command corresponding to the read at each data level and the semiconductor memory device 1 refers to this command to execute any one of the first to third read operations is illustrated, but embodiments are not limited thereto. For example, the first to third read operations may be executed by referring to a page address in the address information ADD without using commands used to designate the level of a page to be read, such as the commands "01h", "02h", and "03h".

Figure 41:
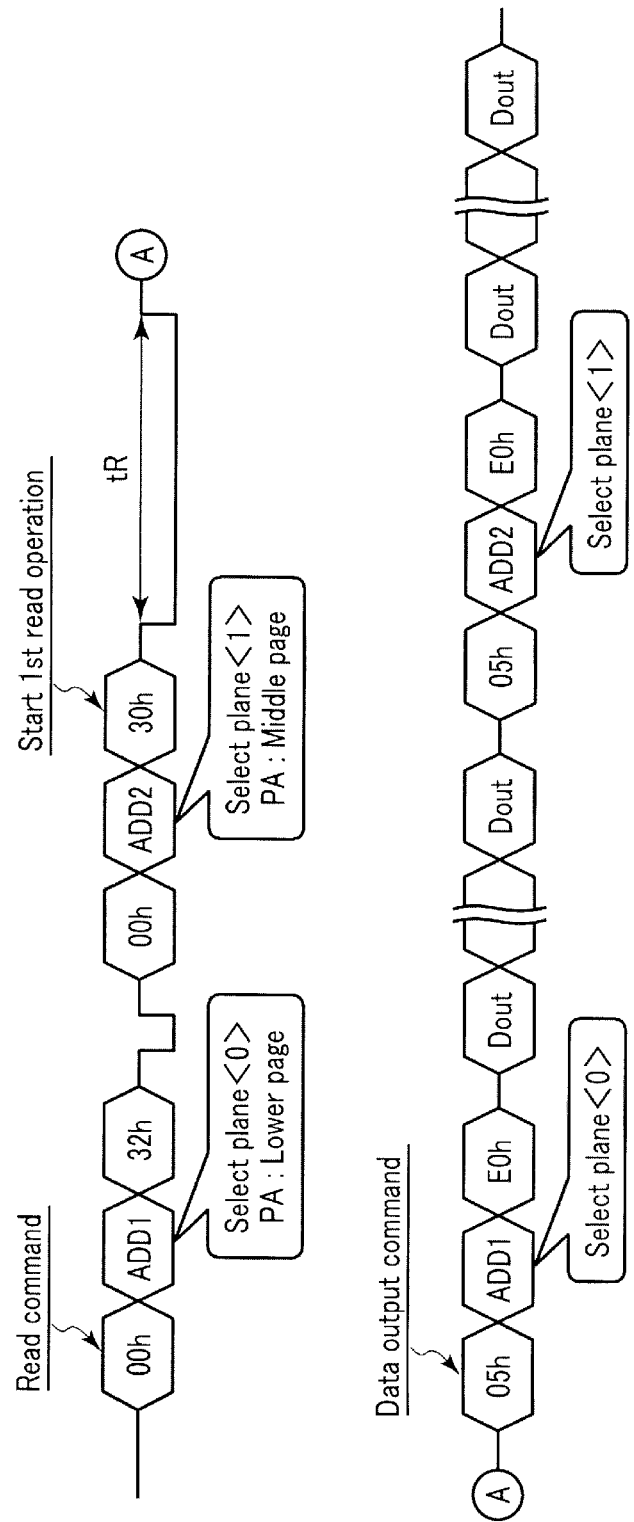
FIG. 41 is a diagram illustrating a command sequence of a read operation in a memory system according to a modification example.

Specifically, as in the command sequence illustrated in FIG. 41, for example, a command sequence in which the command "01h" corresponding to the lower page read and the command "02h" corresponding to the middle page read are excluded from the command sequence illustrated in FIG. 15 may be used. Even in this case, for example, as illustrated in FIG. 41, the sequencer 16 can execute the first read operation based on the address information ADD1 corresponding to the received plane <0> and used to designate the lower page and the address information ADD2 corresponding to the plane <1> and used to designate the middle page. That is, the sequencer 16 can selectively execute the first to third read operations by referring to the page address PA <0> included in the address information ADD1 and the page address PA <1> included in the address information ADD2 to know at which data level each address corresponds to the read.

In the third and fourth embodiments, the data at different levels for each plane are simultaneously determined in some cases. In these cases, the controller 2 can instruct the semiconductor memory device 1 to output data in order from a desired plane regardless of the level of the determined data.

The fifth to seventh embodiments can be combined to be executed. The sixth embodiment may be applied to the first to fourth embodiments. Even in this case, a length or a timing at which the different control signals STB are asserted for each plane may be applied based on the page address PA received by the semiconductor memory device 1. Then, the same advantages as those of the sixth embodiment can be obtained. Similarly, the seventh embodiment can also be applied to the first to fourth embodiments. That is, the sixth and seventh embodiments can be applied to either case irrespective of whether the multi-plane read is the page-by-page reading or the sequential reading.

The "read voltage" in the above description corresponds to a voltage to be applied when data is read. That is, in the waveform diagram illustrated in FIG. 10, for example, the voltages to be applied to the selected word lines are expressed in a step shape, but the voltages may be continuously increased. In this case, the data is read by matching a timing at which the signal STB is asserted with a timing at which the read voltage is applied.

For the control signal STB used to give an instruction of the timing at which the sequencer 16 senses the voltages read to the bit lines BL to the sense amplifier module 11, the case in which the voltage in the assertion case is set as "H" level is illustrated in the above description, but embodiments are not limited thereto. For example, the voltage corresponding to the assertion can also be considered to be set as the "L" level depending on the configuration of the sense amplifier module 11.

The address information is described as the information of one cycle in the above-described command sequence, but an embodiment is not limited thereto. For example, the address information may be transmitted over a period of 5 cycles and may include other pieces of address information (for example, plane information, the block address BA, and the page address PA).

As in the above-described modification example, an SLC command is added in some cases to each command sequence when a plane in which data written in the SLC scheme in the multi-plane read is read is included.

The above-described "sequential reading" indicates to be the same as an operation of reading data in units of word lines from the memory cell array.

In the above description, "connection" indicates electrical connection and includes not only a direct connection case but also connection via any element.

In the above embodiments, the block BLK may not serve as units of data erasure. For example, such alternative erasing operations are disclosed in U.S. patent application Ser. No. 13/235,389, filed on Sep. 18, 2011, titled "NON-VOLATILE SEMICONDUCTOR MEMORY DEVICE," and U.S. patent application Ser. No. 12/694,690, filed on Jan. 27, 2010, titled "NON-VOLATILE SEMICONDUCTOR STORAGE DEVICE." The entire contents of these patent applications are incorporated by reference in the present disclosure.

In the above embodiments, (1) the voltage applied to the word lines selected in the read operation of the "A" level is in the range of, for example, 0 V to 0.55 Vin the read operation. An embodiment is not limited thereto. The voltage may be set as one of 0.1 V to 0.24 V, 0.21 V to 0.31 V, 0.31 V to 0.4 V, 0.4 V to 0.5 V, and 0.5 V to 0.55 V.

The voltage applied to the word lines selected in the read operation of the "B" level is in the range of, for example, 1.5 V to 2.3 V. An embodiment is not limited thereto. The voltage may be set as one of 1.65 V to 1.8 V, 1.8 V to 1.95 V, 1.95 V to 2.1 V, and 2.1 V to 2.3 V.

The voltage applied to the word lines selected in the read operation of the "C" level is in the range of, for example, 3.0 V to 4.0 V. An embodiment is not limited thereto. The voltage may be set as one of 3.0 V to 3.2 V, 3.2 V to 3.4 V, 3.4 V to 3.5 V, 3.5 V to 3.6 V, and 3.6 V to 4.0 V.

The time (tRead) of the read operation may be set to be between, for example, 25 μs to 38 μs, 38 μs to 70 μs, or 70 μs to 80 μs.

(2) The write operation includes the program operation and the verifying operation, as described above. In the write operation, the voltage first applied to the word lines selected at the time of the program operation is between, for example, 13.7 V to 14.3 V. An embodiment is not limited thereto. For example, the voltage may be set to be between 13.7 V to 14.0 V or 14.0 V to 14.6 V.

A voltage first applied to the selected word lines at the time of writing of odd word lines and a voltage first applied to the selected word lines at the time of writing of the even word lines may be switched.

When the program operation is an incremental step pulse program (ISPP) scheme, for example, about 0.5 V can be used as a step-up voltage.

The voltage applied to the unselected word lines may be set to be between, for example, 6.0 V to 7.3 V. An embodiment is not limited thereto. For example, the voltage may be set to be between 7.3 V to 8.4 V or may be set as 6.0 V or less.

The pass voltage to be applied may be switched depending on whether the unselected word lines are odd word lines or even word lines.

The time (tProg) of the write operation may be set to be between, for example, 1,700 μs to 1,800 μs, 1,800 μs to 1,900 μs, or 1,900 μs to 2,000 μs.

(3) In the erasing operation, the voltage applied first to the well which is formed above the semiconductor substrate and on which the memory cells are arranged is between, for example, 12.0 V to 13.6 V. An embodiment is not limited thereto. For example, the voltage may be set to be between 13.6 V to 14.8 V, 14.8 V to 19.0 V, 19.0 V to 19.8 V or 19.8 V to 21.0 V.

A time (tErase) of the erasing operation may be set to be between, for example, 3,000 μs to 4,000 μs, 4,000 μs to 5,000 μs, or 4,000 μs to 9,000 μs.

(4) The structure of the memory cell includes the charge storage layer that is arranged on a semiconductor substrate (silicon substrate) with a tunnel insulation film having a film thickness of 4 nm to 10 nm therebetween. The charge storage layer can has a stack structure of an insulation film having a film thickness of 2 nm to 3 nm, such as SiN or SiON, and a polysilicon having a film thickness of 3 nm to 8 nm. Further, metal such as Ru may be added to the polysilicon. An insulation film is provided above the charge storage layer. This insulation film includes a silicon oxide film that has a film thickness of 4 nm to 10 nm and is interposed between a High-k film of a lower layer having a film thickness of 3 nm to 10 nm and a High-k film of an upper layer having a film thickness of 3 nm to 10 nm. HfO can be employed, for example, as the High-k film. The film thickness of the silicon oxide film can be set to be thicker than the film thickness of the High-k film. A control electrode having a film thickness of 30 nm to 70 nm is formed on the insulation film with a material having a film thickness of 3 nm to 10 nm interposed therebetween. Here, the material is a metal oxide film such as TaO or a metal nitride film such as TaN. In the control electrode, W or the like can be used.

An air gap can be formed between the memory cells.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:
    a semiconductor memory device including a first memory cell array including memory cells each capable of holding two or more bits of data including at least a first bit and a second bit, and a second memory cell array including memory cells each capable of holding two or more bits of data including at least a first bit and a second bit; and
    a memory controller configured to issue a first set of commands to the semiconductor memory device to read data from the first memory cell array, and a second set of commands to the semiconductor memory device to read data from the second memory cell array, and thereafter issue third and fourth sets of commands to output the data read from the first and second memory cell arrays, respectively,
    wherein the first set of commands specifies an address based on which a page of memory cells of the first memory cell array is selected for reading and a command to read first or second bits of memory cells of the page, and
    wherein the second set of commands specifies an address based on which a page of memory cells of the second memory cell array is selected for reading and a command to read first or second bits of memory cells of the page.

2. The memory system according to claim 1, wherein in each of the memory cells, the first bit is a less significant bit than the second bit.

3. The memory system according to claim 1, wherein the third set of commands is issued before the fourth set of commands.

4. The memory system according to claim 1, wherein the third set of commands is issued after the fourth set of commands.

5. The memory system according to claim 1, wherein the memory controller is configured to issue the third and fourth sets of commands consecutively after confirming that data is ready to be output by one of the first and second memory cell arrays.

6. The memory system according to claim 1, wherein the memory controller is configured to issue the third set of commands after confirming that data is ready to be output by one of the first and second memory cell arrays and the fourth set of commands after confirming that data is ready to be output by the other of the first and second memory cell arrays.

7. The memory system according to claim 1, wherein the semiconductor memory device further includes:
    a plurality of first word lines connected to gates of the memory cells of the first memory cell array;
    a plurality of second word lines connected to gates of the memory cells of the second memory cell array;
    a driver configured to generate a selected word line voltage and a non-selected word line voltage;
    a first set of switches that are controlled according to the address specified by the first set of commands to supply either the selected word line voltage or the non-selected word line voltage to each of the first word lines; and
    a second set of switches that are controlled according to the address specified by the second set of commands to supply either the selected word line voltage or the non-selected word line voltage to each of the second word lines.

8. The memory system according to claim 1, wherein the semiconductor memory device further includes:
    a plurality of first bit lines electrically connected to the memory cells of the first memory cell array;
    a plurality of second bit lines electrically connected to the memory cells of the second memory cell array;
    a first sense amplifier module for the first bit lines; and
    a second sense amplifier module for the second bit lines,
    wherein a common control signal is supplied to the first and second sense amplifier modules to cause the first and second sense amplifier modules to perform strobing of sensed data.

9. The memory system according to claim 1, wherein the semiconductor memory device further includes:
    a plurality of first bit lines electrically connected to the memory cells of the first memory cell array;
    a plurality of second bit lines electrically connected to the memory cells of the second memory cell array;
    a first sense amplifier module for the first bit lines; and
    a second sense amplifier module for the second bit lines,
    wherein a first control signal is supplied to the first sense amplifier module to cause the first sense amplifier module to perform strobing of sensed data, and a second control signal is supplied to the second sense amplifier module to cause the second sense amplifier module to perform strobing of sensed data.

10. The memory system according to claim 1, wherein the semiconductor memory device further includes:
    a first source line electrically connected to the memory cells of the first memory cell array;
    a second source line electrically connected to the memory cells of the second memory cell array;
    a first source line driver configured to generate a first source line voltage for the first source line; and
    a second source line driver configured to generate a second source line voltage for the second source line.

* * * * *